(12) United States Patent
Goh et al.

(10) Patent No.: US 11,907,443 B1
(45) Date of Patent: Feb. 20, 2024

(54) INFORMATION HANDLING SYSTEM MOUSE WITH AN ACOUSTIC ISOLATION ENCLOSURE

(71) Applicant: Dell Products L.P., Round Rock, TX (US)

(72) Inventors: Peng Lip Goh, Singapore (SG); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/875,920

(22) Filed: Jul. 28, 2022

(51) Int. Cl.
*G06F 3/0354* (2013.01)
*H03K 17/97* (2006.01)

(52) U.S. Cl.
CPC ......... *G06F 3/03543* (2013.01); *H03K 17/97* (2013.01)

(58) Field of Classification Search
CPC .............................. G06F 3/03543; H03K 17/97
See application file for complete search history.

(56) References Cited

U.S. PATENT DOCUMENTS

| | | | |
|---|---|---|---|
| 6,064,371 A * | 5/2000 | Bunke | G06F 3/03543 345/157 |
| 6,092,209 A | 7/2000 | Holzhammer et al. | |
| 8,279,176 B2 | 10/2012 | Krah et al. | |
| 8,314,780 B2 | 11/2012 | Lin et al. | |
| 9,323,228 B2 | 4/2016 | Zhu et al. | |
| 9,778,760 B1 | 10/2017 | Huang et al. | |
| 9,798,387 B2 | 10/2017 | Joseph et al. | |
| 9,864,437 B2 | 1/2018 | Pang et al. | |
| 10,401,979 B2 | 9/2019 | Wang et al. | |
| 10,726,984 B2 | 7/2020 | Keltz et al. | |
| 10,936,091 B1 | 3/2021 | Tseng et al. | |
| 11,413,521 B2 | 8/2022 | Soelberg | |
| 11,599,136 B1 | 3/2023 | Morrison | |
| 2002/0063477 A1 | 5/2002 | Chang et al. | |
| 2002/0093481 A1 | 7/2002 | Kehlstadt | |
| 2003/0066126 A1 | 4/2003 | Armbruster et al. | |
| 2005/0009496 A1 | 1/2005 | Chen | |
| 2005/0174329 A1 * | 8/2005 | Maroun | G06F 3/03543 345/163 |
| 2005/0206618 A1 | 9/2005 | Lee et al. | |
| 2005/0231482 A1 | 10/2005 | Theytaz et al. | |
| 2006/0114231 A1 | 6/2006 | Koh | |
| 2006/0284854 A1 | 12/2006 | Cheng et al. | |
| 2007/0035517 A1 | 2/2007 | Chen et al. | |
| 2007/0132717 A1 * | 6/2007 | Wang | G06F 3/0383 345/156 |
| 2007/0188453 A1 | 8/2007 | O'Sullivan | |
| 2009/0114675 A1 | 5/2009 | Kuzar et al. | |

(Continued)

*Primary Examiner* — Patrick N Edouard
*Assistant Examiner* — Joseph P Fox
(74) *Attorney, Agent, or Firm* — ZAGORIN CAVE LLP; Robert W. Holland

(57) ABSTRACT

An information handling system mouse includes an acoustic isolation enclosure coupled proximate a switch and having a first position that suppress actuation sound of the switch and a second position that directs actuation sound of the switch out from the mouse. In one embodiment, the acoustic isolation enclosure has a first portion in a fixed position around the switch and a second portion in sliding engagement with the first portion and having an opening that is blocked in the first position and exposed in the second position.

17 Claims, 55 Drawing Sheets

(56) References Cited

U.S. PATENT DOCUMENTS

| | | |
|---|---|---|
| 2009/0231279 A1* | 9/2009 | Ganey ................ G06F 3/03543 |
| | | 345/163 |
| 2010/0171702 A1 | 7/2010 | Cheng |
| 2010/0177043 A1 | 7/2010 | Chen |
| 2010/0201626 A1 | 8/2010 | Krah et al. |
| 2012/0223705 A1 | 9/2012 | Lowery et al. |
| 2013/0285911 A1 | 10/2013 | Nissen et al. |
| 2014/0247246 A1 | 9/2014 | Maus |
| 2016/0208203 A1 | 7/2016 | Traynor et al. |
| 2016/0334865 A1 | 11/2016 | Siegfried et al. |
| 2017/0192536 A1 | 7/2017 | Wang et al. |
| 2017/0285848 A1 | 10/2017 | Rosenberg et al. |
| 2018/0071621 A1 | 5/2018 | Xu et al. |
| 2019/0042007 A1* | 2/2019 | Lu .......................... G06F 3/033 |
| 2019/0113988 A1 | 4/2019 | Hotelling et al. |
| 2019/0146600 A1 | 5/2019 | Tsai et al. |
| 2019/0339793 A1 | 11/2019 | Rizvi et al. |
| 2020/0005977 A1 | 1/2020 | Keltz et al. |
| 2020/0135415 A1 | 4/2020 | Chang et al. |
| 2021/0113918 A1 | 4/2021 | Soelberg |
| 2021/0142959 A1 | 5/2021 | Lee |
| 2021/0157420 A1 | 5/2021 | Krishnakumar et al. |

\* cited by examiner

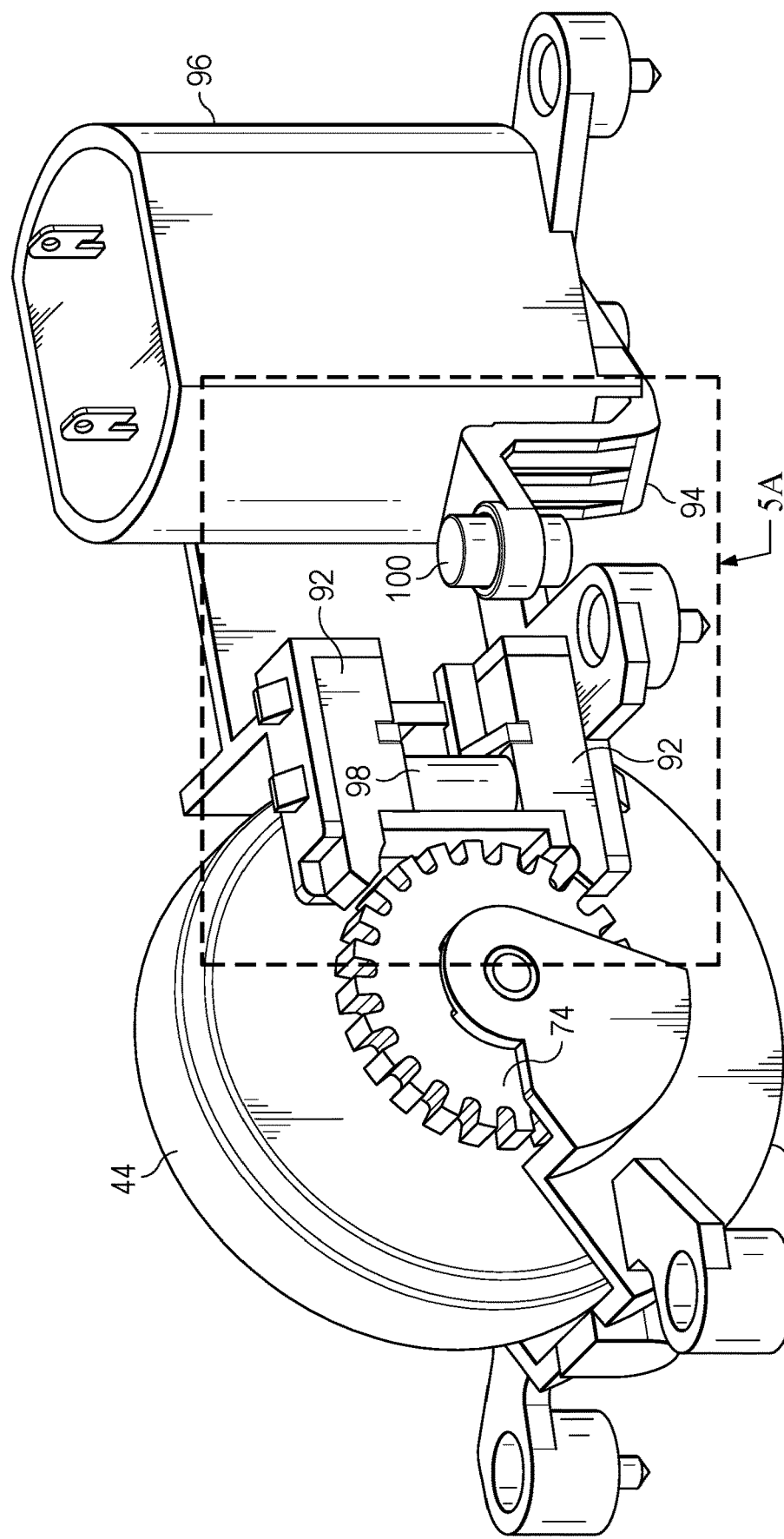

MOUSE SWITCH RESET

MOUSE WAKE UP

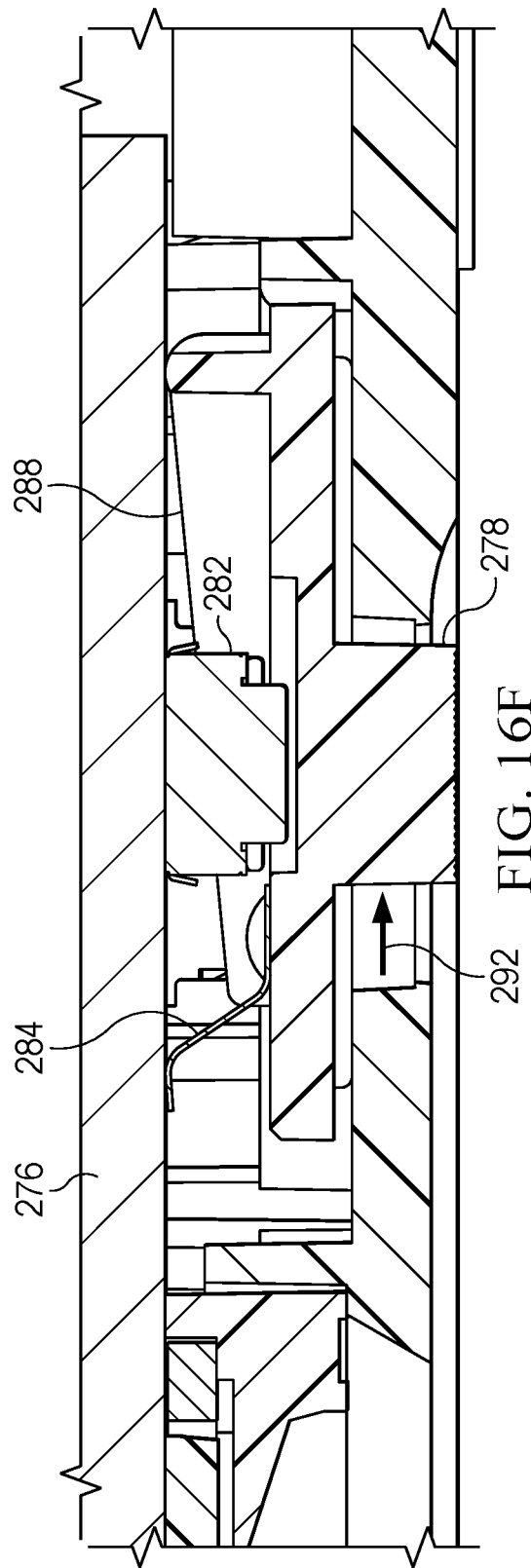

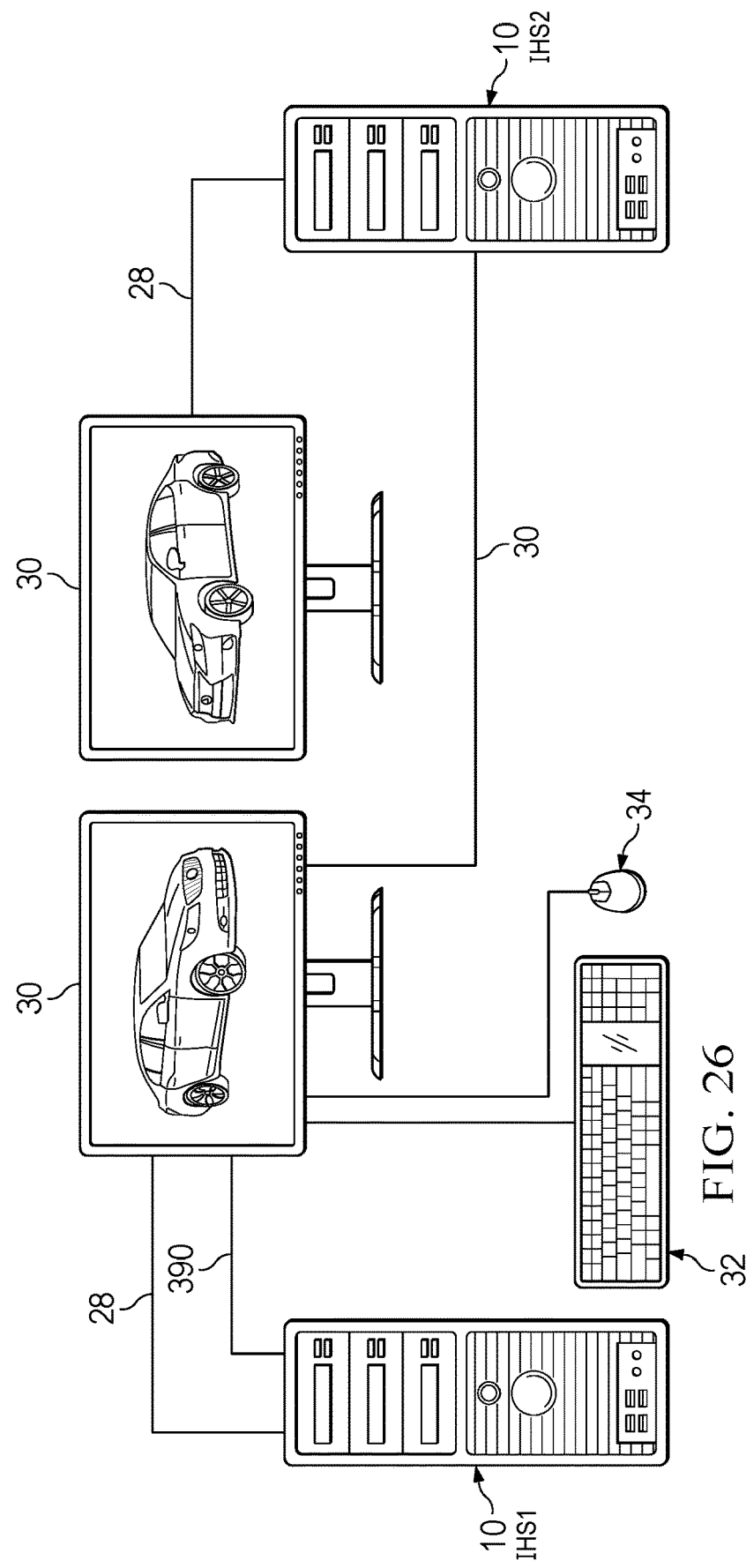

INFORMATION HANDLING SYSTEM MOUSE WITH AN ACOUSTIC ISOLATION ENCLOSURE

CROSS REFERENCE TO RELATED APPLICATIONS

This application is related to U.S. patent application Ser. No. 17/875,885, filed Jul. 28, 2022, entitled "Information Handling System Mouse Recyclable Chassis," naming Peng Lip Goh and Deeder M. Aurongzeb as inventors, which application is incorporated herein by reference.

This application is related to U.S. patent application Ser. No. 17/875,890, filed Jul. 28, 2022, entitled "Information Handling System Mouse with Variable Speed Scroll Wheel Having Magnetic Tactile Response," naming Peng Lip Goh and Deeder M. Aurongzeb as inventors, which application is incorporated herein by reference.

This application is related to U.S. patent application Ser. No. 17/875,901, filed Jul. 28, 2022, entitled "Information Handling System Mouse with Selectable Input Button Response," naming Peng Lip Goh and Deeder M. Aurongzeb as inventors, which application is incorporated herein by reference.

This application is related to U.S. patent application Ser. No. 17/875,904, filed Jul. 28, 2022, entitled "Information Handling System with Motion Detection Wake," naming Peng Lip Goh and Deeder M. Aurongzeb as inventors, which application is incorporated herein by reference.

This application is related to U.S. patent application Ser. No. 17/875,927, filed Jul. 28, 2022, entitled "Information Handling System Mouse with a Sliding Button that Includes Orthogonal Activation," naming Peng Lip Goh and Deeder M. Aurongzeb as inventors, which application is incorporated herein by reference.

BACKGROUND OF THE INVENTION

Field of the Invention

The present invention relates in general to the field of information handling system input devices, and more particularly to an information handling system mouse with an acoustic isolation enclosure.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing and interact with an end user through input/output (I/O) devices. Desktop information handling systems generally have a stationary housing that relies upon peripheral I/O devices, such as a peripheral keyboard, mouse and display that communicate through cabled and/or wireless interfaces. Portable information handling systems generally integrate processing components, a display, keyboard and a power source in a portable housing to support mobile operations. Portable information handling systems allow end users to carry a system between meetings, during travel, and between home and office locations so that an end user has access to processing capabilities while mobile. Portable information handling systems typically also support interactions through peripheral I/O devices, which generally provide more intuitive and convenient interactions.

A mouse generally has a housing that fits in an end user's palm and slides on a desktop surface with a position sensor exposed at a bottom surface to detect motion across the desktop surface that is reported to an information handling system as a pointer input and presented at a display as a cursor movement. Two or three buttons are exposed at a top surface to accept "click" inputs. A mouse can experience substantial impact forces over a typical usable life and is therefore generally built in a robust manner having the mouse housing and electronic components assembled with screws. Although assembly with screws provides a durable construction, recycling the mouse generally requires removal of the screws before the plastic of the housing can be crushed and shredded.

Two components of a mouse that tend to wear and fail over time are the scroll wheel and click buttons. A mouse scroll wheel is typically assembled to have a metal spring that contacts against a notched wheel to provide an end user with a tactile feedback of wheel rotation. Over time the spring and notches wear to degrade the tactile feedback. A similar difficulty can arise with the input buttons, which move by a spring or cantilever rotation of a key plate to contact a switch that detects the button input. A cantilever key plate tends to provide a greater button motion to record an input with less precision for the end user to know when the input is made. In contrast, a spring rotation tends to provide a more precise input with less motion of the key plate for high sensitivity with less of a spring back feel for the end user after the button input is complete. Some of the difficulty in the tactile feel of an input button press is addressed by generation of a click sound made when an input press is performed. In quiet working environments, the click can become a distraction to the end user or others.

Another difficulty that arises with a mouse is that the small size of the housing and the use of the upper surface as the input region makes placement of power and other buttons difficult. Often such buttons are placed in the bottom of the mouse where they are hidden during normal use, however, bottom placement of the button makes its use inconvenient. Further the room available on the bottom surface is minimal and placement of multiple buttons on the bottom can interfere with movement of the mouse on a desktop surface. Generally, a mouse will have a "sleep" mode that reduces power consumption of the mouse when not in use by powering down the processing resource of the mouse and waking when the mouse moves. Although such sleep states decrease power consumption and increase battery life, some power draw is typically involved in monitoring for mouse motion, such as by keeping the position sensor powered up or detection motion with an accelerometer. Further, even in a sleep mode the processing resources tends to dissipate some power.

Often, to help make a workspace more convenient, a mouse and keyboard will interface with a display through a keyboard, video, mouse (KVM) switch. Once an end user configures a keyboard and mouse to interact through the display, the end user can more readily interact in a desktop environment by coupling to the display without having to separately couple or wirelessly interface with the mouse and keyboard. Further, the KVM switch can provide the end user with access to multiple information handling systems through the display so that the end user can switch between systems, such as a desktop and portable system, while using the same peripheral devices with both systems. One difficulty with relying on KVM switches is that the end user generally has to access an onscreen display menu or physical switch of the display to select which information handling system to use.

Other information handling system functions are sometimes coordinated for an information handling system through a variety of different peripheral devices in addition to a keyboard, mouse and display. One example is the use of a camera and microphone to perform communication, such as with a video or audio conference. Often the camera and microphone are integrated in portable information handling systems. These integrated devices are convenient but tend to have lower quality audio and video than peripheral devices. Audio capture in particular can present difficulty since the typical microphone can capture a wide array of sounds near an information handling system. This can result in a low quality conference since general environmental noise and human speaking by non-participants can detract from the listener's ability to discern audio content.

SUMMARY OF THE INVENTION

Therefore, a need has arisen for a system and method which improve mouse recyclability.

A further need exists for a system and method that provides a more durable mouse scroll wheel and input buttons.

A further need exists for a system and method that manages power usage at a mouse.

A further need exists for a system and method that improves audio captured at an information handling system.

A further need exists for a system and method that improves end user accessibility to a KVM switch.

In accordance with the present invention, a system and method are provided which substantially reduce the disadvantages and problems associated with previous methods and systems for manufacture and use of a mouse in association with an information handling system and other peripherals like a keyboard and display.

More specifically, an information handling system mouse is constructed of a plastic chassis having a full perimeter around side that accepts a bottom surface within the perimeter for a clean appearance and solid construction. A plastic inner frame heat stakes in place for durable construction that survives repeated compressive forces yet is constructed without metal coupling devices, such as screws. A scroll wheel couples the chassis into the inner frame and includes variable magnetic attraction applied to the scroll wheel as it turns to provide an end user a tactile feedback of scroll wheel rotation. A magnetic focus lens directs the magnetic force towards a ferromagnetic wheel having spikes and valleys so that magnetic force working against scroll wheel rotation varies as the spikes and valley rotate past the magnetic focus lens. Additional adjustments to the variable magnetic force may be provided by adjusting the magnet or magnets that provide magnetic flux to the magnetic focus lens. In one embodiment, electropermanent magnets are included with the mouse key input buttons to provide a user configurable button response, such as a cantilever response having a substantial button movement associated with an input versus a spring response having a small movement. The button switch is located in an acoustic isolation box to selectively adjust audible feedback provided by a switch input.

Mouse power consumption is managed when the mouse is idle with a motion power switch that cuts off power use when the mouse is idle and reestablishes mouse operations by a motion-initiated power application. A conductive ball held within a conductive container has an open circuit that closes when motion of the mouse places the conductive ball into contact with the conductive container so that a processing resource of the mouse can return to an operating state and manage power until the mouse becomes idle again. The power switch is located at a bottom surface of the mouse and includes a channel for vertical travel when placed in the on position so that additional inputs may be made at the power switch through a tactile button input made by vertical travel of the power button from an on position achieved by a sliding motion of the power button.

In addition to the mouse, a keyboard peripheral is provided that enhances audio capture for communication functions and ease-of-use with a KVM switch through control offered by a touchscreen display included in the keyboard. An array of microphones disposed around the perimeter of a touchscreen display included in the keyboard provide a direction and range to spoken voices so that only voices in a defined zone are included in audio communicated through an information handling system conference. The microphones interface with a digital signal processor processing resource that use a first artificial intelligence engine to filter only voices in the defined zone and a second artificial intelligence engine to filter out non-voice sounds. The keyboard display provides real time feedback to the end user of captured sound quality and control over the audio capture parameters. In addition, the keyboard integrated display interfaces with a keyboard, video, mouse (KVM) switch that selects from plural information handling systems which communicates with a keyboard and mouse coupled to the display. The keyboard display provides control of KVM functions normally managed through an onscreen display menu supported by the display scalar. The keyboard display offers a graphical user interface at the end user's fingertips to toggle KVM control between different information handling systems interfaced with the display.

The present invention provides a number of important technical advantages. One example of an important technical advantage is that a mouse having a durable construction is more readily recycled without the use of screws to couple the mouse components together. The mouse scroll wheel provides a tactile feel through magnetic flux that does not suffer from physical wear over time. An end user can select whether to have a cantilever or spring button input feel and also select the amount of audible click feedback provided by a completed input. Power use when the mouse is inactive is eliminated where no power draw is needed to monitor for mouse motion. A display included in a peripheral keyboard manages KVM switch activation and other functions, such as microphone audio for recording end user voice in support of a videoconference. Audio captured by speakers integrated in the keyboard has a high quality and filters out undesired voices and noise.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 5, 5A and 5B depict an alternative system for providing variable scroll wheel spin speed and tactile feel;

FIGS. 16, 16A, 16B, 16C, 16D, 16E, 16F, 16G and 16H depict a mouse sliding button with orthogonal activation;

FIGS. 26 depicts another example embodiment of the type of KVM control available through a keyboard touchscreen display;

DETAILED DESCRIPTION

An information handling system mouse and keyboard have enhanced reliability and support a variety of functions, such as audio capture and KVM switch control. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
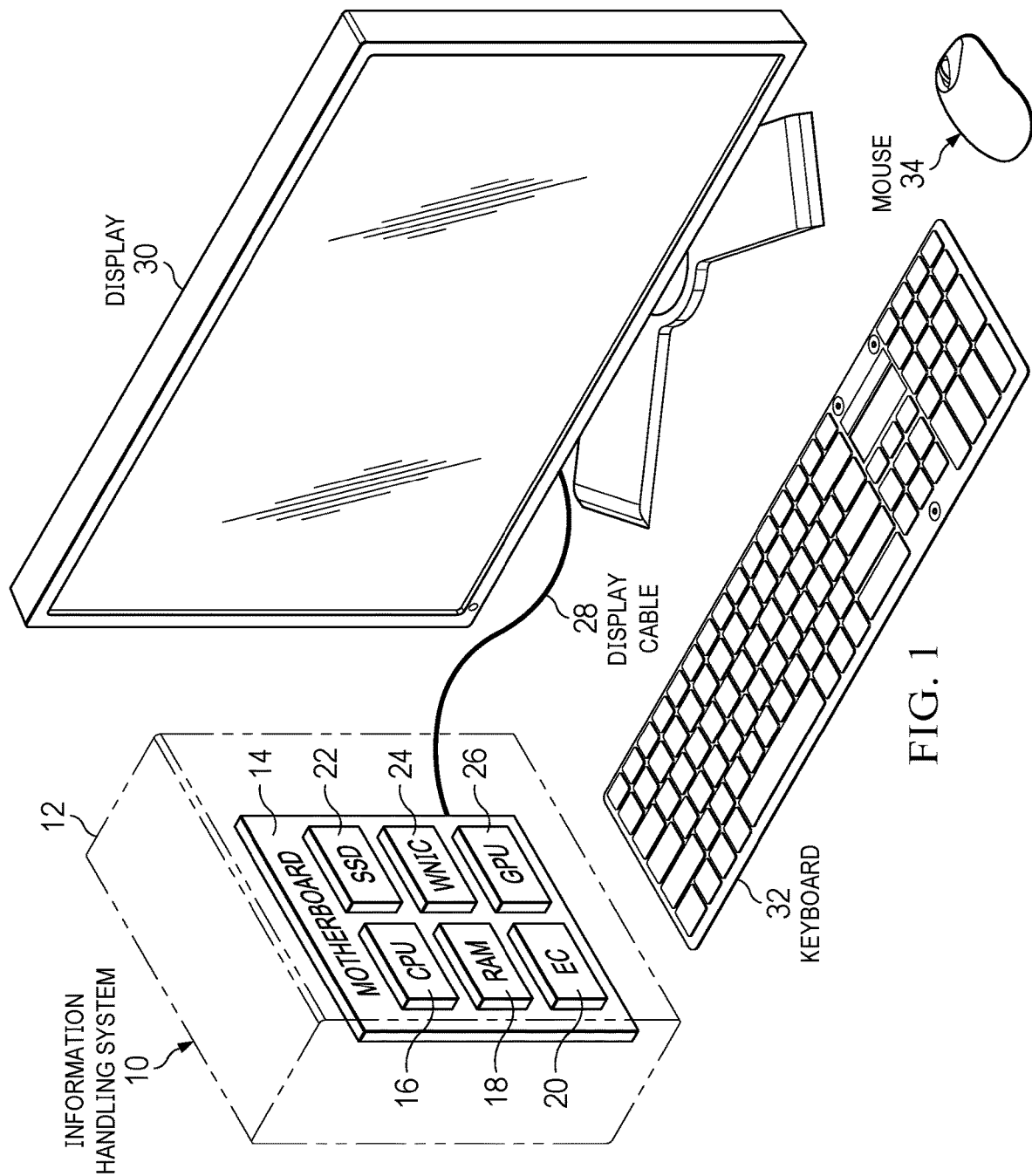
FIG. 1 depicts an information handling system that processes information with processing components disposed in a housing and interfaced with a peripheral display, peripheral keyboard and peripheral mouse.

Referring now to FIG. 1, an information handling system 10 processes information with processing components disposed in housing 12 and interfaced with a peripheral display 30, peripheral keyboard 32 and peripheral mouse 34. In the example embodiment, housing 12 is a desktop housing configured to operate in a fixed location; however, in alternative embodiments a portable housing may be used that integrates a power source and display in the portable housing to operate the system when mobile. A motherboard 14 coupled to housing 12 provides communication between a central processing unit (CPU) 16 that executes instructions to process information and a random access memory (RAM) 18 that stores the instructions and information. An embedded controller (EC) 20 manages operating conditions of the processing components, such as application of power, maintenance of thermal constraints and interactions on a physical level between peripheral devices and CPU 16. For instance, EC 20 accepts keyboard and mouse inputs made by an end user for communication to CPU 16. A solid state drive (SSD) 22 provides persistent storage of instructions and information during power down states, such as by storing an operating system and applications in flash memory for retrieval by EC 20 at application of power. A wireless network interface controller (WNIC) 24 provides wireless communication with external networks and peripheral devices, such as through WiFi and BLUETOOTH. A graphics processing unit (GPU) 26 further processes the information to generate visual images for presentation at a display 30, such as by communicating pixel values through a display cable 28.

In operation, an end user interacts with the processing components of information handling system 10 through peripheral devices, such as a keyboard 32 that accepts key inputs, a mouse 34 to accept cursor movement and button inputs and a display 30 that presents information as visual images. The peripheral devices may communicate through wireless signals with integrated WNIC's that support BLUETOOTH or other types of wireless personal area networks (WPANs) or may interface through a cable, such as a USB Type A, B or C port and cable. In addition to presenting visual images, display 30 may accept inputs through a touchscreen, such as a capacitive touch detection surface. As is set forth below in greater detail, display 30 may include a keyboard, video, mouse (KVM) switch that allows keyboard 32 and mouse 34 to interface through display 30 with information handling system 10. Keyboard 32 has a conventional QWERTY key configuration, although other types of configurations may be used. As is set forth in greater detail below, keyboard 32 may include an LCD that presents a touchscreen interface, such as a number pad or a controller of the KVM switch. Mouse 34 includes a position sensor on a bottom side that detects mouse movements relative to a desktop surface and reports the mouse movements to information handling system 10 to command movement of a cursor presented at display 30. A pair of buttons on the upper surface of mouse 34 accept end user presses as inputs that are reported to information handling system 10, such as right click and left click inputs. A scroll wheel located between the buttons rotates forward and backwards to command an up and down scroll of content at display 30. In various embodiments, various conventional configurations of keyboard 32 and mouse 34 may be used in the present disclosure with the improvements to the art described herein below in greater detail.

Figure 2:
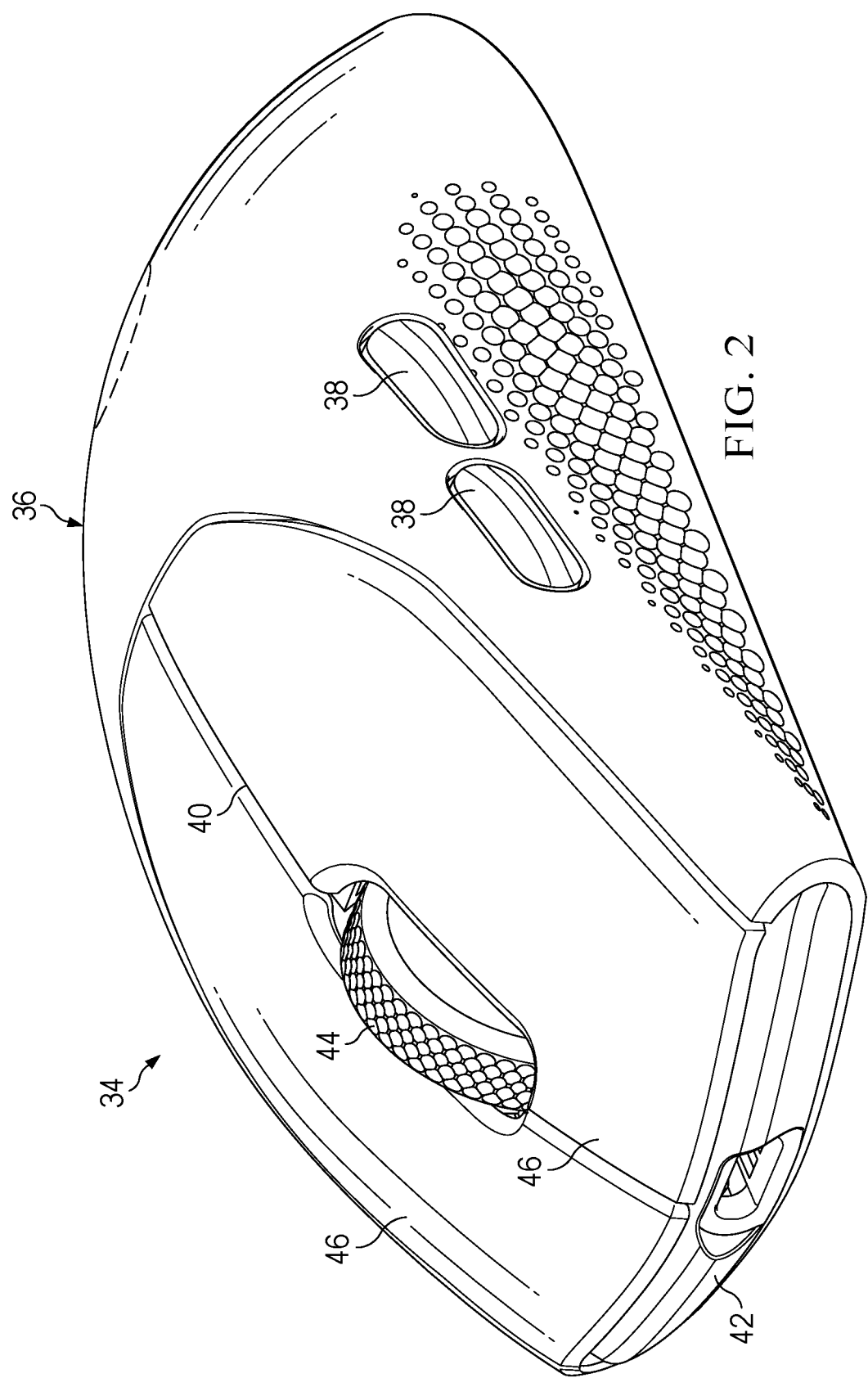
FIGS. 2, 2A, 2B and 2C, depict a mouse having a unibody chassis constructed without screws.

Referring now to FIGS. 2, 2A, 2B and 2C, a mouse 34 is depicted having a unibody chassis 36 constructed without screws. By building mouse 34 without screws, recycling mouse 34 after its useful life is less complex and costly since screws cannot typically be included in a plastic recycle process and must generally instead be manually removed before the plastics are crushed. In the example embodiment of FIG. 2, mouse 34 is assembled in a chassis with double injection molding of parts that are heat staked or ultrasonic welded together so that screws or any similar metallic coupling devices are not used. In alternative embodiments, other types of plastic couplers may be used, such as adhesives. FIG. 2 depicts an example of mouse 34 having a chassis 36 molded as a single piece of plastic that encompasses a complete perimeter of the body and has a sphere-like palm rest upper surface molded with side walls to create a rigid form factor resistant to high squeeze forces that can result from normal use. A front bridge 42 forms a box-like overall structure that leaves a bottom opening to accept a bottom surface and a central upper surface opening through which left and right main input buttons 46 and a scroll wheel 44 extends. Gaps and steps in chassis 36 are only for moving parts to be exposed, such as left and right main input buttons 46 and side buttons 38. In the example embodiment, side buttons 38 are integrated with chassis 36 by heat staking or ultrasonic welding while a gap 40 allows some movement of left and right main input buttons 46 relative to chassis 36. With this arrangement, the only static assembly gap/step is from the bottom surface assembly coupling to chassis 36 at a bottom side where the assembly location is hidden from view for an aesthetically pleasing final appearance. The result of the assembly, as further detailed below, is a high rigidity unibody mouse assembly with minimal assembly gap/steps and ready recyclability.

Figure 2A:
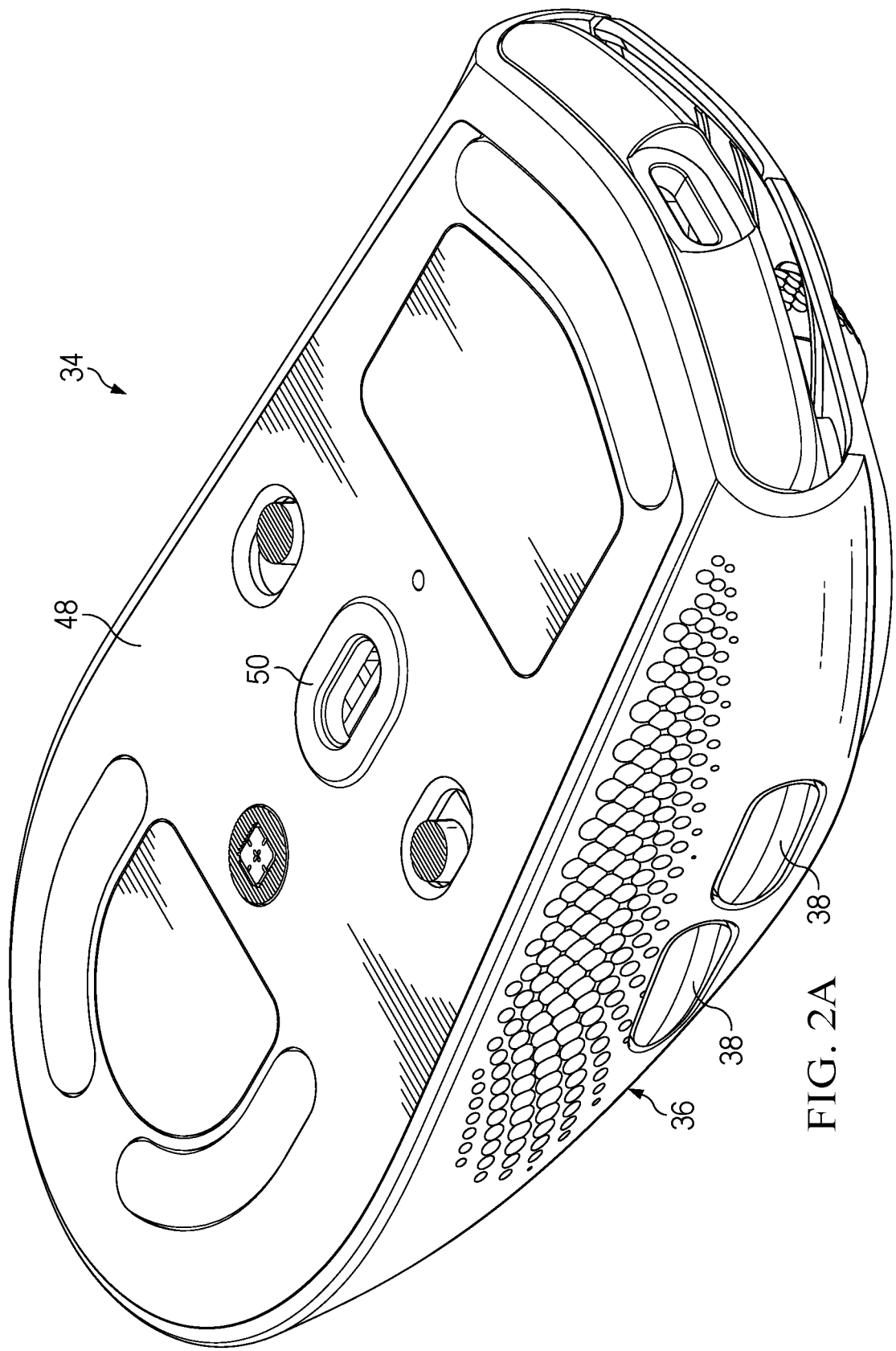
Figure 2B:
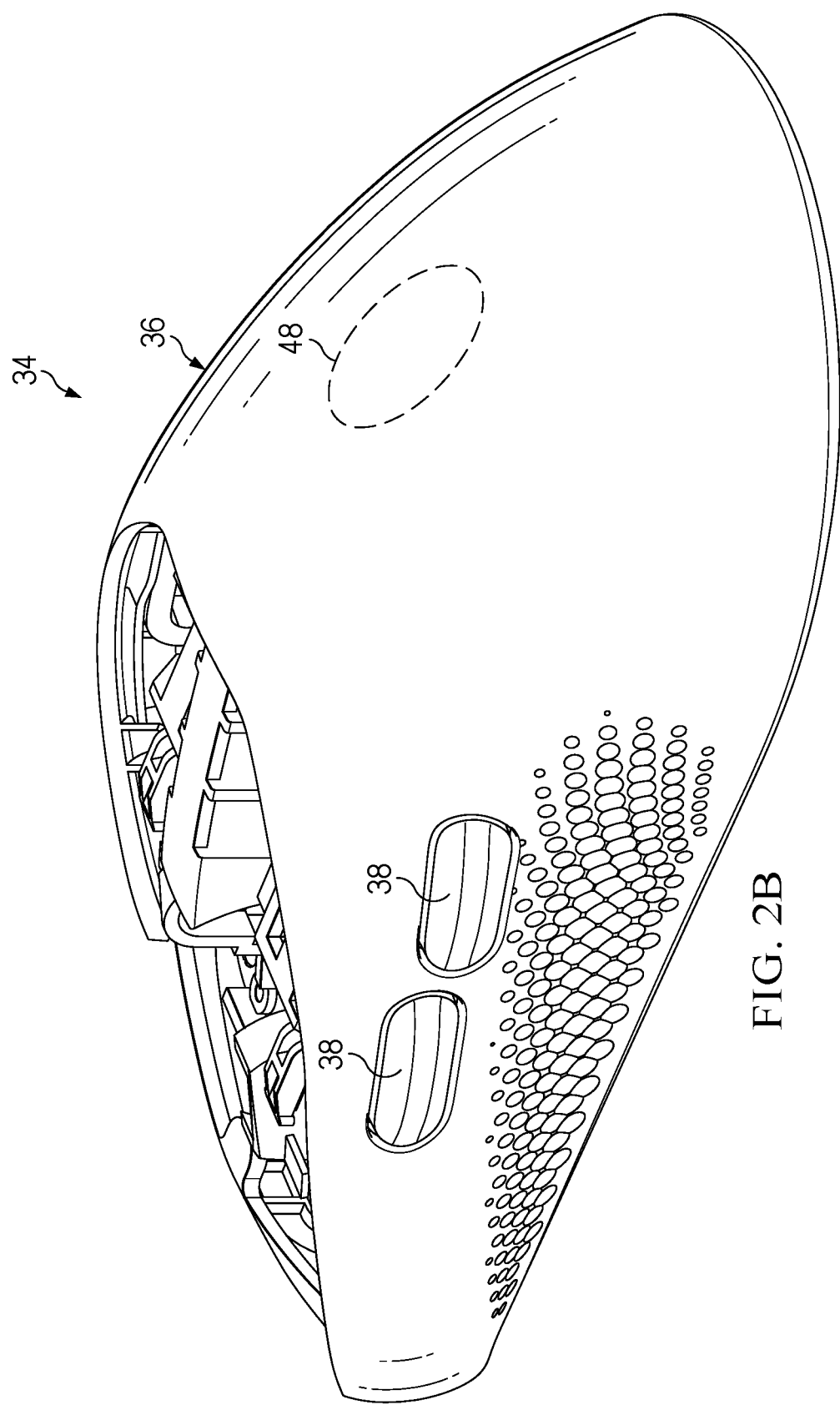
Figure 2C:
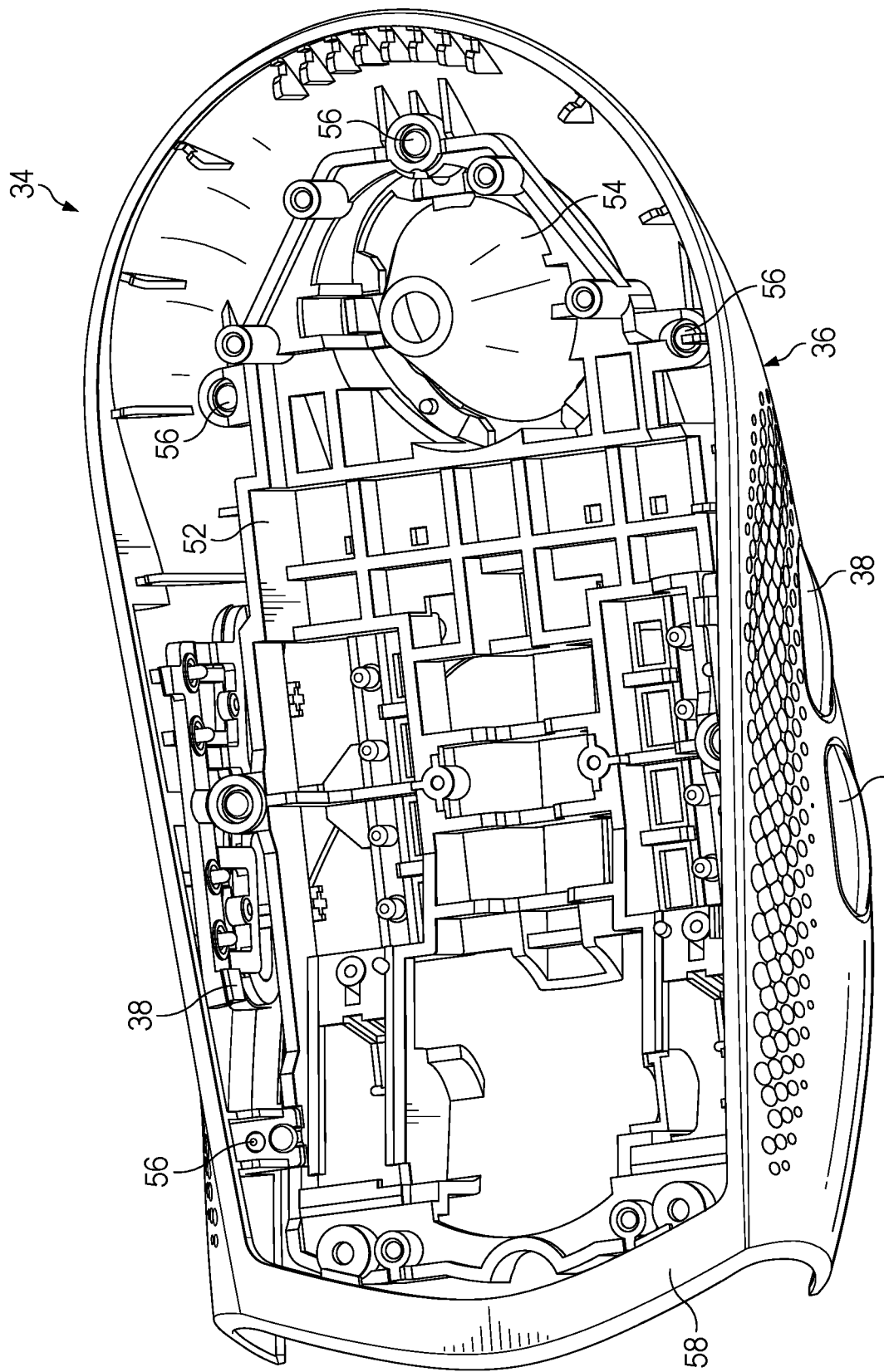

FIG. 2 depicts an upper perspective view of the fully assembled mouse 34. FIG. 2A depicts a bottom perspective view of mouse 34 with the bottom surface 48 coupled to chassis 36 and having a position sensor 50 exposed at a central location to detect motion of mouse 34 relative to a desktop surface. Bottom surface 48 couples within an interior of the perimeter of chassis 36, which forms a complete circumference around bottom surface 48 for improved structural integrity. The sides of chassis 36 have enhanced thickness in locations that endure the greatest amount of pressure due to squeezing, such as proximate the side buttons. FIG. 2B depicts a side perspective view of mouse 34 having the input buttons removed and showing a logo 48 and side buttons 38 integrated in chassis 36. To help ensure recyclability and also used recycled material, logo 48 has ABS (Acrylonitrile Butadiene Styrene) and 50% PCR (Post-Consumer Recycled material), while chassis 36 and side buttons 38 have ABS plus 65% PCR. FIG. 2C depicts a bottom perspective view of mouse 34 with the bottom surface removed to expose an inner frame 52 of ABS plus 65% PCR that provides structural support to chassis 36 and for internal components, such as a circuit board that couples the position sensor with a WNIC to communicate mouse inputs to an information handling system. A light funnel 54 couples to inner frame 52 to direct light from an internal illumination source at logo 48. Heat stakes 56 at distributed locations of inner frame 52 assemble the inner frame to the chassis without metal coupling devices. Inner frame 52 provides a structure to hold input buttons and the scroll wheel in place. In addition, side buttons 38 couple by heat stakes 56 to chassis 36 to couple the side buttons in place and also add to the structural support of the chassis. Bridge 58 spans across the opening of opposing sides of chassis 36 to complete the perimeter within which the bottom surface of the mouse couples into place.

Figure 3:
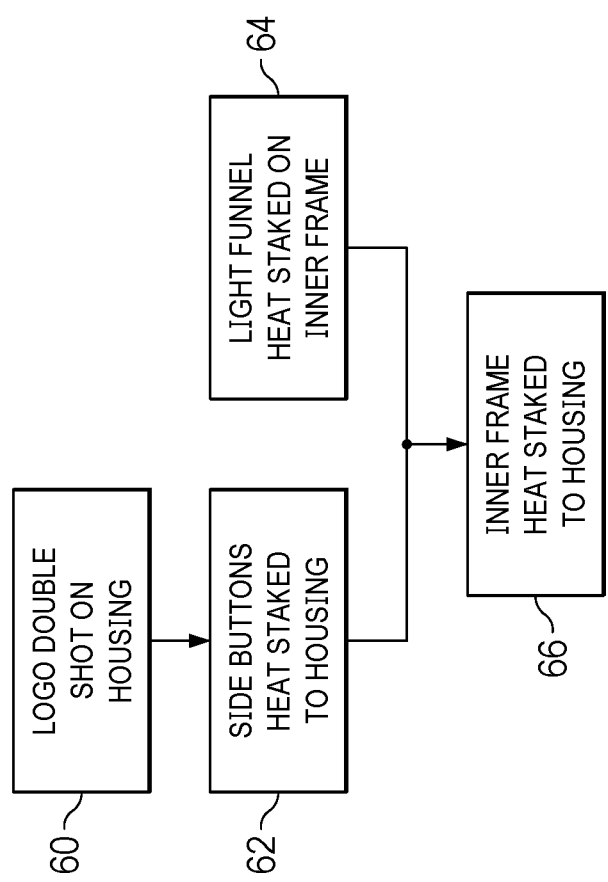
FIG. 3 depicts a flow diagram of a process for manufacture and assembly of a mouse without screws or metallic coupling components.

Referring now to FIG. 3, a flow diagram depicts a process for manufacture and assembly of mouse 34 without screws of metallic coupling components. The process starts at step 60 with a logo double shot injection molding to integrate a light emissive material in the chassis main material and aligned to accept illumination from the internal light funnel. At step 62, side buttons are coupled to the chassis with a heat stake that avoids metallic coupling such as screws. At step 64, the light funnel is heat staked to the chassis aligned to direct illumination at the logo. Once the side buttons and light funnel are coupled in place, the process continues to step 66 to heat state the inner frame to the chassis. The inner frame reinforces the chassis structure strength and to help maintain rigidity without screws or other metallic coupling devices. Once the chassis is complete, the bottom surface is coupled within the bottom chassis opening perimeter and having electrical components assembled in place.

Figure 4:
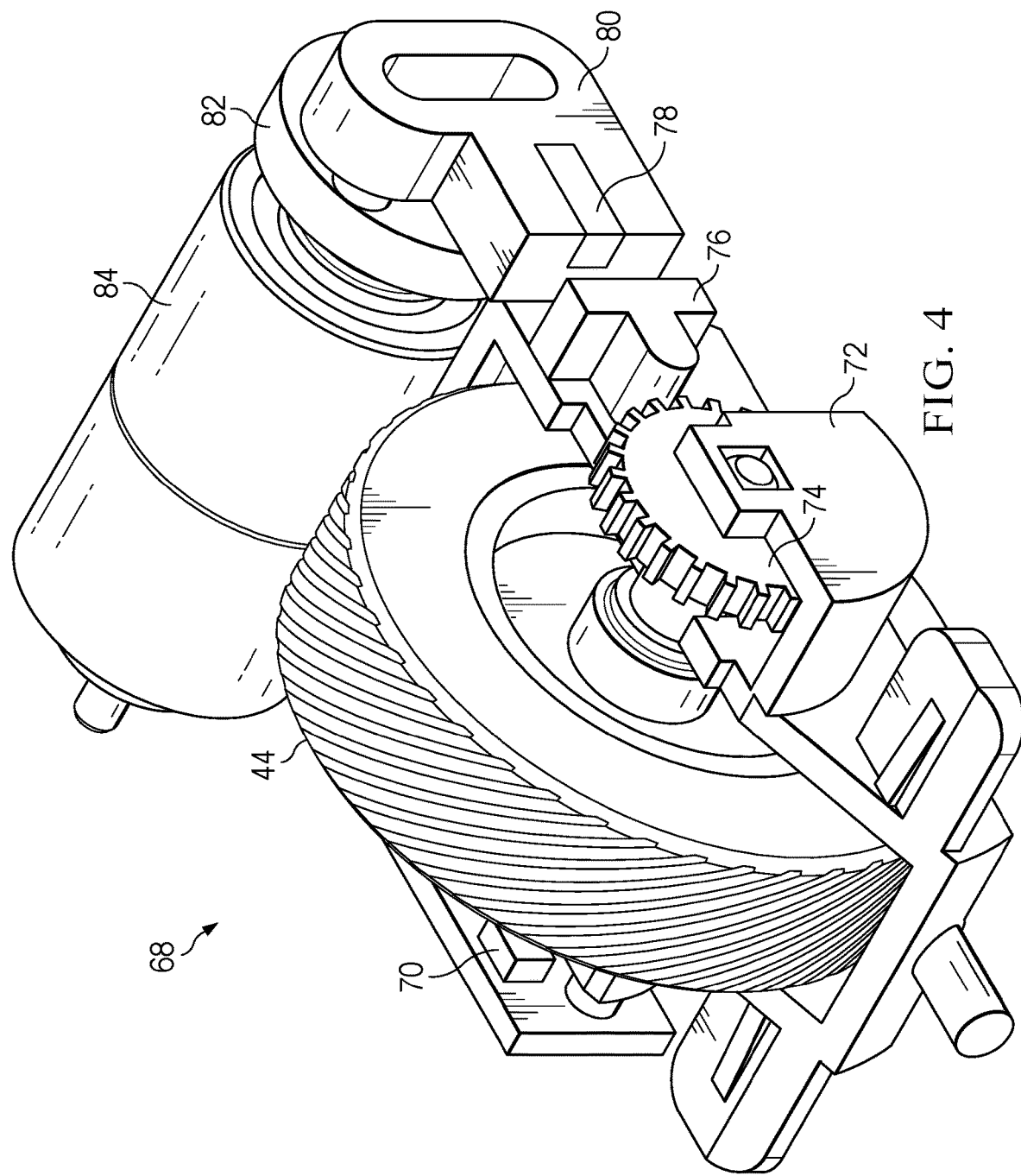
FIGS. 4, 4A and 4B depict a system for variable scroll wheel spin speed and tactile response.
Figure 4A:
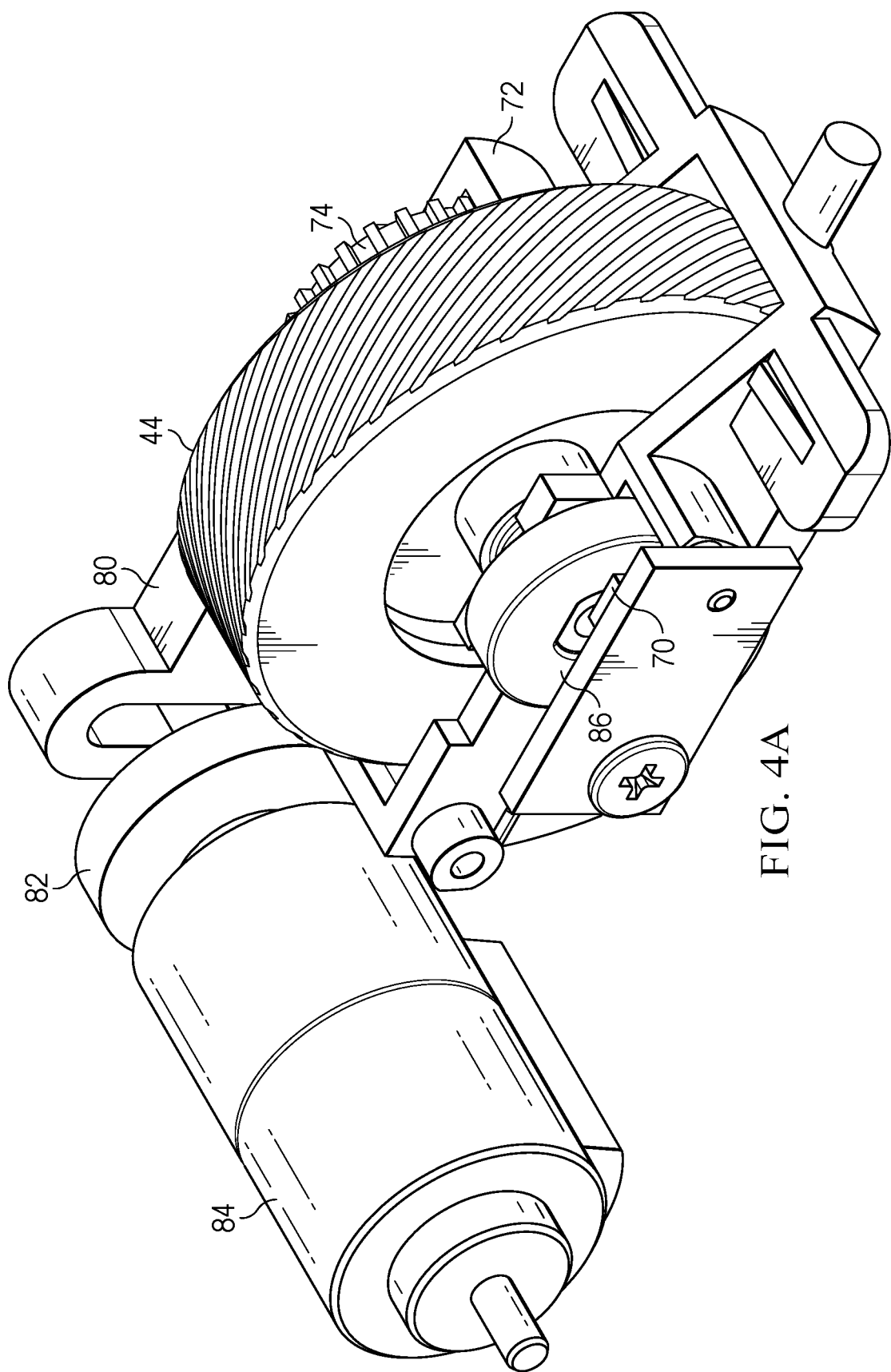
Figure 4B:
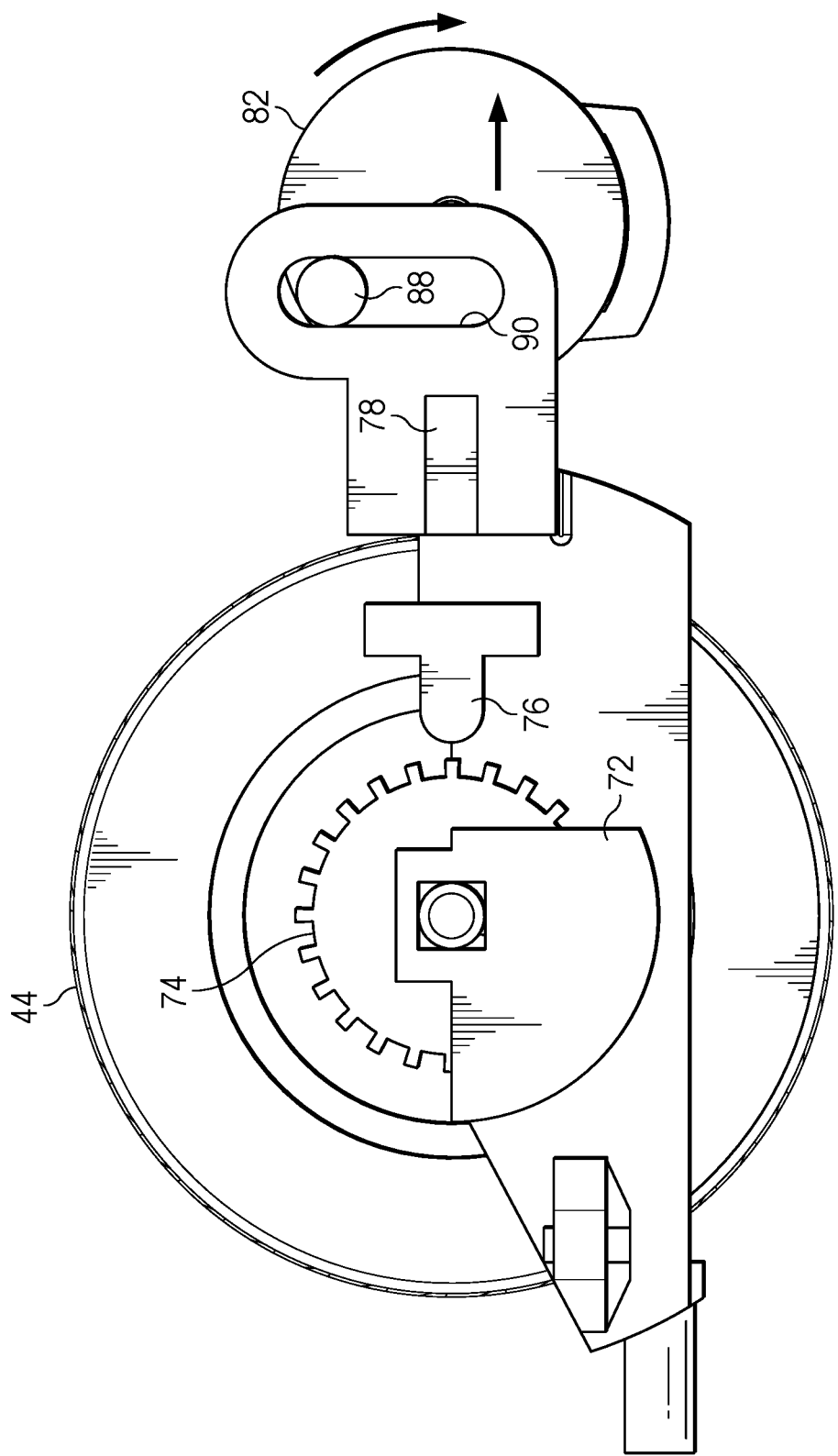

Referring now to FIGS. 4, 4A and 4B, a system for variable scroll wheel spin speed and tactile response is depicted. FIG. 4 depicts a front perspective view of a scroll wheel assembly 68 that rotates to accept scroll inputs from an end user. In the example embodiment, scroll wheel 44 rests in a cradle 72 to rotate about a central axis so that a Hall sensor 70 detects rotation in increments to report to an information handling system as scroll commands, such as by wireless communication. FIG. 4A depicts a front perspective view of scroll wheel 44 from an opposing side to illustrate a measurement position of Hall sensor 70 relative to a magnet 86 that spins with scroll wheel 44 to provide scroll wheel rotation measurements through change of magnetic flux. In alternative embodiments, alternative types of sensors may be used, such as an optical sensor. Returning to FIG. 4, scroll wheel 44 couples to a steel wheel 74 having gear-shaped spikes that extend with even spacing about its circumference. Steel wheel 74 spins with rotation of scroll wheel 44 so that the gear-shaped spikes provide variable magnetic force relative to a magnet placed nearby. In the example embodiment, a permanent magnet 78 provides a magnetic flux through a magnetic focus lens 76 that operates against steel wheel 74 to generate a variable spin speed and tactile feedback for rotation of scroll wheel 44. Magnetic focus lens 76 is, for example a ferromagnetic material that concentrates the magnetic flux proximate spikes of steel wheel 74 so that the impact of the magnetic flux on scroll wheel 44 varies based upon the distance of steel wheel 74 to magnetic focus lens 76 as spikes of the steel wheel pass by the tip of magnetic focus lens 76. In one example embodiment, magnetic focus lens 76 is an electronic steel having an iron silicon alloy with around 3.2% silicon content to enhance magnetic permeability. A motor 84 rotates a motor wheel 82 engaged with an arm 80 to adjust the amount of magnetic flux applied by the magnetic focus lens 76 to steel wheel 74.

FIG. 4 depicts permanent magnet 78 in contact with magnetic focus lens 76 to maximize the amount of magnetic flux applied to steel wheel 74 so that a fully available scroll wheel tactile feedback is provided. Motor wheel 82 rotates a pin 88 fit into a slot of arm 80 to a 9 o'clock position to bring permanent magnet 78 in contact with magnetic focus lens 76 for creating the maximal magnetic flux at steel wheel 74. FIG. 4B depicts a side view of the scroll wheel system having motor wheel 82 rotated upward to an 11 o'clock position so that arm 80 is pulled by engagement of pin 88 in the slot 90 away from magnetic focus lens 76, thus creating space between permanent magnet 78 and magnetic focus lens 76, effectively cutting to zero the amount of magnetic flux applied to steel wheel 74. In operation, motor 84 turns motor wheel 82 so that pin 88 rotates to a 9 o'clock position to bring permanent magnet 78 in contact with magnetic focus lens 76. When an end user spins scroll wheel 44, steel wheel 74 fixedly coupled to scroll wheel 44 turns synchronously with scroll wheel 44 so that geared-spikes rotate past magnetic focus lens 76. Spikes that pass near magnetic focus lens 76 generate a greater magnetic attraction than the valley between the spikes due to changes in distance between the magnetic focus lens and the ferromagnetic material of steel wheel 74 based on whether a spike or a valley aligns with magnetic focus lens 76. Although the example embodiment moves permanent magnet 78 into and out of contact with magnetic focus lens 76 to turn magnetic flux high or low in a binary manner, an alternative embodiment may move magnetic focus lens 76 to have a greater and lesser distance to steel wheel 74 to adjust the magnetic force that operates against rotation of steel wheel 74.

Figure 5A:
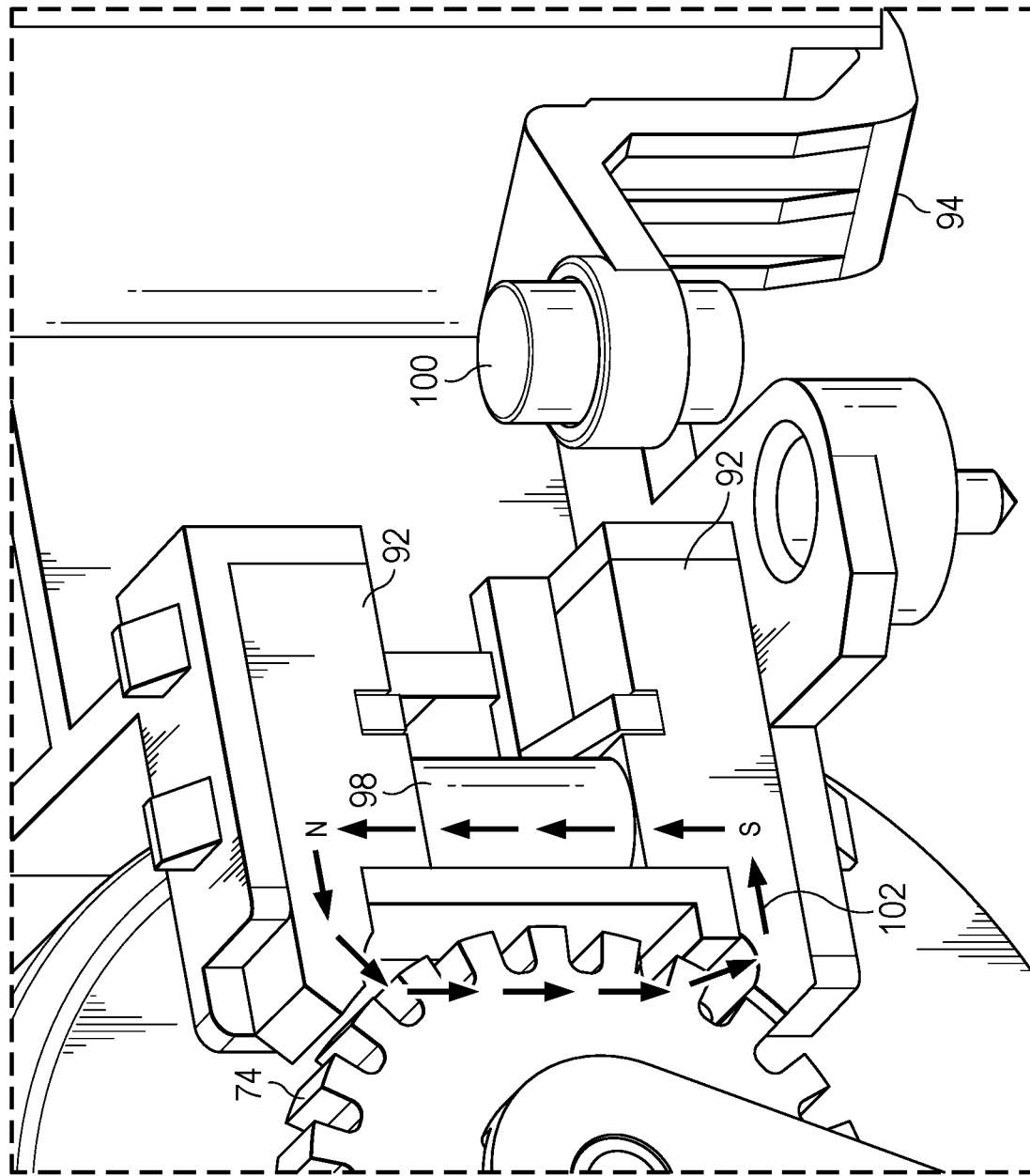
Figure 5B:
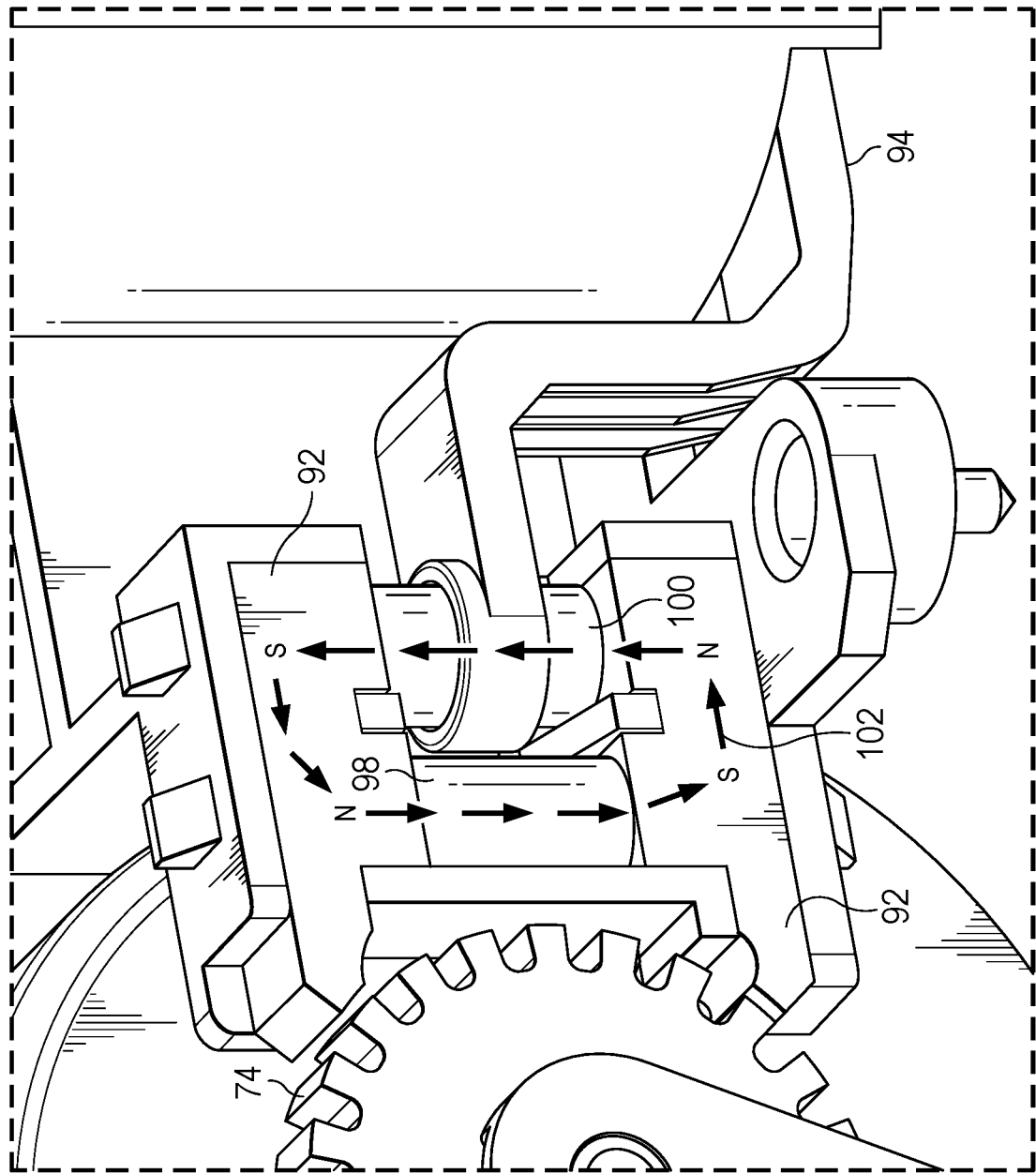

Referring now to FIGS. 5, 5A and 5B, an alternative system is depicted for providing variable scroll wheel spin speed and tactile feel. Scroll wheel 44 rotates in a cradle 72 with a steel wheel 74 having geared-spikes coupled in a fixed manner as described above. Steel wheel 74 may be made of any high magnetic permeable material, such as various ferromagnetic alloys including silicon iron alloys, and may have other types of forms that vary the distance of the steel wheel material to a magnetic lens during rotation with the minimum to maximum distance occurring in a manner associated with a desired scroll wheel tactile feel or response. A focus lens assembly 92 has upper and lower arms extending towards steel wheel 74 and a permanent magnet 98 coupled between the upper and lower arms. FIG. 5A depicts the magnetic field generated between the upper and lower arms of focus lens assembly 92, which operates with a variable magnetic attraction as steel wheel 74 rotates to align spikes and valleys with the upper and lower arms. Focus lens assembly 92 has a spacing between the upper and lower arms so that spikes and valleys align synchronously with the upper and lower arms as steel wheel 74 rotates. When both the upper and lower arms of focus lens assembly 92 align with spikes of steel wheel 74, magnetic attraction is greatest; and when both the upper and lower arms of focus lens assembly 92 align with a valley between the spikes of steel wheel 74, magnetic attraction is least. A motor 96 couples to a rotating arm 94 that supports a second permanent magnet 100. FIG. 5A depicts second permanent magnet 100 displaced from alignment with focus lens assembly 92 so that the magnetic field 102 of first magnet 98 operates through the extending arms of focus lens assembly 92 on steel wheel 74. FIG. 5B depicts second permanent magnet 100 rotated by rotating arm 94 and motor 96 to align within focus lens assembly 92. In the example embodiment, first and second permanent magnets 98 and 100 have opposite polar alignments as depicted by FIG. 5B so that alignment of second permanent magnet 100 within focus lens assembly 92 has the effect of turning off magnetic field 102 attraction operating against steel wheel 74.

Figure 6:
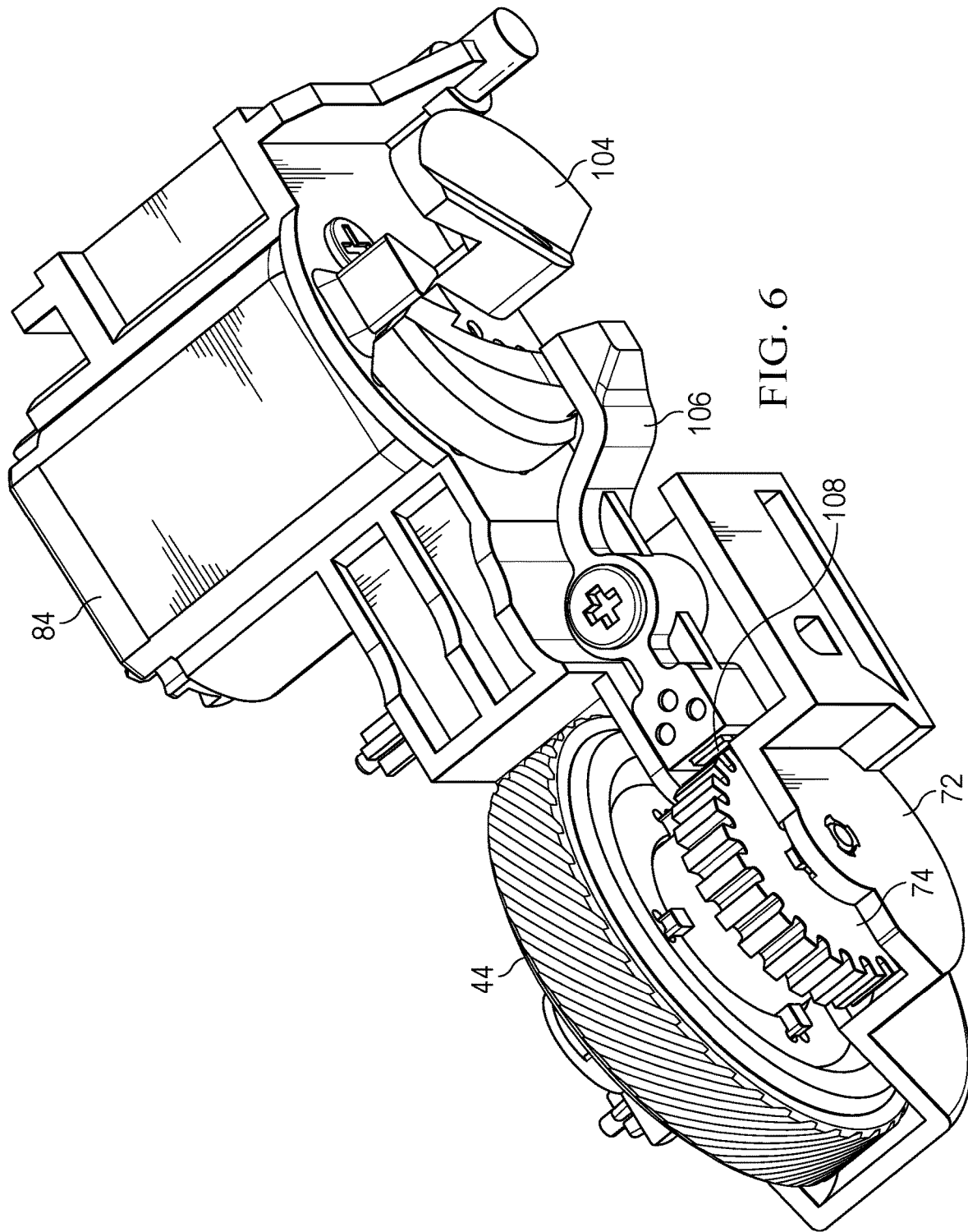
FIGS. 6 and 6A depict an alternative system for providing variable scroll wheel spin speed and tactile feel.
Figure 6A:
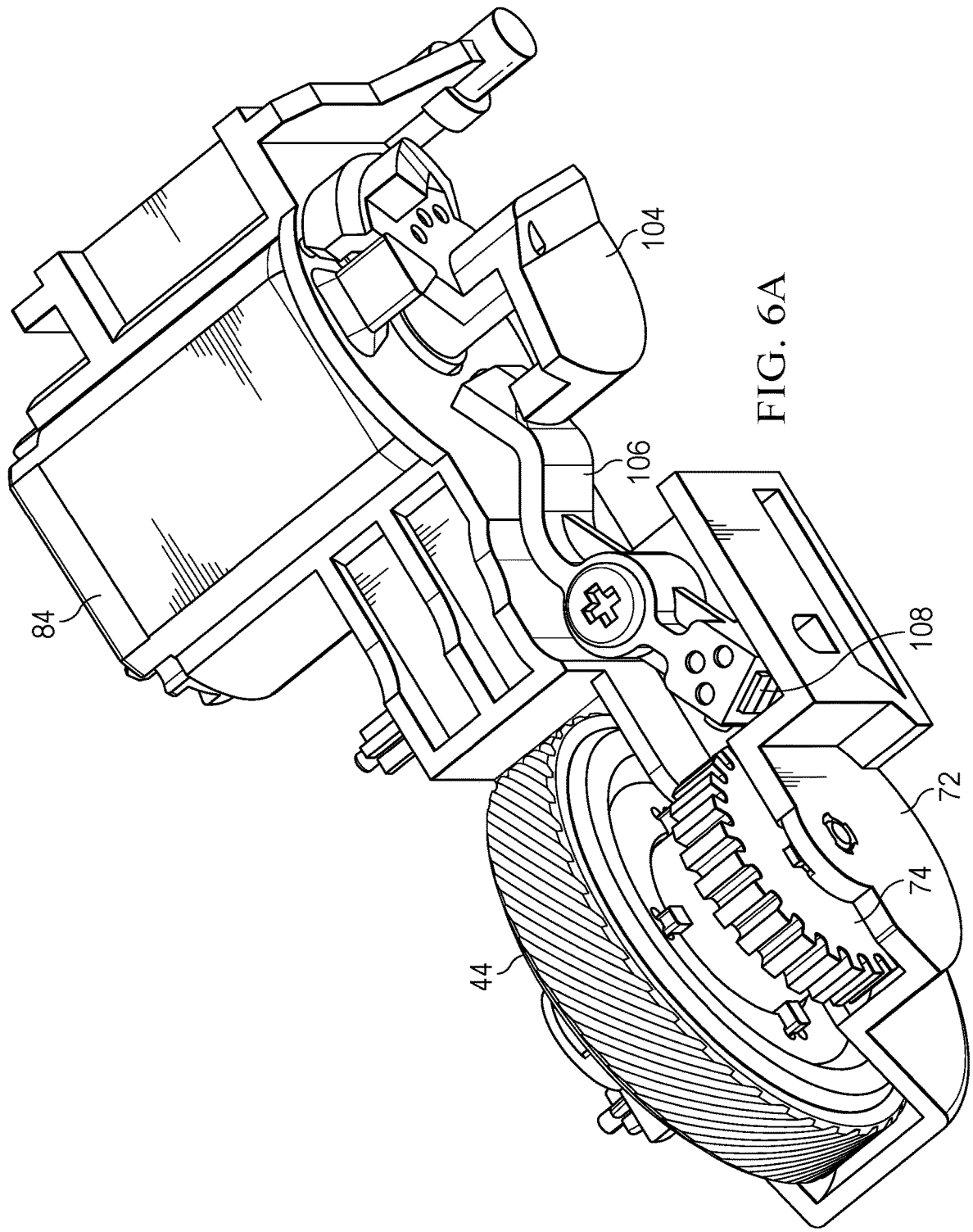

Referring now to FIGS. 6 and 6A, an alternative system is depicted for providing variable scroll wheel spin speed and tactile feel. In the example embodiment, scroll wheel 44 couples with steel wheel 74 having geared-spikes that vary magnetic attraction relative to a permanent magnet 108 having a Halbach array. As is described above, the distance between spikes and valleys of the steel wheel 74 and permanent magnet 108 varies as scroll wheel 44 rotates to provide the variable spin speed and tactile feel. The Halbach array provides a magnetic attraction with north and south poles on the side of the magnet facing steel wheel 74 and minimal magnetic flux on the opposing side. In one example embodiment, the Halbach array magnetic poles are spaced so that each pole simultaneously aligns with a spike or a valley, such as with an interval of the spikes of steel wheel 74, so that magnetic attraction is maximized at alignment of the spikes and minimized at alignment of the valleys. A swinging arm 106 couples through a rotating disk 104 with a motor 84 that changes the distance between permanent magnet 108 and steel wheel 74. FIG. 6 depicts motor 84 engaging swinging arm 106 with rotating disk 104 to place permanent magnet 108 in close proximity to steel wheel 74 so that magnetic attraction is maximized for generating scroll wheel 44 tactile feedback. FIG. 6B depicts motor 84 rotating swinging arm 106 through rotating disk 104 to move permanent magnet 108 away from steel wheel 74 so that scroll wheel 44 has reduced magnetic interaction for a free spinning operation.

Figure 7:
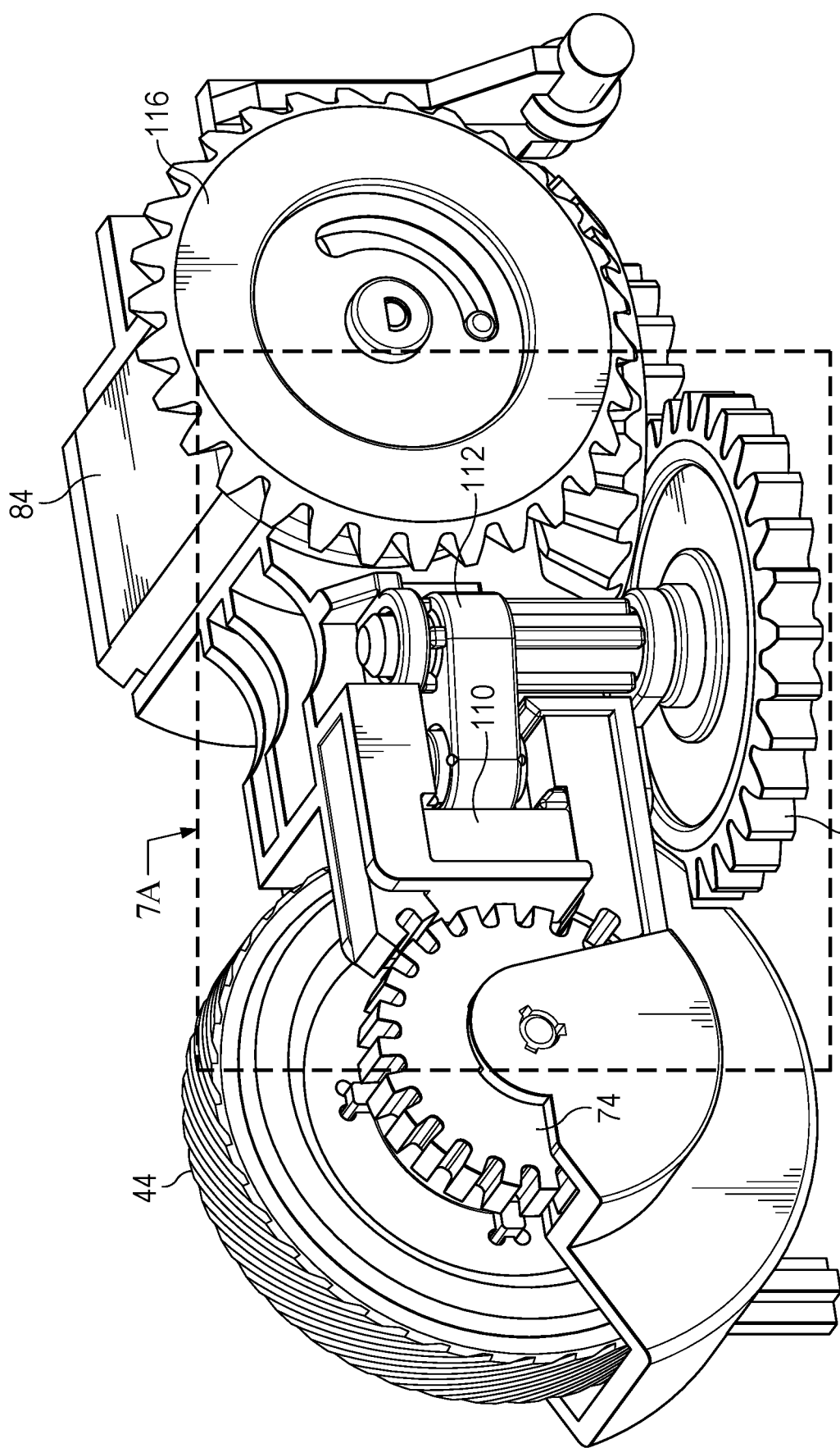
FIGS. 7, 7A and 7B depict an alternative system for providing variable scroll wheel spin speed and tactile feel.
Figure 7A:
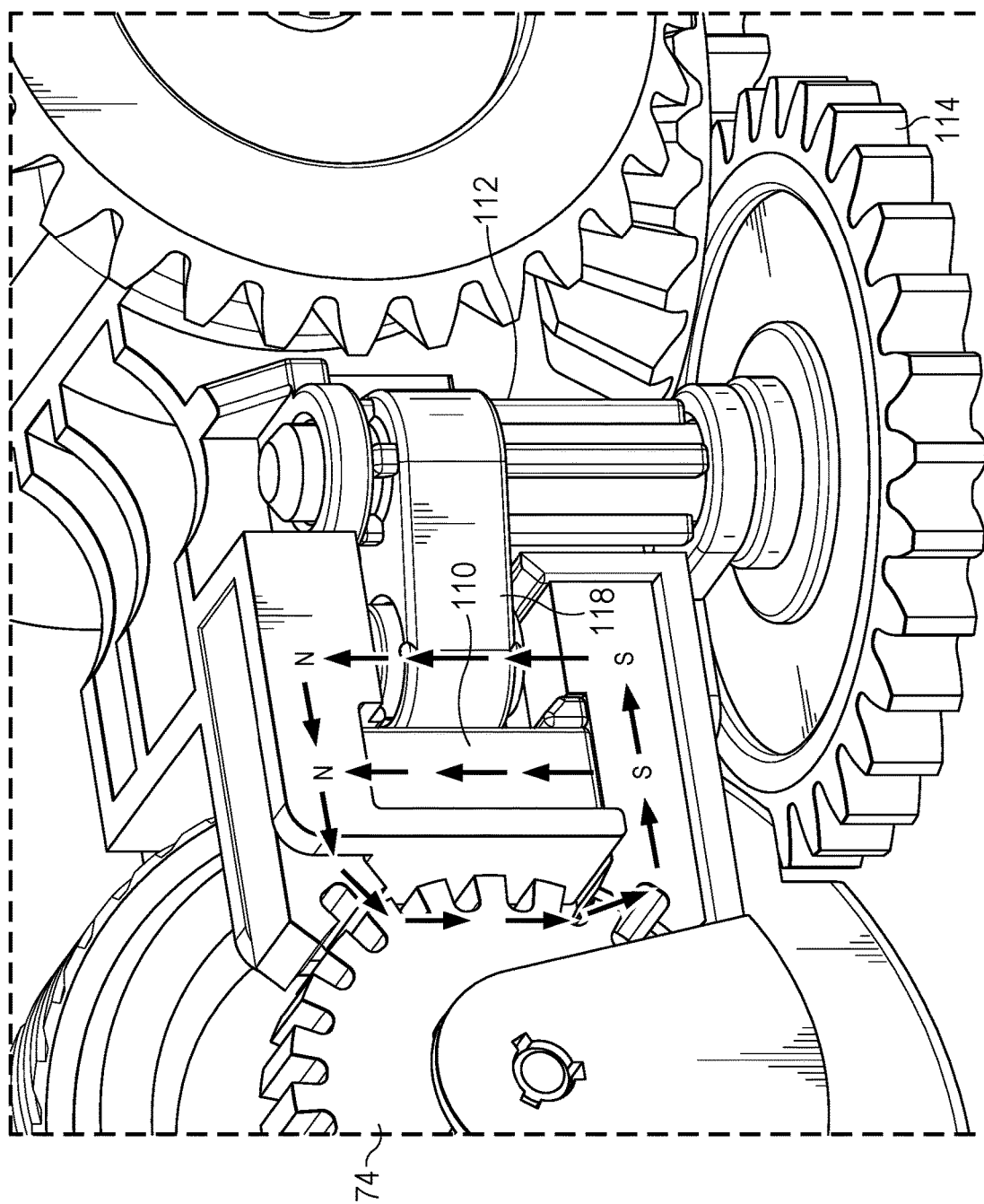
Figure 7B:
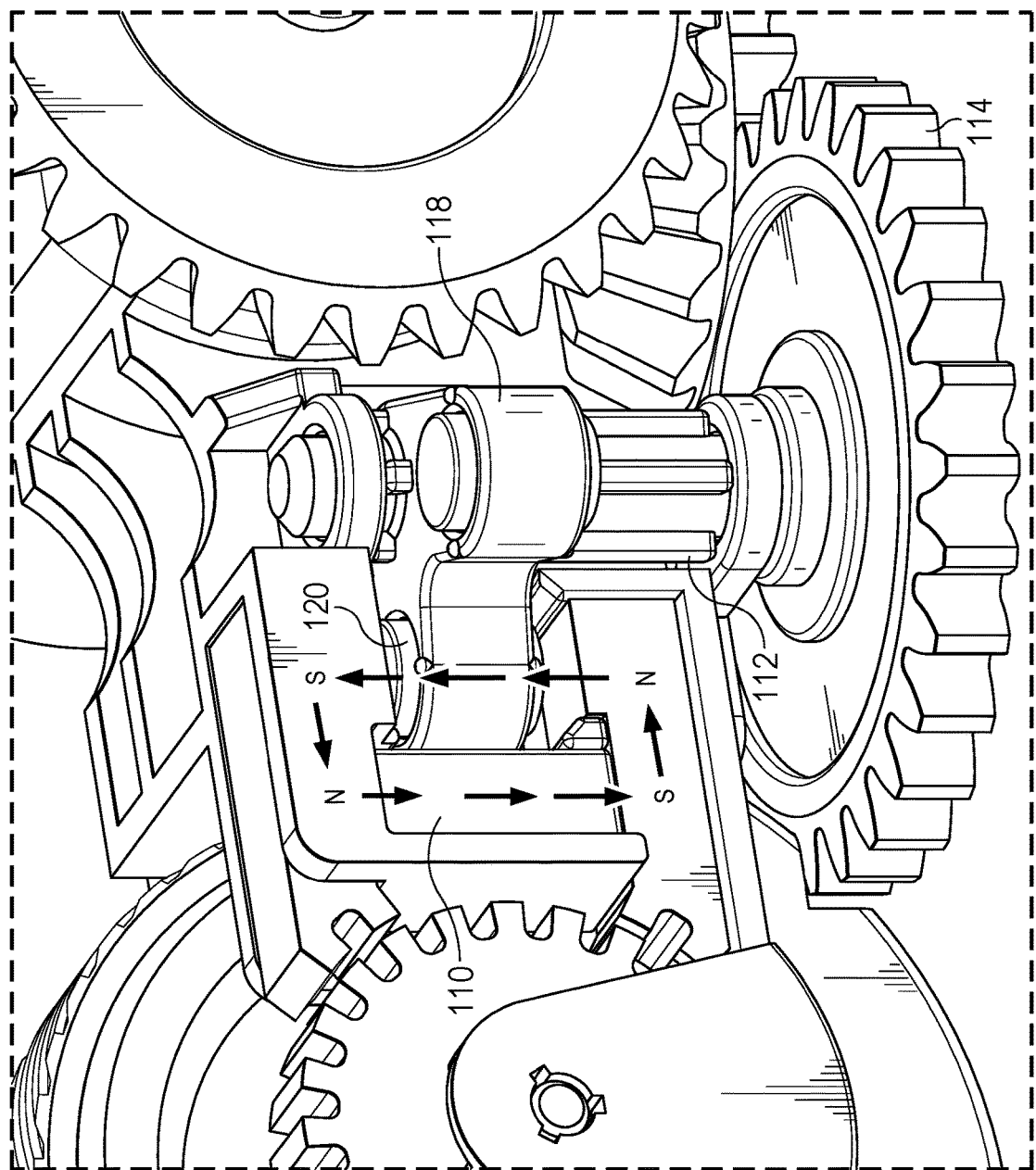

Referring now to FIGS. 7, 7A and 7B, an alternative system is depicted for providing variable scroll wheel spin speed and tactile feel. In the example embodiment, steel wheel 74 couples to scroll wheel 44 as described above so that spikes and valleys of steel wheel 74 interact with magnetic force of a magnetic focus lens assembly 110 to vary scroll wheel rotation speed. As with the embodiment described above with respect to FIG. 5, magnetic focus lens assembly 110 is built with magnetic permeable material, such as ferromagnetic material like a silicon iron alloy, and has an upper and lower arm that each extend towards steel wheel 74 to alternatively align with spikes and valleys that adjust the magnetic force to vary scroll wheel speed. In the example embodiment, a shaft 112 couples to a geared wheel 114 at a base and to a pair of support arms 118 that each hold a permanent magnet. A first permanent magnet couples in place within magnetic focus lens assembly 110 having a first polarity, such as north at top and south at bottom. Geared wheel 114 engages with a rotating wheel assembly 116 and motor 84 so that operation of motor 84 rotates shaft 112 to select which of the pair of support arms 118 brings a magnet into alignment with magnetic focus lens assembly 110. FIG. 7A depicts alignment of a second permanent magnet having the same polarity orientation as the first permanent magnet with magnetic focus lens assembly 110 so that the combined magnetic attraction of both the first and second magnets operate against the steel wheel 74, as shown. FIG. 7B depicts wheel 114 rotated to rotate shaft 112 so that a third magnet 120 with an opposite polarity orientation of the first magnet aligns with magnetic focus lens assembly 110 instead of the second magnet 118. The opposite polarity configurations of the first and third magnets aligned with magnetic focus lens assembly 110 cancels the magnetic attraction directed towards steel wheel 74 so that scroll wheel 44 rotates freely.

Figure 8:
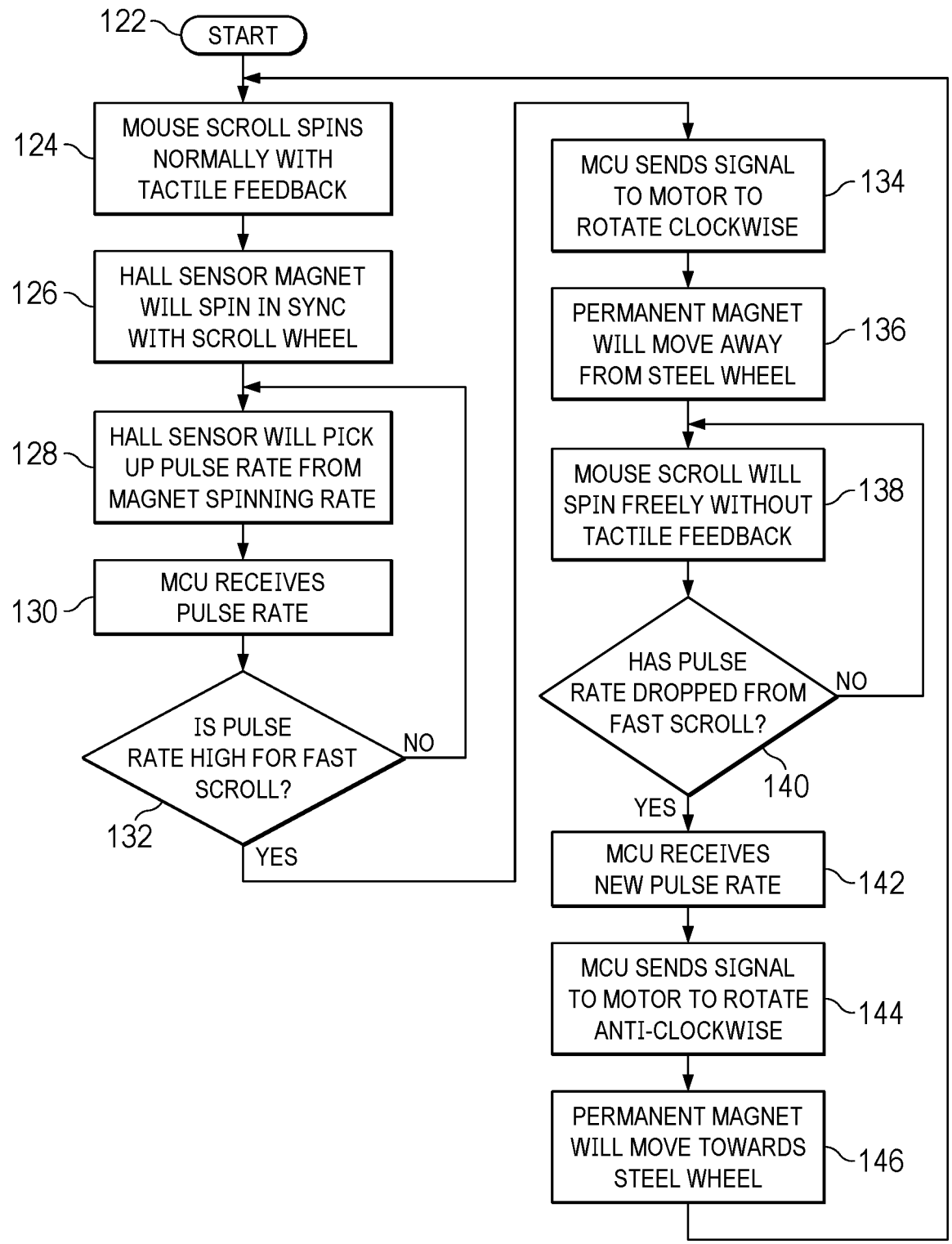
FIG. 8 depicts a flow diagram of a process for automatically activating fast and normal scroll wheel rotation.

Referring now to FIG. 8, a flow diagram depicts a process for automatically activating fast and normal scroll wheel rotation. The process starts at step 122 with power applied to the mouse and at step 124 the mouse detects scroll wheel rotation provided with normal tactile feedback by magnetic attraction proximate the steel wheel that changes as spikes and valleys pass by the magnet as the steel wheel rotates synchronously with the scroll wheel. At step 126, the Hall sensor or other position sensor detects scroll wheel rotation, such as by sensing movement of a magnet coupled to the scroll wheel and synchronously rotating with the scroll wheel. At step 128, the Hall sensor or other position sensor detects a pulse rate associated with the rotation of the scroll wheel and indicative of the scroll wheel rotation rate. At step 130, a processing resource of the mouse, such as a microcontroller unit (MCU) receives the pulse rate to report the scroll wheel input to an information handling system. At step 132, a determination is made of whether the pulse rate exceeds a threshold pulse rate associated with a fast scroll rate. If not, the process returns to step 128 to continue monitoring scroll wheel rotation.

If at step 132 the fast scroll threshold is exceeded, the process continues to step 134 at which the processing resource commands the motor to rotate from the normal scroll tactile feedback position to a fast scroll position. At step 136, rotation by the motor moves the permanent magnet relative to the magnetic focus lens to remove the magnetic field from interaction with the steel wheel. As set forth above, the movement may pull the magnet out of alignment with the magnetic focus lens or may introduce an opposing polarity magnet to cancel the magnetic attraction. At step 138, the mouse scroll wheel will spin freely without the tactile feedback in the absence of the magnetic field. At step 140 a determination is made of whether the pulse rate detected by the scroll wheel rotation has dropped below the fast scroll threshold for a predetermined time. If not, the process returns to step 138 to continue monitoring the pulse rate. If the pulse rate has dropped below the threshold, the process continues to step 142 at which the processing resource detects the lower pulse rate. At step 144, the processing resource commands the motor to rotate the magnet back into proximity with the magnetic focus lens. At step 146, the permanent magnet returns to proximity with the magnetic focus lens to provide magnetic attraction that works against the steel wheel and the process returns to step 124.

Figure 9:
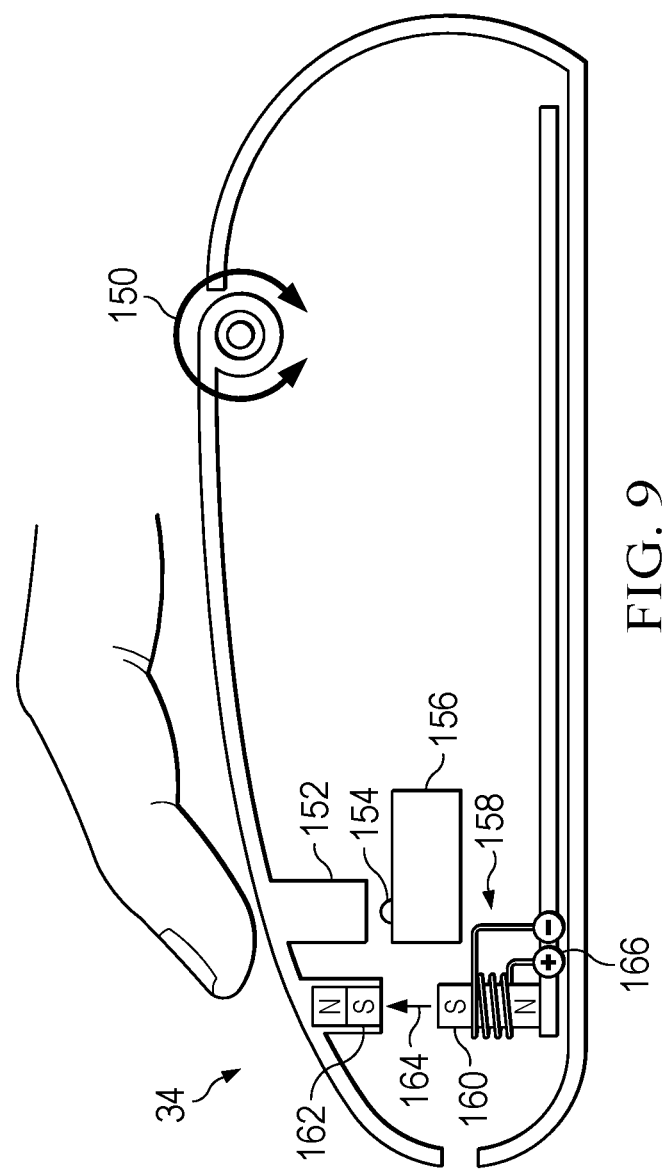
FIG. 9 depicts a side cutaway view of an example of a mouse having a push button key plate that configures to cantilever and spring types of behavior.

Referring now to FIG. 9, a side cutaway view depicts an example of a mouse 34 having a push button 46 key plate that configures to cantilever and spring types of behavior. In the example configuration of FIG. 9, a cantilever type of push button behavior is provided with a relatively large rotational movement about a pivot couple 150 to have a keyplate protrusion 152 reach a switch plunger 154 of a switch 156 and press downward to perform an input. To provide an upward bias to button 46 a permanent magnet 162 coupled to button 46 has an opposite pole configuration indicated by arrow 164 relative to an electropermanent magnet 160 coupled to a mouse main board having a power source 166. The opposite pole configuration provides a spacing between permanent magnet 162 and electropermanent magnet 160 that a press of push button 46 must overcome to engage key plate protrusion 152 against switch plunger 154. The amount of upward bias may be adjusted by increasing or decreasing the opposing magnetic field of electropermanent magnet 160. Generally, an electropermanent magnet is built with a permanent magnet having a pole configuration and a secondary magnet having a coil 158 that accepts current to change the polarity of the secondary magnet. When the permanent magnet and secondary magnet have the same polarity, the magnetic field is cumulative of both magnets. When the permanent magnet and secondary magnets have opposite polarity, the magnetic fields cancel each other so that the external magnetic field is near zero. In the example embodiment, the magnetic attraction or repulsion provided by the electropermanent magnet 160 is managed by a processing resource that sets current at one or more coils to adjust one or more magnetic fields in an array of permanent magnets and electromagnets, such as with one or more MCU (Microcontroller Unit) GPIO (General Purpose Input/Output) pins. In alternative embodiments, other adjustments to the bias working upwards at button 46 may be used, such as electromagnets or mechanical springs.

Figure 10:
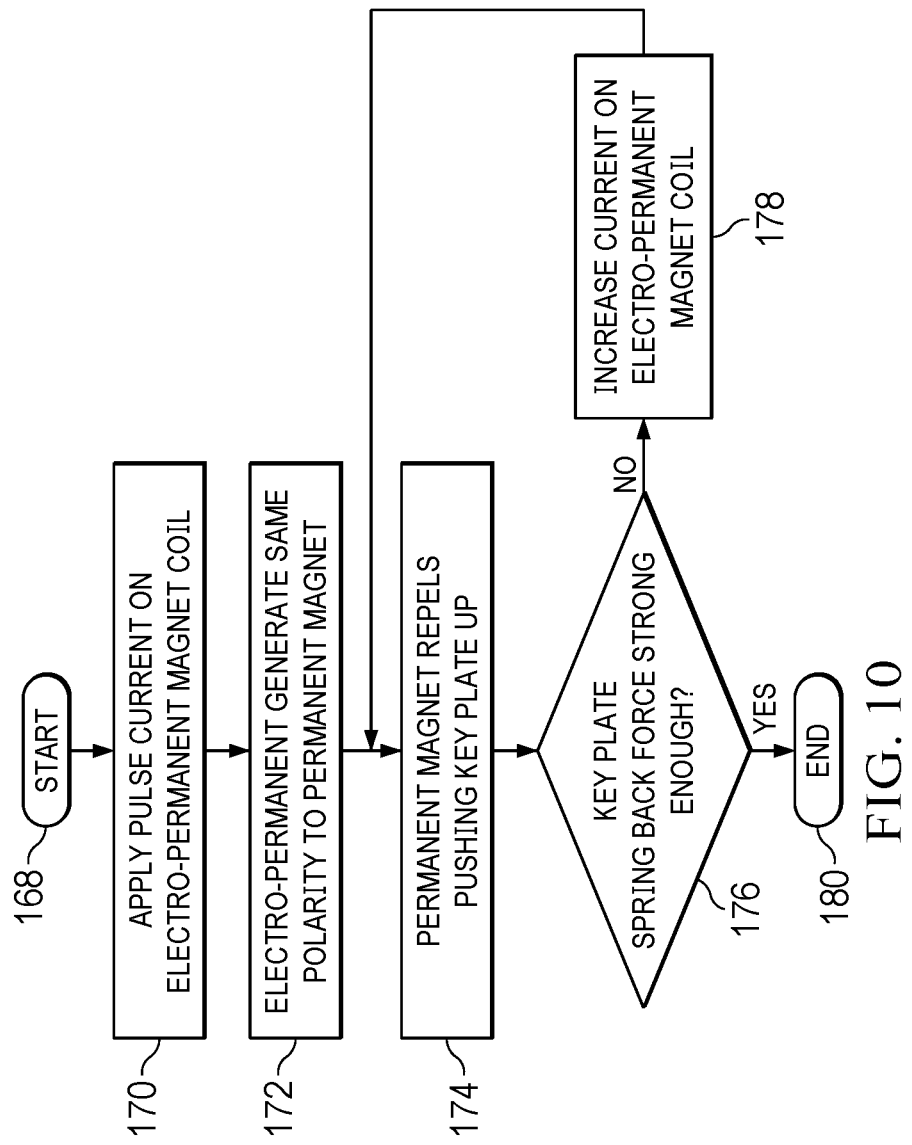
FIG. 10 depicts a flow diagram of a process for managing mouse input button cantilever behavior for a push button.

Referring now to FIG. 10, a flow diagram depicts a process for managing mouse input button cantilever behavior for a push button. The process starts at step 168 with power up of the mouse. At step 170 a pulse of current is applied to the electropermanent magnet coil to adjust the magnetic pole configuration and turn "on" the electropermanent magnet. At step 172, the current applied to the coil adjusts the magnetic pole configuration of the magnet array of the electropermanent magnet so that both magnets of the electropermanent magnet array have the same polarity, which is also the same polarity of the permanent magnet coupled to the mouse push button and opposed to the electropermanent magnet. At step 174, the permanent magnet of the push button and the electropermanent magnet oppose each other to create a repeling force that pushes the key plate of the push button upward and away from the input switch. At step 176, a determination is made of whether the key plate repulsing force provides sufficient spring back force for the desired cantilever behavior of the input button. If yes, the process ends at step 180. If not, the process continues to step 178 to increase the current on the electropermanent magnet so that a stronger repulsing force is created and then returns to step 174. Setting the repulsing force may be performed manually by an end user to a desired preference response, or automatically based upon how presses are performed at the mouse button.

Figure 11:
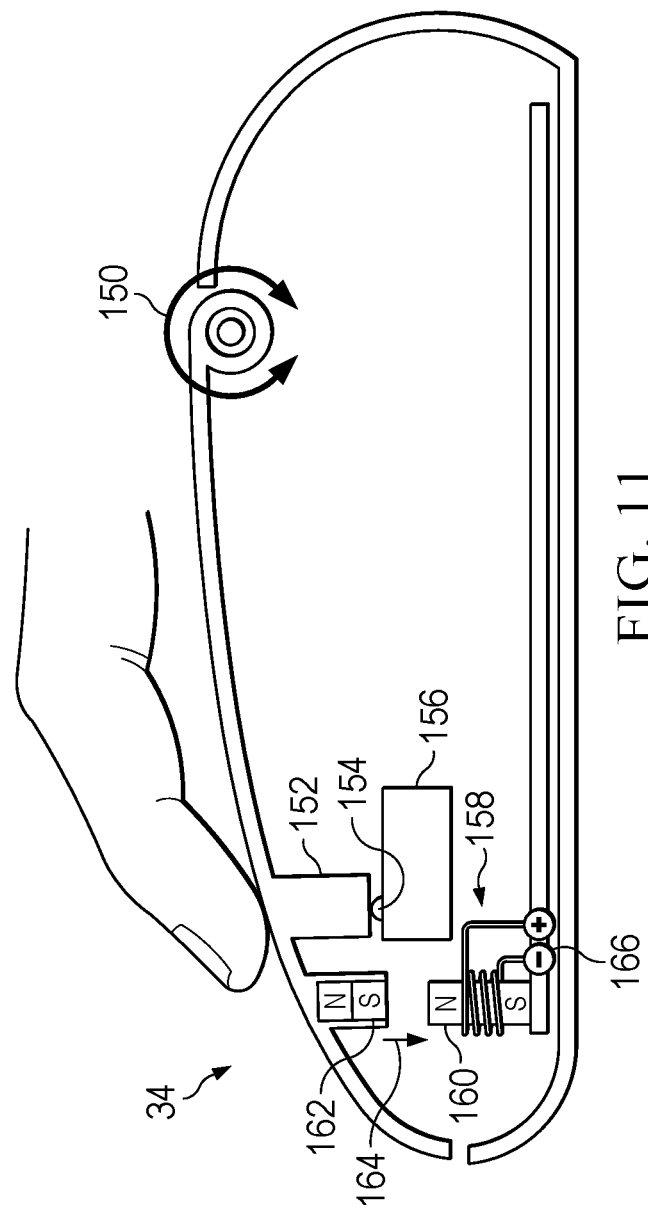
FIG. 11 depicts a side cutaway view of an example of a mouse having a push button key plate that configures to cantilever and spring types of behavior.

Referring now to FIG. 11, a side cutaway view depicts an example of a mouse 34 having a push button 46 key plate that configures to cantilever and spring types of behavior. In the example configuration of FIG. 11, a spring type of push button behavior is provided with a relatively small rotational movement about a pivot couple 150 to have a keyplate protrusion 152 reach a switch plunger 154 of a switch 156 and press downward to perform an input. In the example embodiment, magnetic attraction is established by configuration of the magnetic polarity of electropermanent magnet 160 with current from a power source 166 to a coil 158 so that an attractive magnetic force is provided relative to permanent magnet 162. The amount of magnetic attraction is sufficient to bring key plate protrusion 152 downward against switch plunger 154 of switch 156 without actuating a switch input by pressing down on switch plunger 154 with a sufficient input force. The attractive magnetic force reduces the gap between key plate protrusion 152 and switch plunger 154 to zero so that an input force by an end user pressing at push button 46 will result in an input click with minimal push button movement. Although the example embodiment depicts opposite magnetic poles to bring member 152 towards switch 156, a neutral ferromagnetic material may be sufficient for the magnet 162 to attain the desired position without activating the opposite pole of magnet 160.

Figure 12:
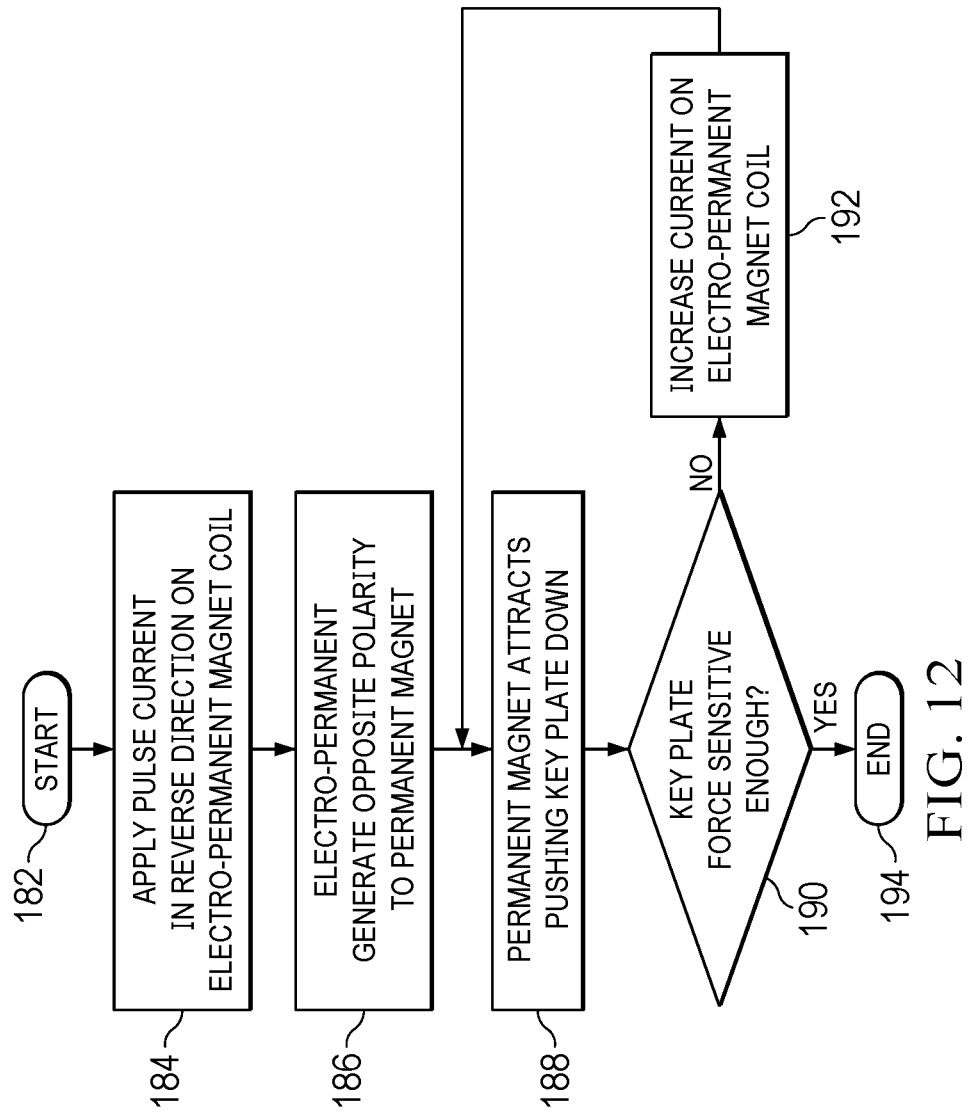
FIG. 12 depicts a flow diagram of a process for managing mouse input button spring type behavior for a push button.

Referring now to FIG. 12, a flow diagram depicts a process for managing mouse input button spring type behavior for a push button. The process starts at step 182 with power up of the mouse. At step 184 a pulse of current is applied to the electropermanent magnet coil to adjust the magnetic pole configuration and turn "on" the electropermanent magnet with a reverse current and polarity direction from that of FIG. 10. At step 186, the current applied to the coil adjusts the magnetic pole configuration of the magnet array of the electropermanent magnet so that both magnets of the electropermanent magnet array have the same polarity, which is also the opposite polarity of the permanent magnet coupled to the mouse push button and opposed to the electropermanent magnet. At step 188, the permanent magnet of the push button and the electropermanent magnet oppose each other to create an attracting force that pulls the key plate of the push button downward and towards the input switch. At step 190, a determination is made of whether the key plate attracting force provides sufficient or excessive force for the desired spring type behavior of the input button. For instance, the attractive force should keep the amount of movement to make an input at the push button minimal but not so excessive that inadvertent inputs will result. If yes, the process ends at step 194. If not, the process continues to step 192 to increase or decrease the current on the electropermanent magnet so that a stronger or weaker attracting force is created as desired and then returns to step 188. Setting the attracting force may be performed manually by an end user to a desired preference response, or automatically based upon how presses are performed at the mouse button.

Figure 13:
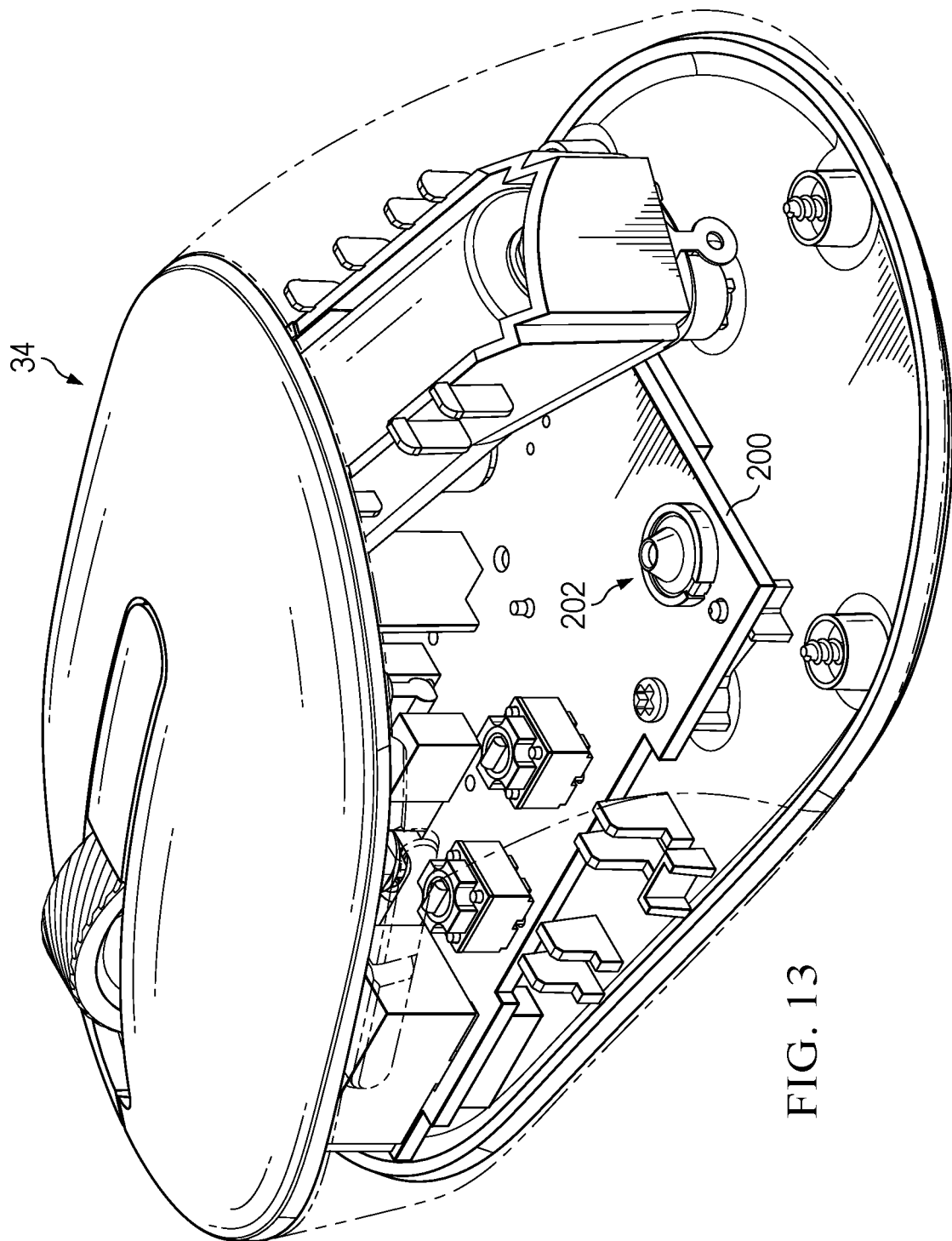
FIGS. 13, 13A and 13B depict a power system to wake a mouse from an off power state that avoids passive power dissipation.
Figure 13A:
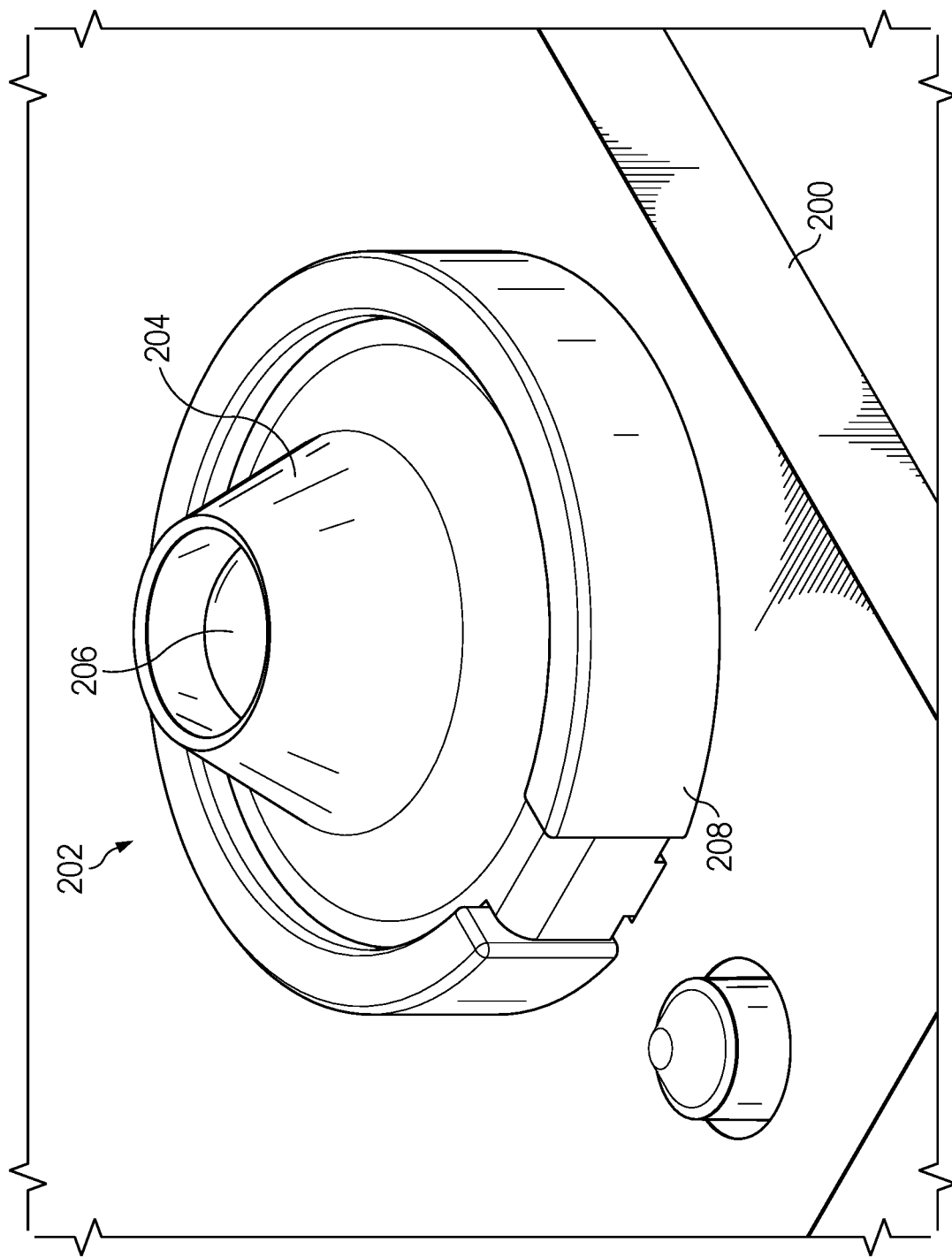
Figure 13B:
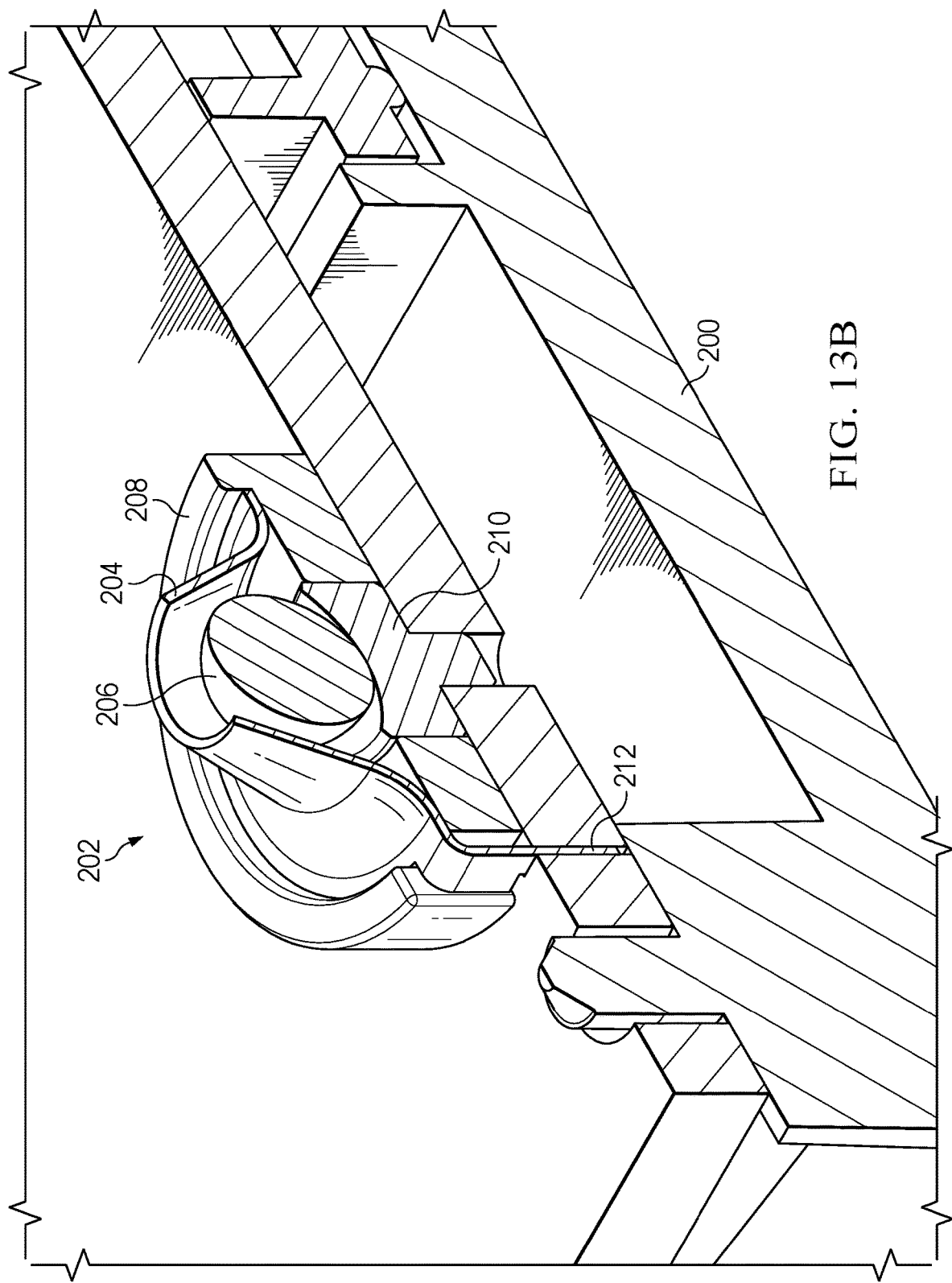

Referring now to FIGS. 13, 13A and 13B, a power system is depicted to wake a mouse from an off power state that avoids passive power dissipation. FIG. 13 depicts the motion power switch 202 coupled to a mouse printed circuit board 200 within a transparent view of mouse 34. Generally, mouse 34 has a processing resource on printed circuit board 200, such as an MCU, that commands a sleep state when mouse 34 meets predetermined conditions of nonuse, such as resting without motion for a predetermined time. In one sleep state, movement detected by a position sensor wakes the mouse, such as with a GPIO signal to the processing resource. As an alternative another sleep state is monitored by an accelerometer that wakes the processing resource when movement is detected. As yet another alternative, another sleep state puts all resources to sleep and wakes when a physical input is made by the end user, such as a button press or scroll wheel rotation. Each of these sleep states use some level of power, either due to power applied to the sensor that detects motion or some minor level of power consumed by the processing resource in a low power sleep state due to passive power dissipation. Motion power switch eliminates all power consumption in a sleep state and powers up mouse 34 when motion is detected to allow an end user to continue mouse use similar to the use case of a conventional sleep state. When the predetermined sleep conditions are detected, the processing resource commands the power supply to switch off, eliminating all power dissipation and preventing return to a power on state by a command of the processing resource. When motion is detected by motion power switch 202, power is applied to the processing resource so that the processing resource can determine whether to continue sleeping or return to the power on state.

FIG. 13A depicts a side perspective view of motion power switch 202 mounted on printed circuit board 200. A nonconductive holder 208, such as plastic material, couples to printed circuit board 200 and contains a conductive cap 204 that encloses a conductive ball bearing 206. FIG. 13B depicts a side cutaway view of motion power switch 202 having a central conductive cup 210 on which conductive ball bearing 206 rests. Conductive cap 204 has a conductive wireline or structure 212 that passes through printed circuit board 200 so that both conductive cup 210 and conductive cap 204 form an incomplete or open circuit that conductive ball bearing 206 can close when motion of mouse 34 works to press conductive ball bearing 206 against both conductive cup 210 and conductive cap 204. When the circuit of motion power switch 202 closes, power is applied to the processing resource so that the mouse is powered for use and the processing resource can monitor the use to determine if the power up or power down state is appropriate. In the example embodiment, the conductive cup, ball bearing and cap are a steel and/or copper material, although other materials may be used as appropriate. In the off state of the mouse, current is made available at conductive cup 210 to flow through conductive ball bearing 26 to conductive cap 204 when movement causes the conductive ball to contact both the conductive cup and the conductive cap; applying current at conductive cup 210 limits the risk of an inadvertent ground to the conductive cap causing a complete circuit, however, current may be applied in an opposite direction. Only a brief completion of the circuit is needed to switch power back on to the processing resource so that the processing resource can determine whether to continue applying power or switch back off.

Referring now to FIGS. 14, 14A, 14B, 14C, and 14D, a flow diagram and associated circuit diagrams depict operation of the motion power switch 202 illustrated in FIG. 13 above. Generally, a power connection to the mouse processing resource 232, labeled as an exemplary MCU in the figures, at mouse position tracking sensor 234 has two paths. One path is a normal operating path enabled by end user selection of power on with a power switch 238. The other path is through the motion power switch enabled when motion closes the circuit by touching the ball bearing against the conductive cap. When the mouse is stationary, control of the power connection switches to the motion power switch 242, which has an open circuit, while the rest of the mouse powers off to eliminate power consumption. When the mouse moves, the motion power switch closes the power circuit to power up the entire mouse, including the MCU processing resource, momentarily. Once awake, the MCU processing resource switches back to the normal operating path until another power down is appropriate due to lack of motion. Although not depicted in the example, logic of the processing resource monitors the motion power switch for a stuck on position, such as might happen at a tipped desktop surface, to apply conventional sleep logic where the motion power switch motion indication is not consistent with detected mouse use.

Figure 14:
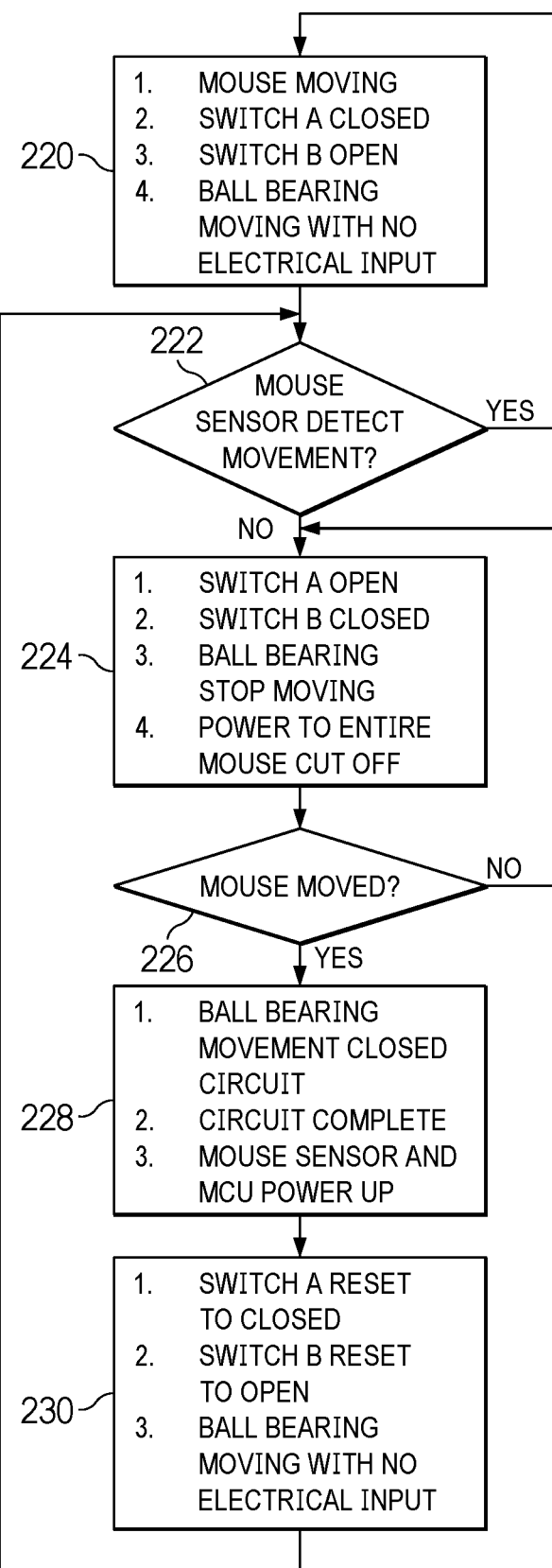
FIGS. 14, 14A, 14B, 14C, and 14D depict a flow diagram and associated circuit diagrams of operation of the motion power switch illustrated in FIG. 13 above.
Figure 14B:
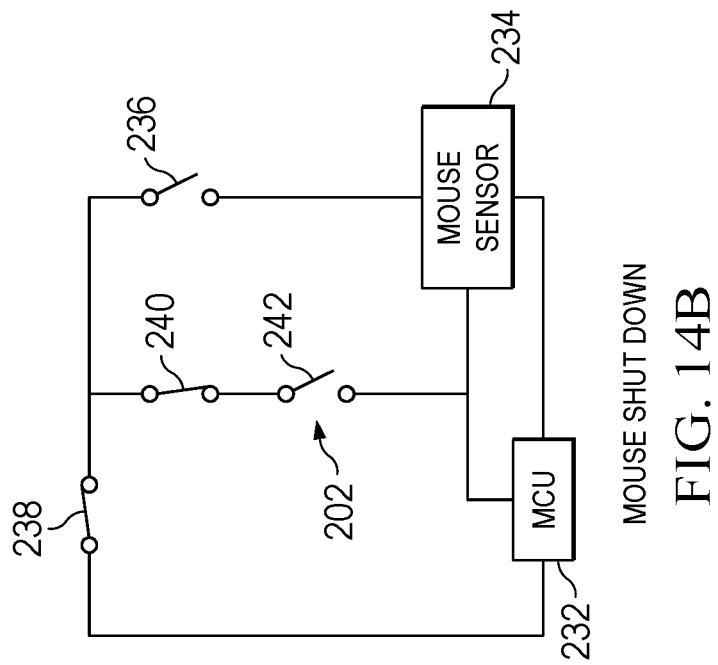
Figure 14A:
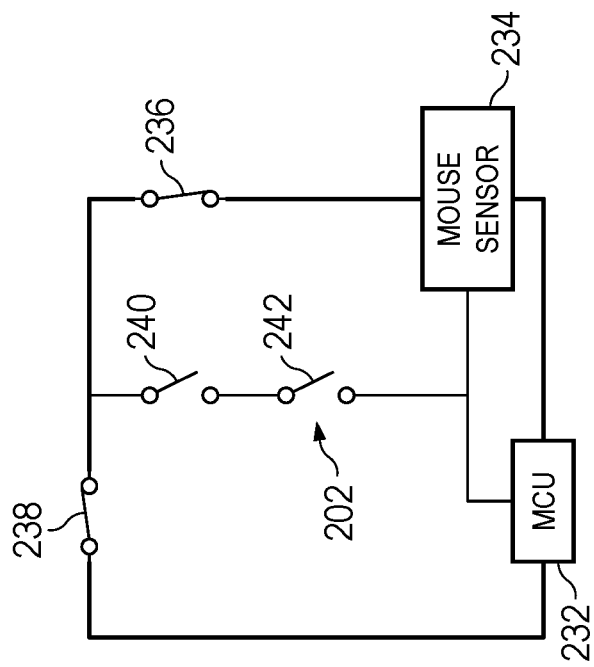
Figure 14D:
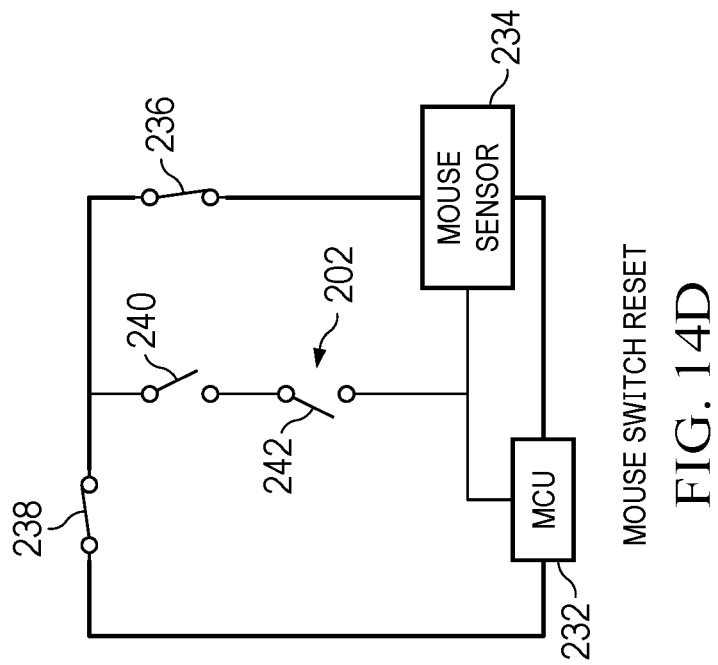

At step 220 of FIG. 14, the process detects movement of the mouse, such as with the position sensor, an accelerometer and the motion power switch. With reference to FIG. 14A, in response to detection of mouse movement, switch A labeled 236 closes to directly power the MCU processing resource 232 and position sensor 234. Switch B labeled 240 is commanded open to remove power detection signals of motion power switch 242, which may periodically close in response to movement but has no power applied. At step 222 a determination is made of whether movement is detected at the mouse, such as by monitoring positions reported by position sensor 234. If motion is detected, such as with logic of the MCU processing resource, the process returns to step 220 to continue normal use of the mouse in the power on state. If motion is not detected at step 222 for a predetermined time, the process continues to step 224 to enter a low power state. With reference to FIG. 14B, at step 224 switch A labeled 236 is commanded to an open position so that power is removed from the processing resource and position sensor and switch B labeled 240 is closed to enable monitoring by the motion power switch 202. With no motion applied to the mouse, the lack of power provided through motion power switch 202 powers down the entire mouse.

Figure 14C:
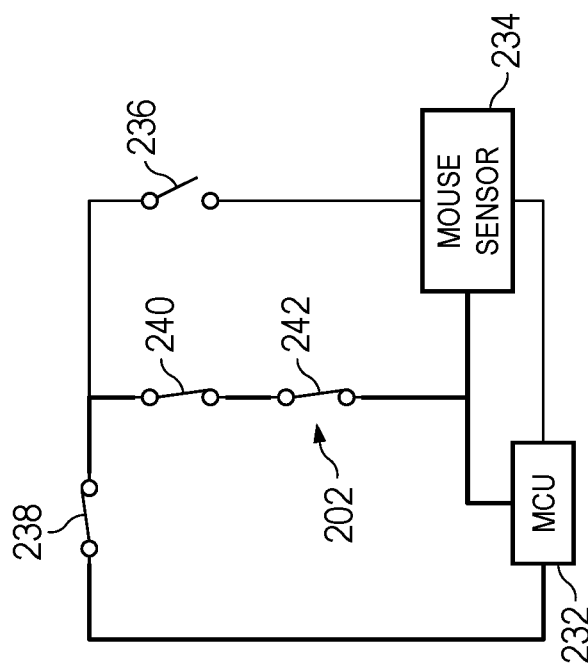

At step 226, the mouse is monitored in the power off state with the motion power switch so that no power is consumed until motion is detected. Once motion is detected, the process continues to step 228 to return operative control of the mouse to the MCU processing resource 232. With reference to FIG. 14C, the ball bearing movement within the motion power switch 242 closes the circuit to provide power to position sensor 234 and MCU processing resource 232. With completion of the power circuit, MCU processing resource 232 confirms movement of the mouse as detected by position sensor 234. At step 230 and with reference to FIG. 14D, switch A labeled 236 is closed to provide normal operating power conditions at the mouse so that MCU processing resource 232 can monitor use and control the power state. Switch B labeled 240 is opened to remove power control from motion power switch 242. Operational control of the mouse remains with MCU processing resource 232 and the process returns to step 222 to continue monitoring whether motion is detected at the mouse.

Figure 15:
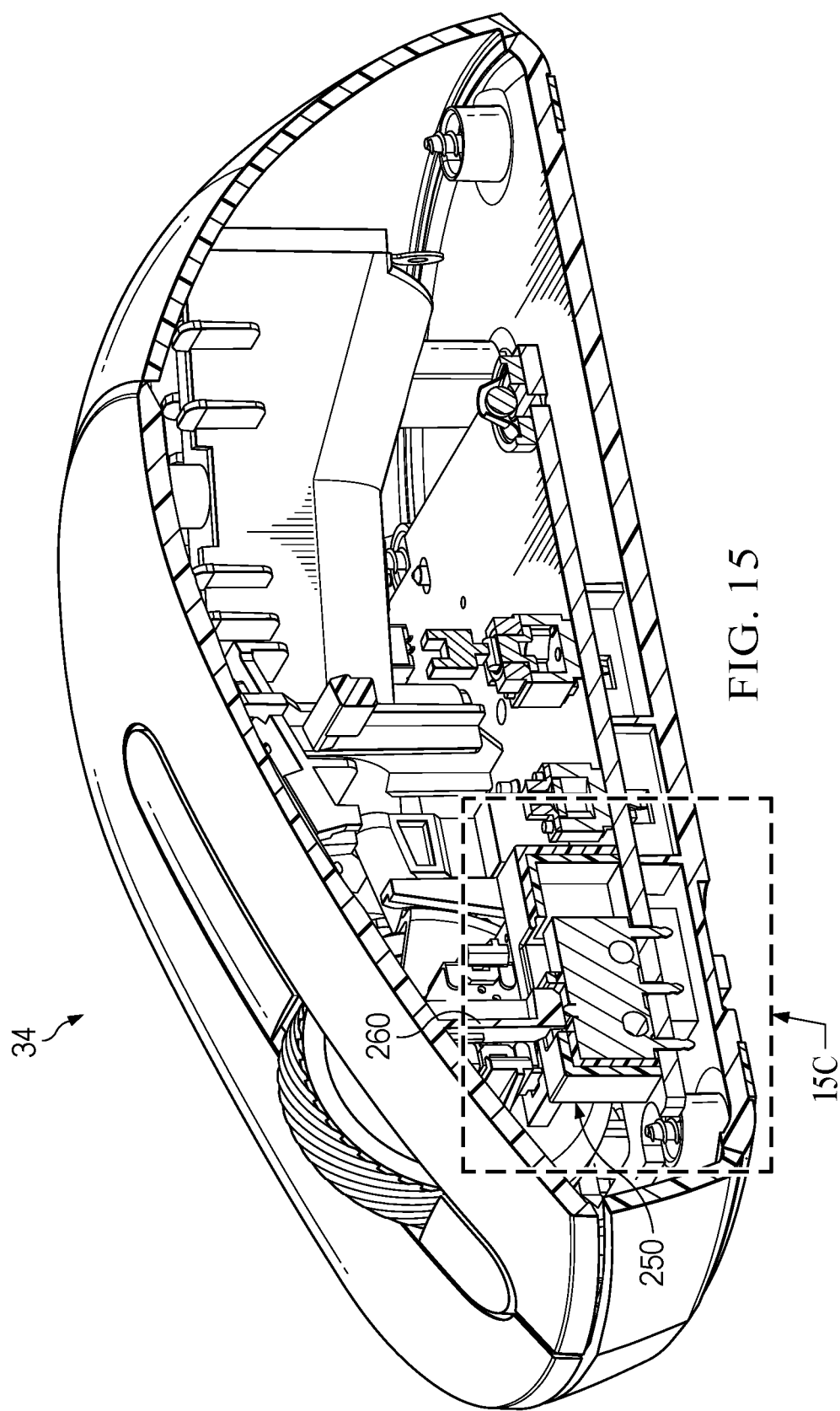
FIGS. 15, 15A, 15B, 15C and 15D depict an example of a system configured to manage mouse click sound volume when a mouse input button is pressed.

Referring now to FIGS. 15, 15A, 15B, 15C and 15D, an example is depicted of a system configured to manage mouse click sound volume when a mouse input button is pressed. FIG. 15 depicts mouse 34 with a transparent perspective view that illustrates an example of an acoustic isolation system 250 to manage the audible feedback of mouse input clicks translated from an upper surface input button through a member 262 to press an input switch within the mouse housing. Acoustic isolation system 250 has a stationary front half coupled to a sliding rear half that adjusts the space for sound to exit from the switch. An insulating layer couples to the inner wall of each half to absorb sound and block noise from propagating out the side of the material while an opening above the switch, when space is created by sliding the rear half from the front half, provides a sound chamber exit that can amplify and direct the sound out when desired. An end user selects the amount of audible feedback with an external selector that moves the rear half of the system to close or open the space above the switch.

Figure 15A:
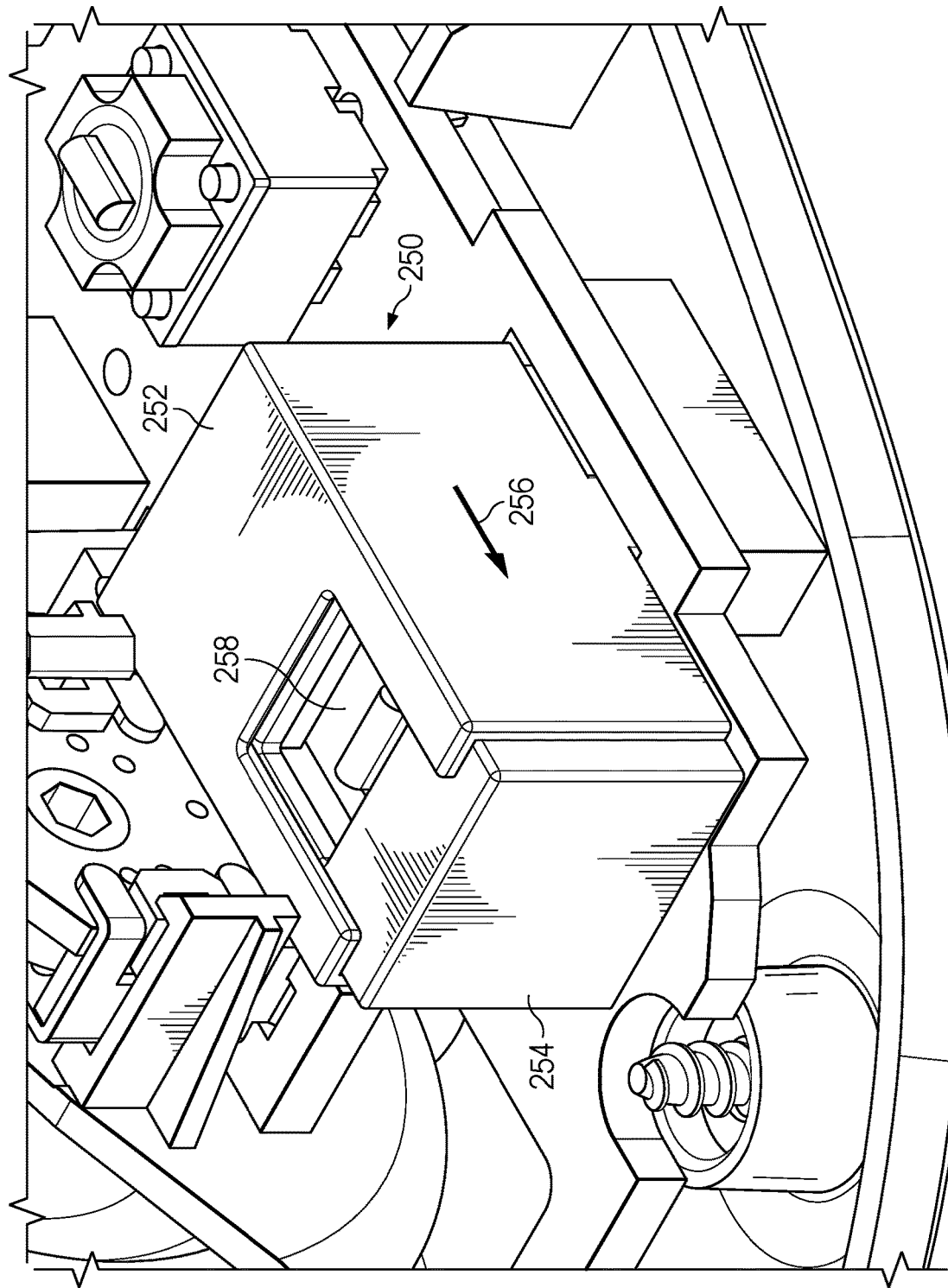
Figure 15B:
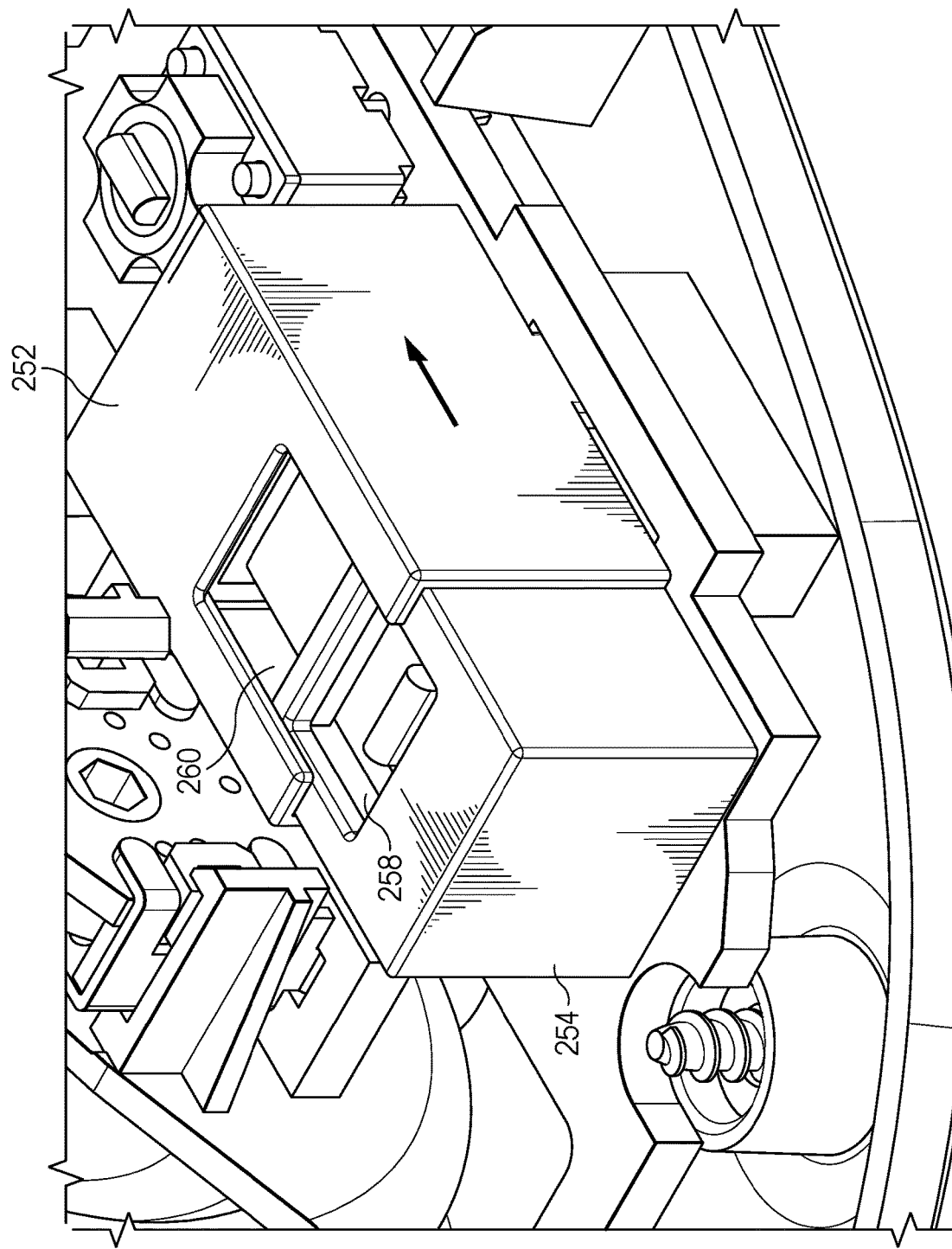
Figure 15C:
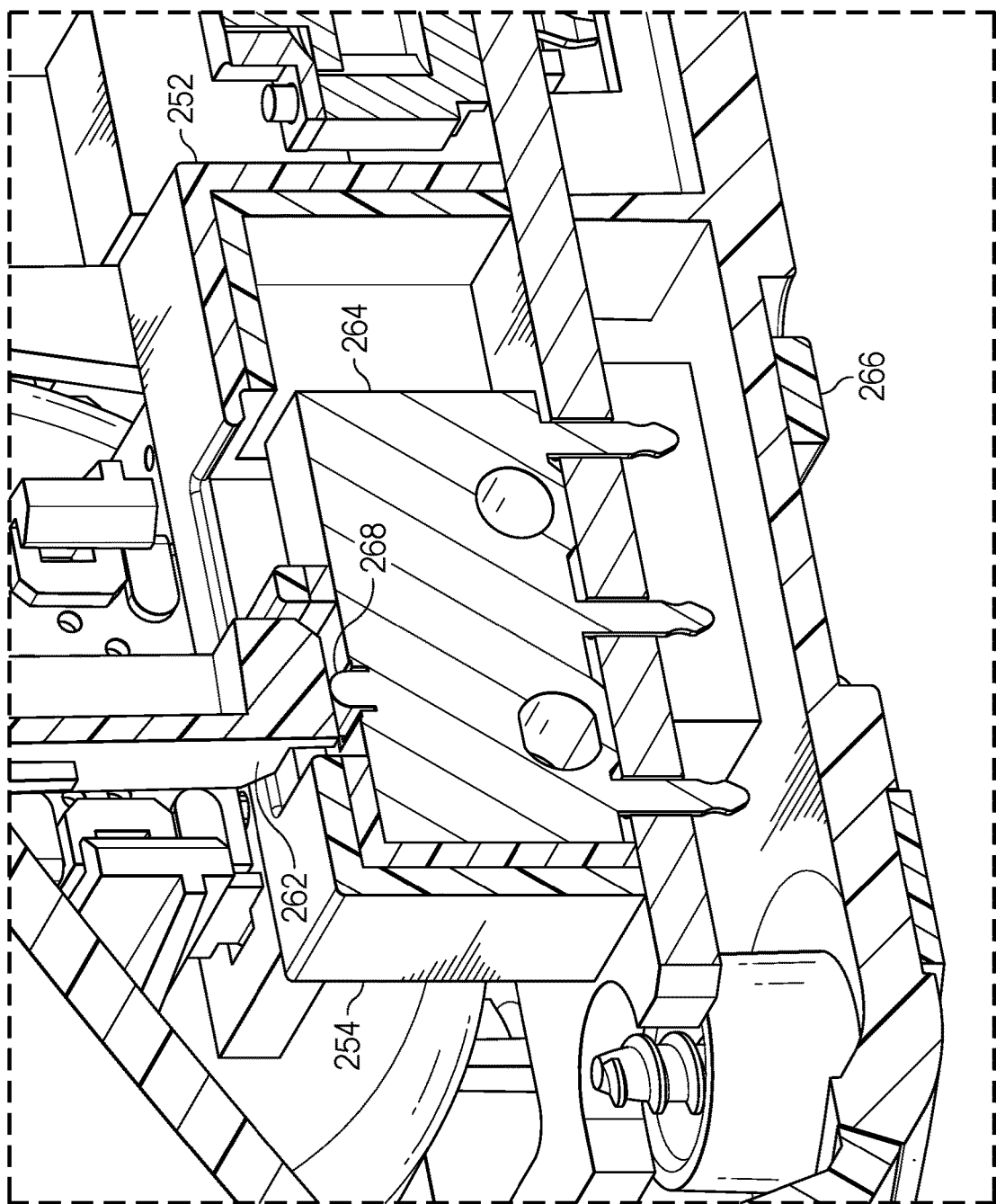
Figure 15D:
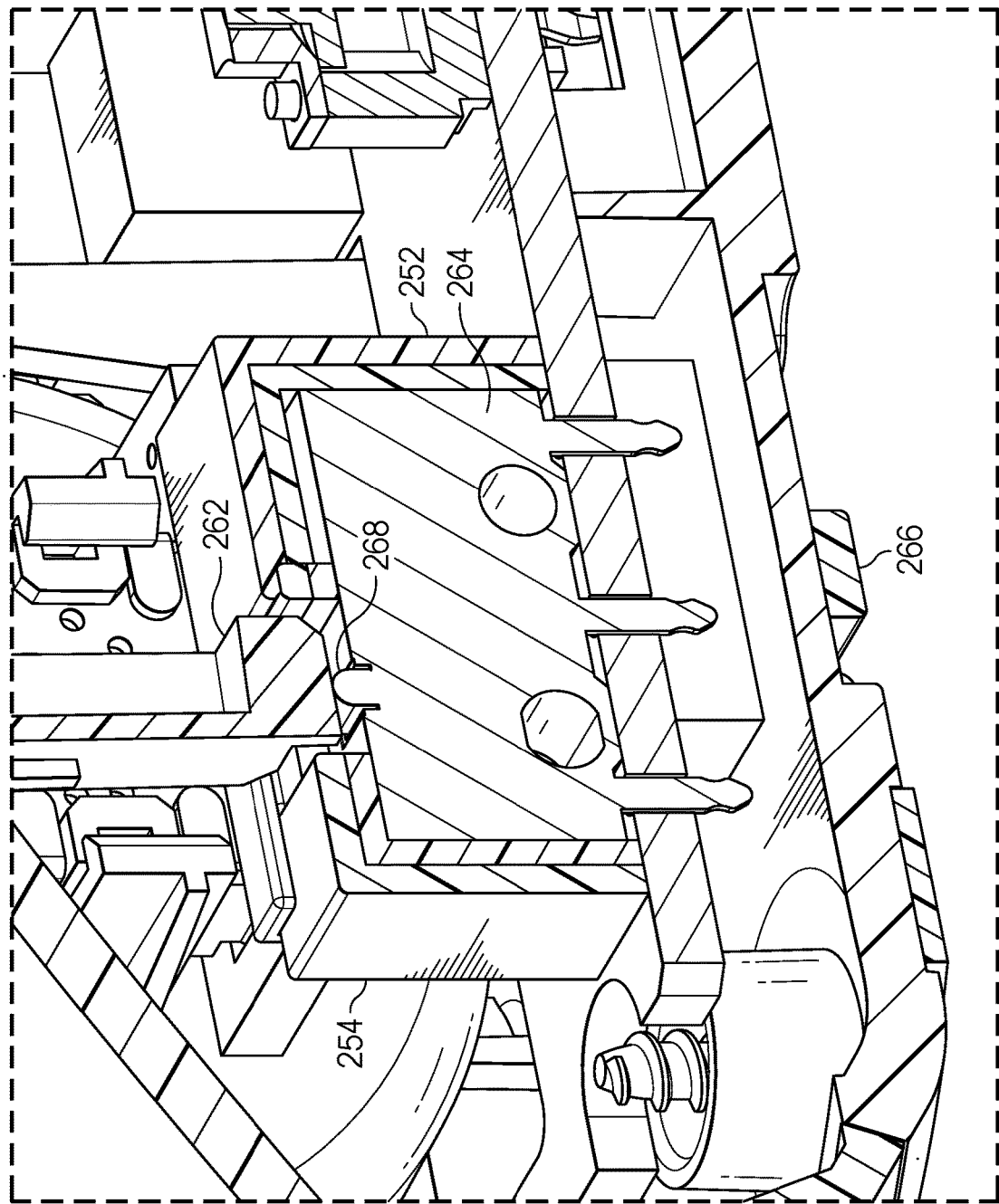

FIG. 15A depicts a detailed perspective view of acoustic isolation system 250 having a rear half 252 slid to a forward position as indicated by arrow 256 relative to a front half 254, which has a fixed position relative to a switch 264 held within the enclosed space. With the rear half 252 slid full forward, a small opening 258 is provided through which member 262 extends down into the interior to engage with switch 264. The opening 258 may have insulation and a rubber or other seal that aids in attenuation of sound created by switch actuation from leaving the acoustically isolated area. FIG. 15B depicts a detailed perspective view of acoustic isolation system 250 having a rear half slid rearward to provide an opening 260 above a contained area within rear half 252 that amplifies the sound generated by switch actuation in an echo chamber and directs the sound out from the mouse. FIG. 15C depicts a side cutaway view of acoustic isolation system 250 in an open position so that switch sounds are directed out from the mouse. Member 262 enters through the front opening to engage against an input plunger 268 of switch 264 so that presses of an upper button surface on the mouse chassis translates to a mouse button "click" input. The area behind switch 264 echoes the click sound and, with the rear half slid rearward to open the area behind the switch, directs the sound up and out from the mouse. An externally exposed sliding handle 266 couples to the rear side of acoustic isolation system 250 so that an end user can select a quiet operating mode or an audio feedback operating mode. FIG. 15D depicts sliding handle 266 slid to a forward position so that the rear side 252 slides forward to close the rear opening and locate proximate member 262 to leave minimal space for escape of audible sounds.

Figure 16:
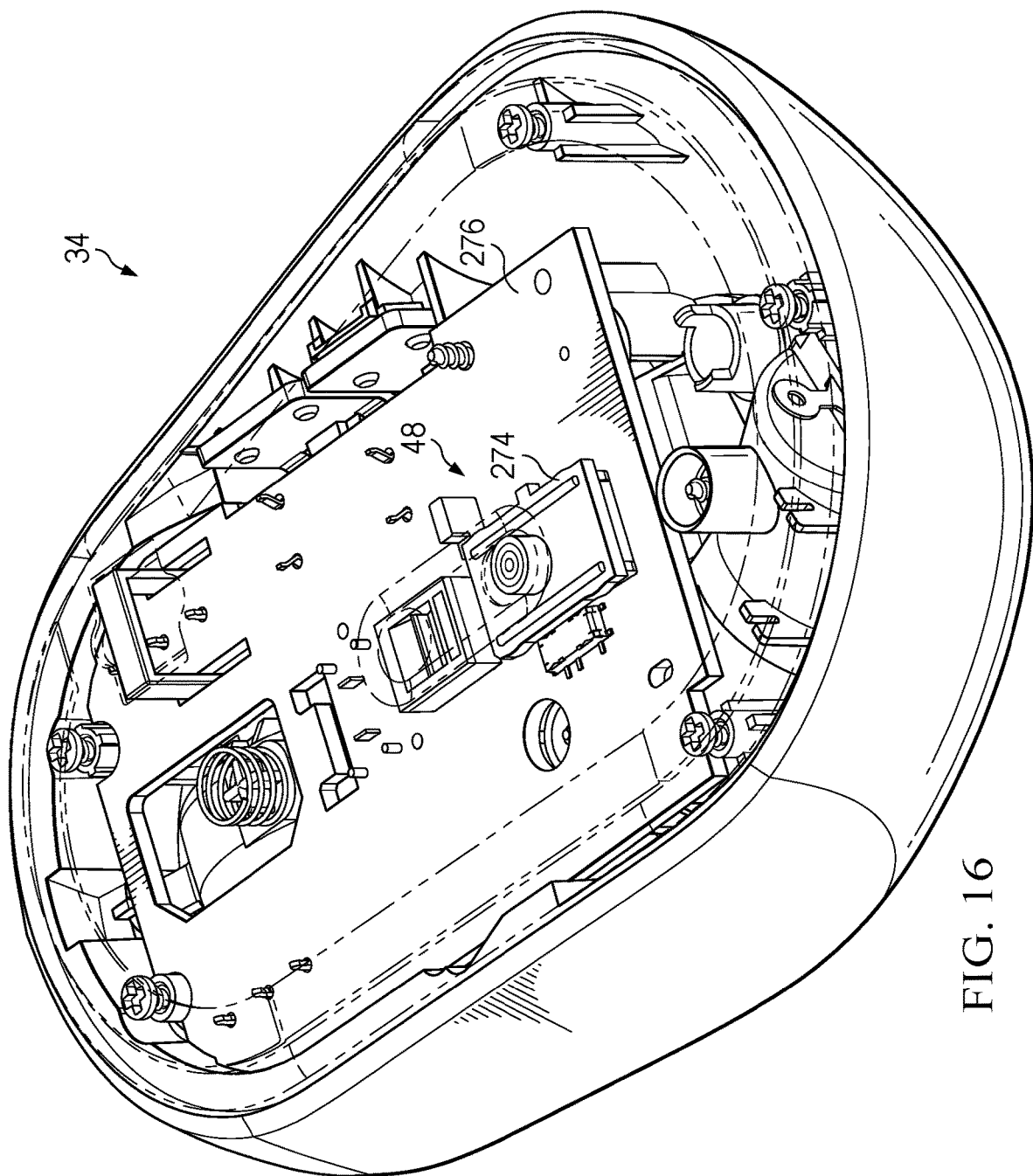
Figure 16A:
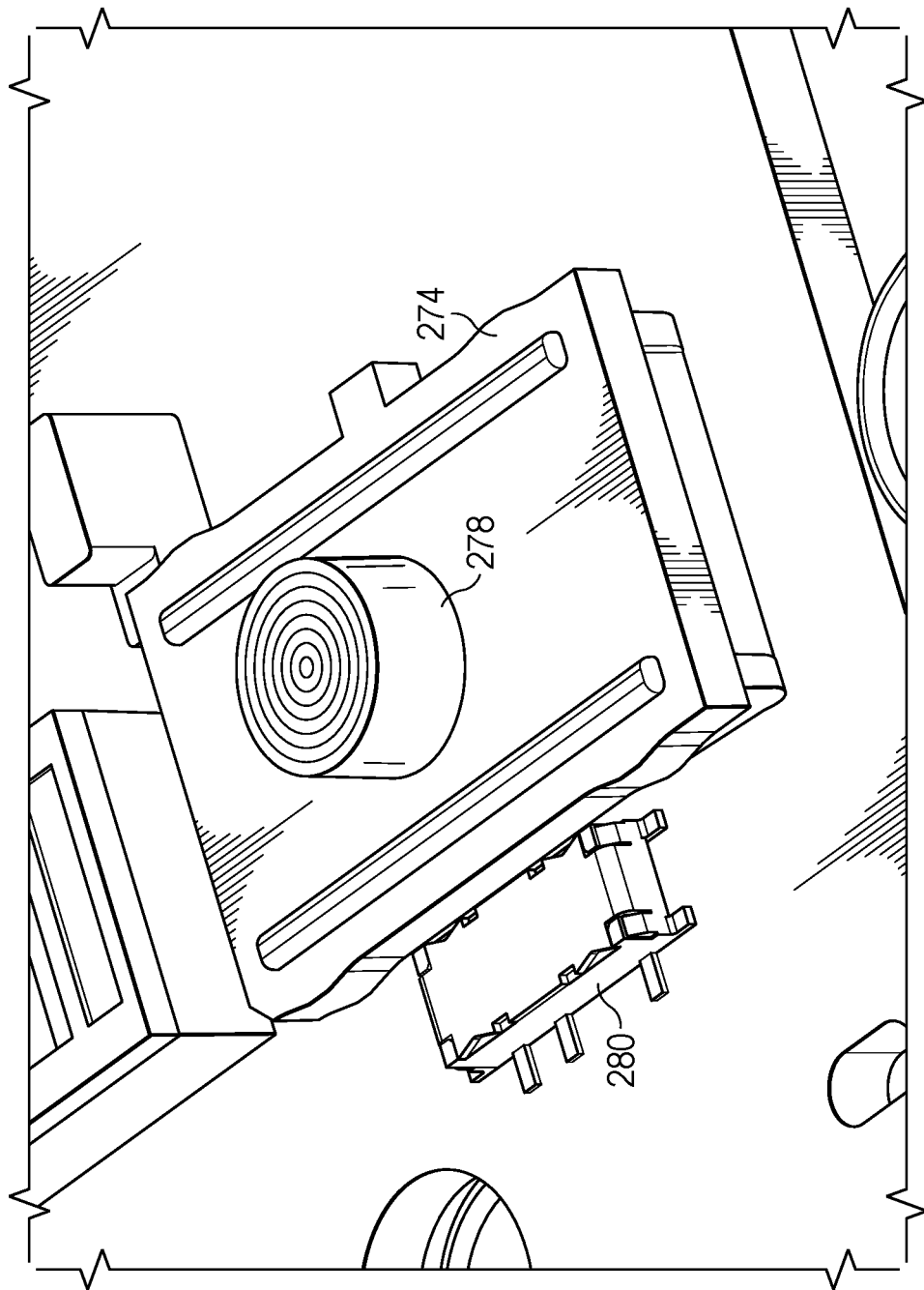
Figure 16B:
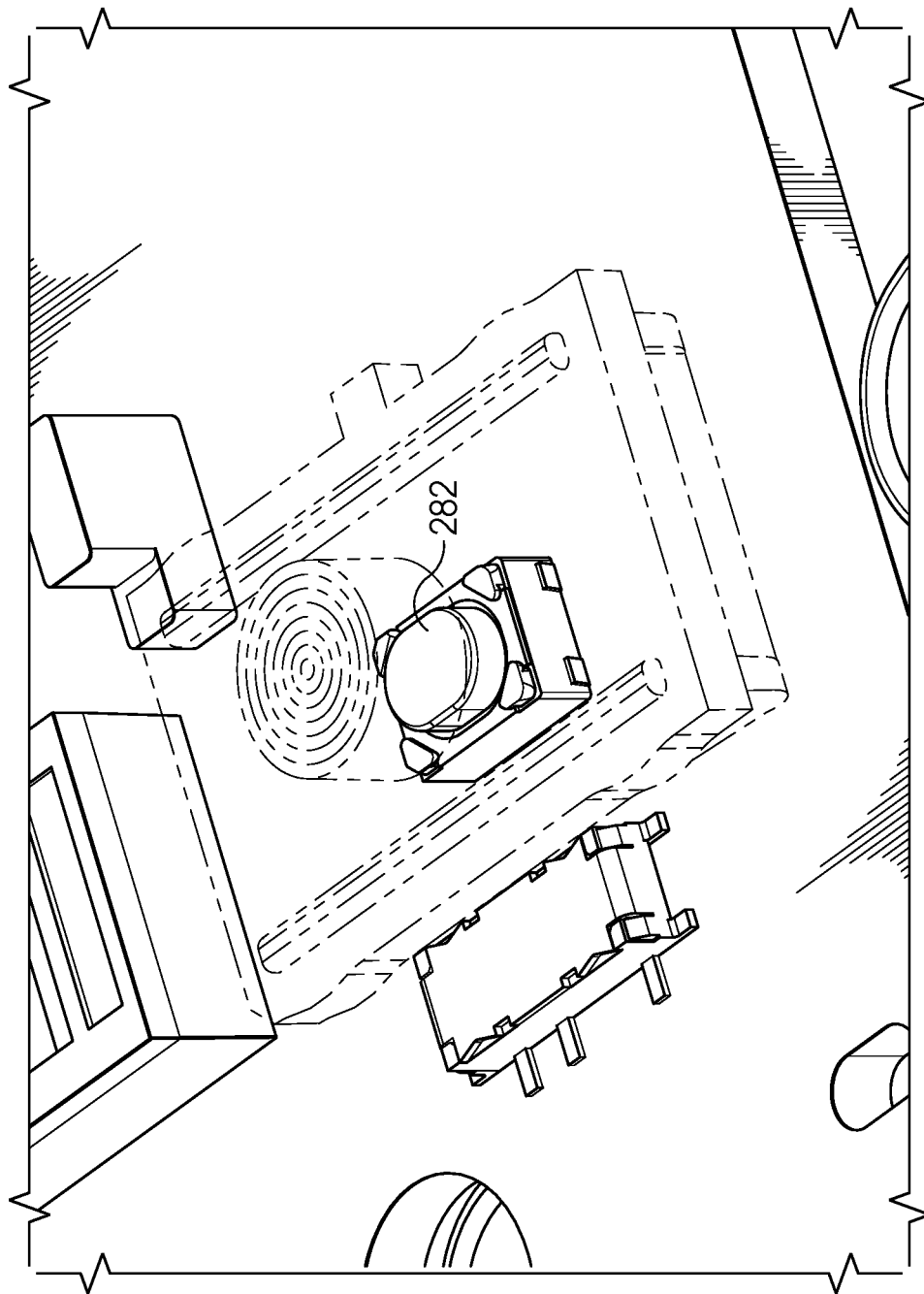

Referring now to FIGS. 16, 16A, 16B, 16C, 16D, 16E, 16F, 16G and 16H, a mouse sliding button with orthogonal activation is depicted. FIG. 16 depicts a bottom perspective view of mouse 34 with a transparent view of bottom surface 48 showing the interaction of a dual-action power button 274 with a printed circuit board 276. The dual-action power button 274 slides within a cavity of bottom surface 48 between an off position and an on position to turn power on and off at mouse 34. In addition, once dual action power button 274 slides to an on position, a press input becomes available as an additional input that can activate functions at mouse 34, such as wireless advertising or changes to mouse position sensor sensitivity. FIG. 16A depicts a detailed perspective view of the sliding power button 278 that translates sliding movement as an input to a sliding switch 280. FIG. 16B depicts a transparent detailed perspective view of sliding power button 278 to illustrate the location of a tactile switch 282 under sliding power button 278 that is accessible through vertical movement of sliding power button 278 once it has slid to the on position. While mouse 34 remains on with the sliding power switch in the on position, a press inward at the sliding power button provides an input at tactile switch 282. Once the sliding power switch slides to off, the tactile switch 282 is prevented from actuation. The combined placement of both switches in one location saves space at the bottom surface 48 for more efficient interactions. Although the example embodiment uses a tactile switch for actuation after sliding the power switch on, alternative embodiments may use alternative switch interfaces that activate based upon a sliding power switch slid to an on position. As an example, sliding the power switch on may expose a capacitive sensor to detect a secondary input that is confirmed with haptic feedback. Other types of buttons may be used.

Figure 16C:
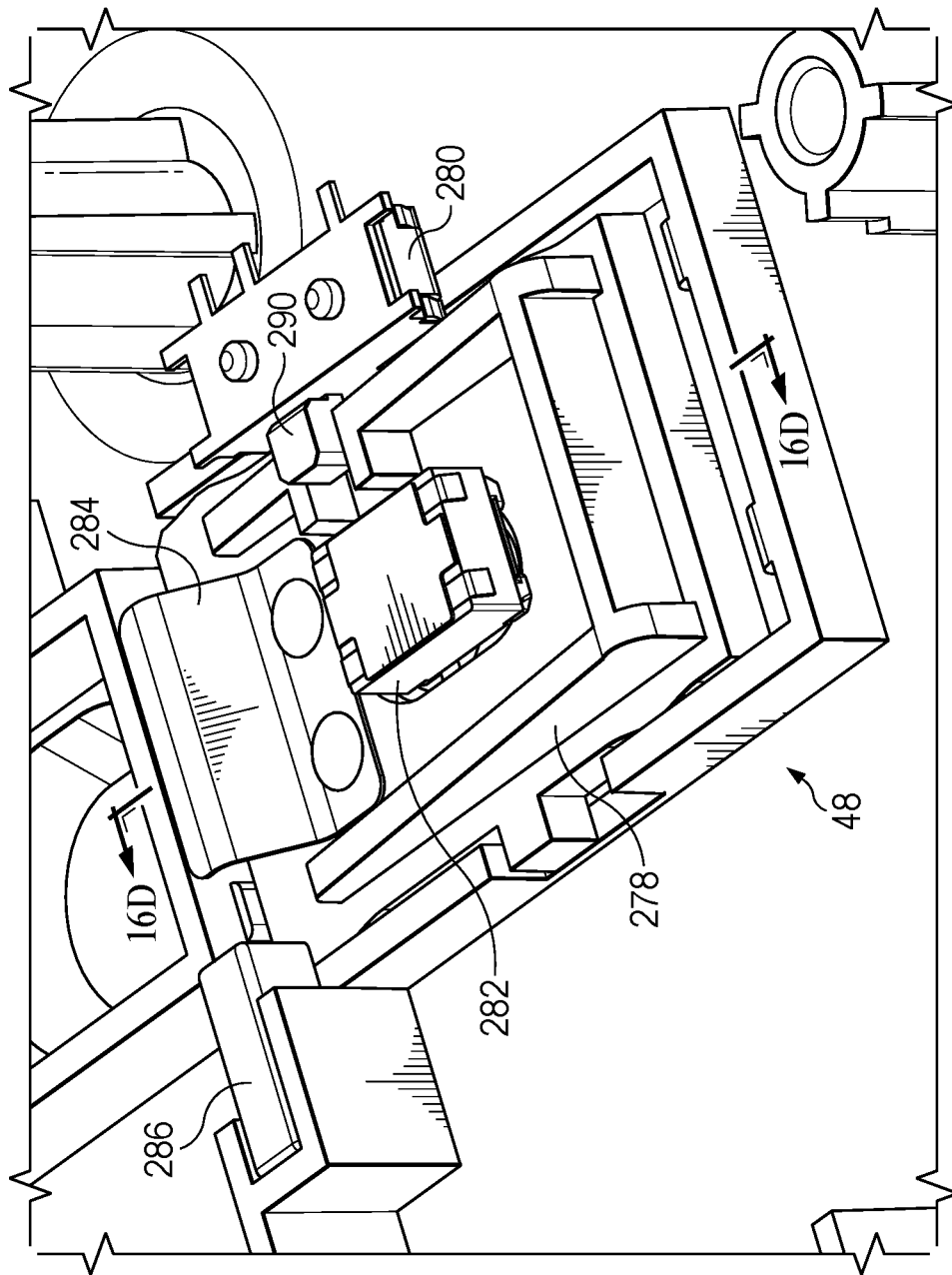
Figure 16D:
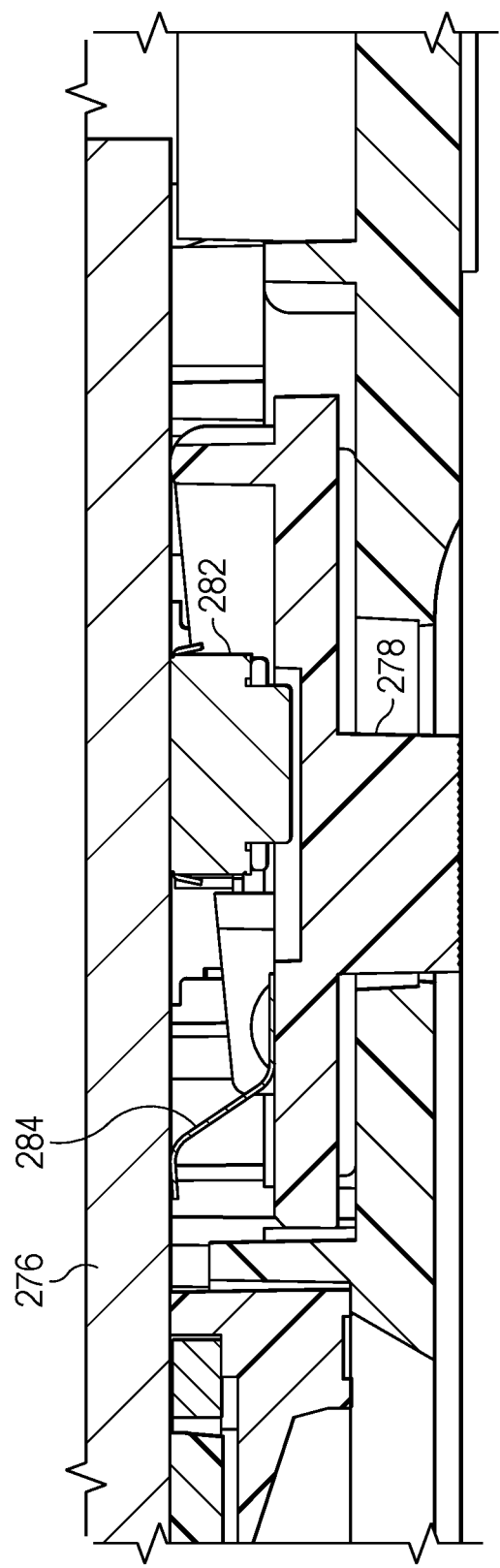

FIG. 16C depicts a bottom view of the dual position power button in an off position and having a cross-sectional view indicated as shown by FIG. 16D. In the off position, sliding power button 278 is captured under a button holder 286 lip to prevent an inward motion of sliding power button 278 while allowing a sliding movement. Sliding switch 280 interfaces at an actuator 290 with sliding power button 278 so that sliding movement provides an input to power up and power down the mouse at power switch 280. Tactile switch 282 couples to a printed circuit board 276 within a cavity formed by sliding power button 278, as is illustrated by the cross-sectional view of FIG. 16D. A spring plate 284 is configured to bias downward against sliding power button 278 to prevent an inadvertent input to tactile switch 282, although in the off position shown by FIGS. 16C and 16D, the lip of button holder 286 prevents an inward vertical movement of sliding power switch 278 that would actuate tactile switch 282.

Figure 16E:
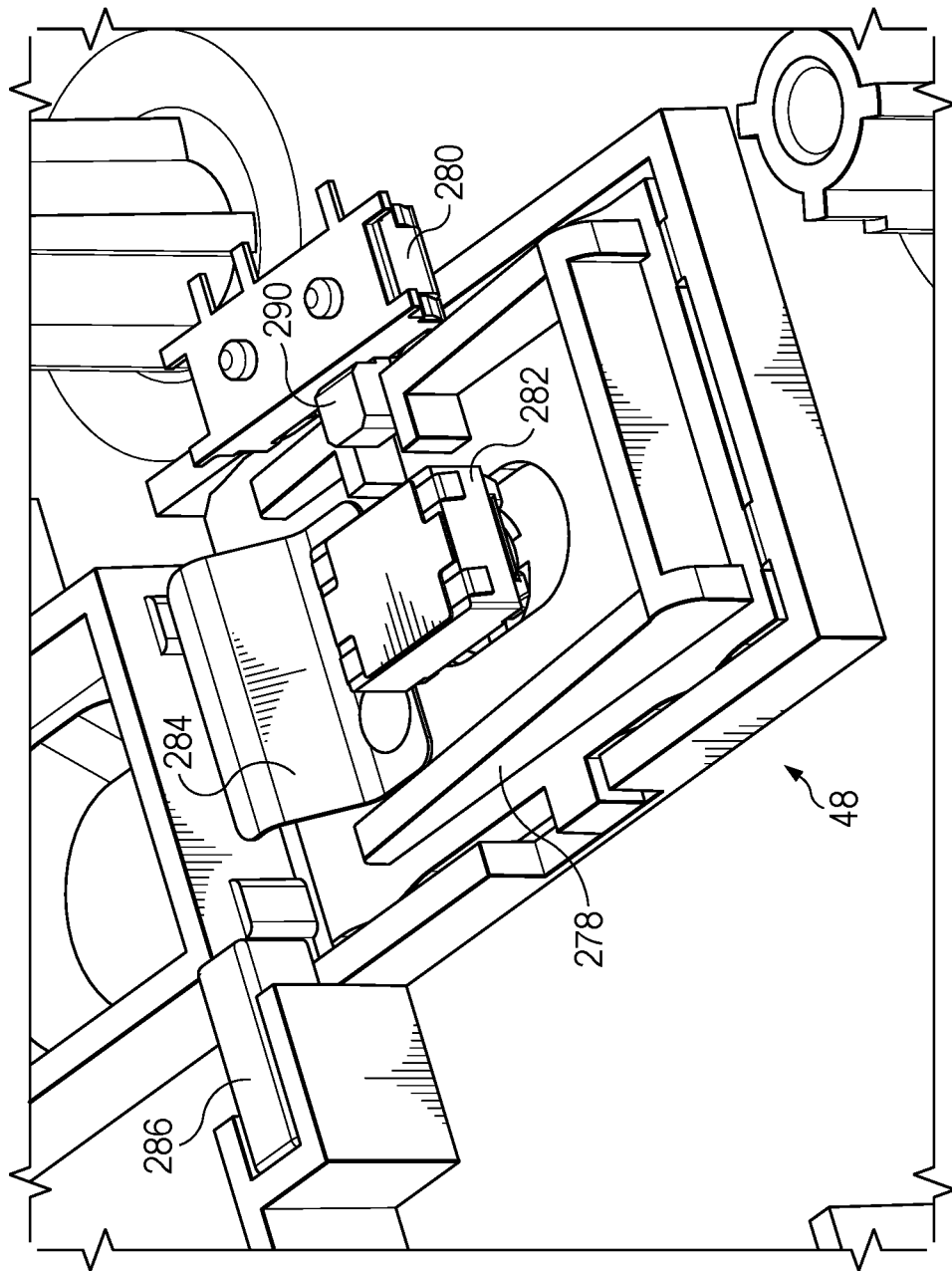
Figure 16G:
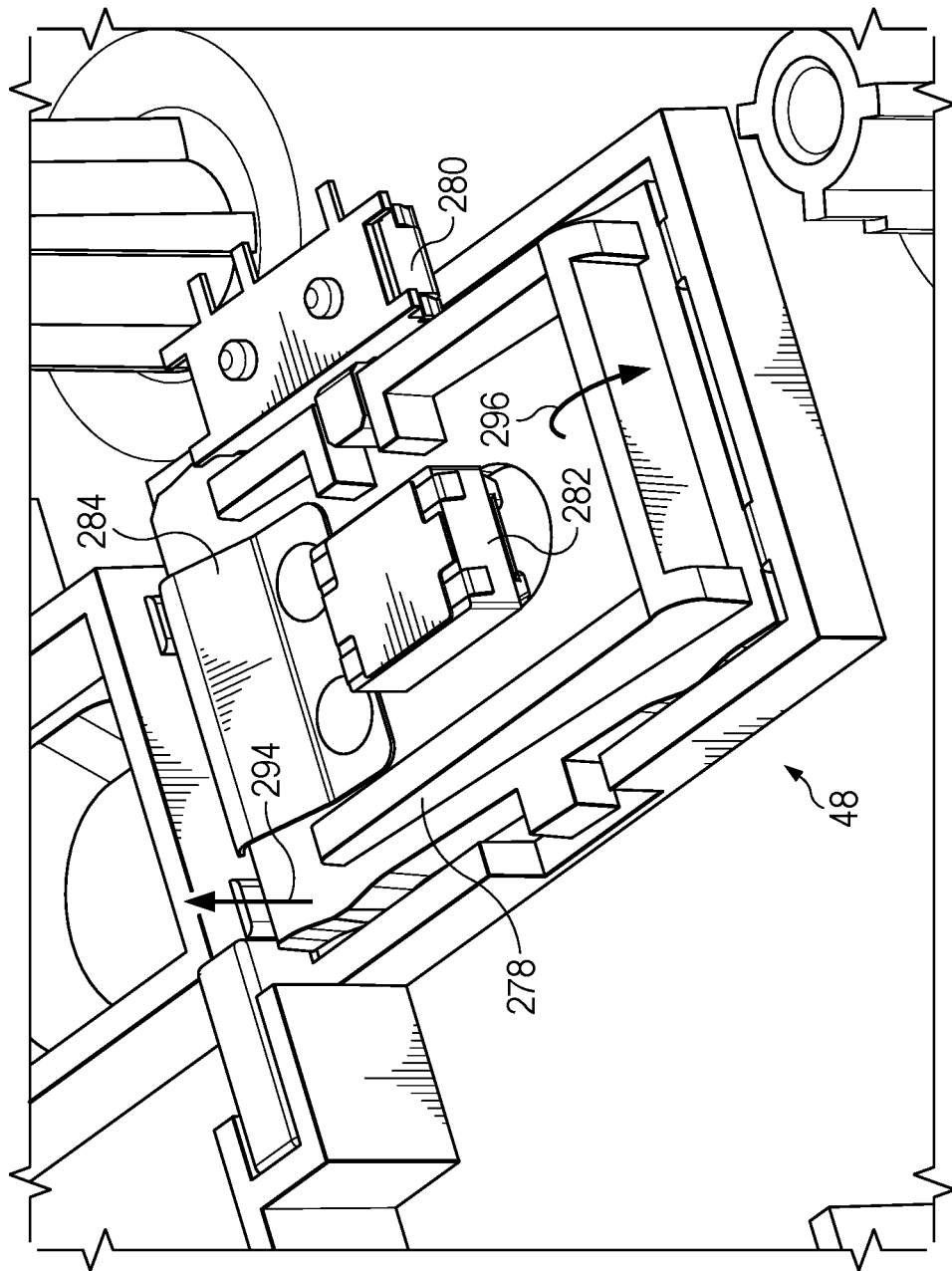
Figure 16H:
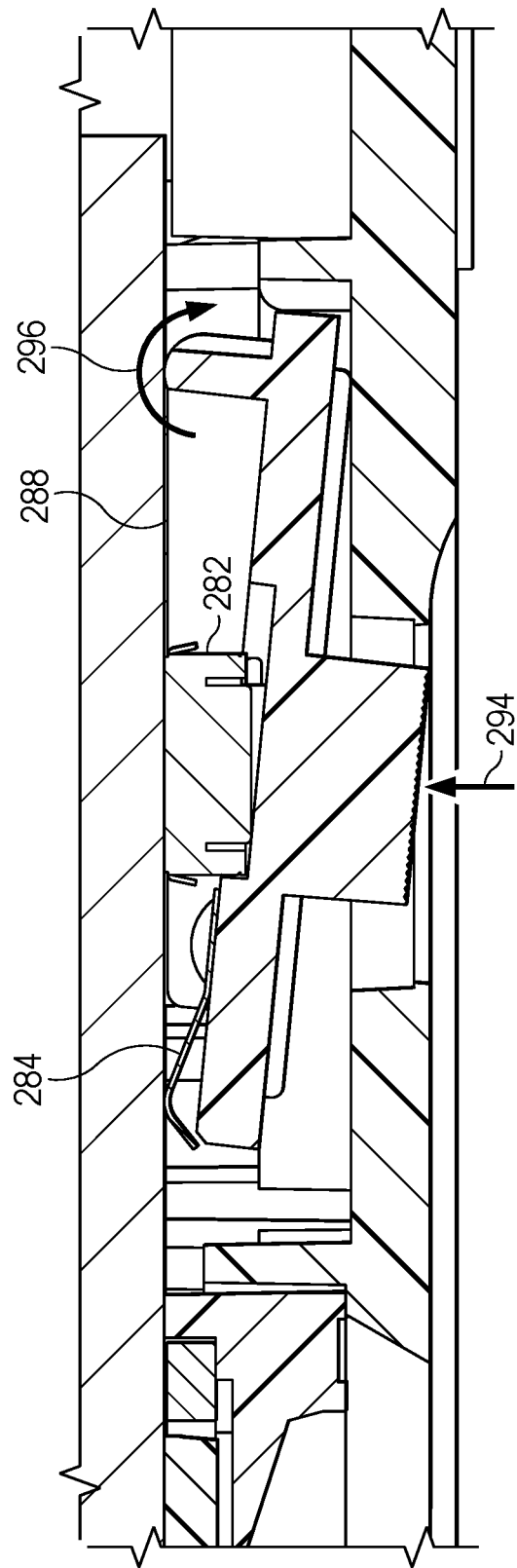

FIG. 16E depicts a bottom view of the dual position power button in an on position and having no actuation of tactile switch 282, and a cross-sectional view indicated by FIG. 16F. To slide to the on position, sliding power button 278 moves as indicated by arrow 292 within a cavity of bottom surface 48. In the on position, the rear edge of sliding power button 278 is released from under button holder 286 lip, yet biased downward by spring 284 so that tactile switch 282 is not actuated. Sliding motion of sliding power switch 278 moves power switch 280 actuator 290 to the on position and aligns a ramp 288 formed in sliding power switch 278 with an open area above so that sliding power switch 278 is free to move inward if pressed upward by an end user from the mouse bottom surface. FIG. 16G depicts a bottom view of the dual position power button in an on position and having a press inward to actuate tactile switch 282. The upward press causes a lift up of sliding power button 278 at the rear side as indicated by arrow 294 so that a rotational movement as indicated by arrow 296 results in orthogonal triggering of tactile switch 282. Cross-sectional view depicted by FIG. 16H depicts an upward and inward push of sliding power button 278 as indicated by arrow 294 to overcome the downward bias of spring 284 so that tactile switch 282 is actuated. A range of pivot rotation as indicated by arrow 296 is set based upon engagement of ramp 288 against the printed circuit board 276 bottom surface. Spring 284 returns sliding power button 278 to a neutral position shown in FIG. 16F when the input in released by the end user.

Figure 17:
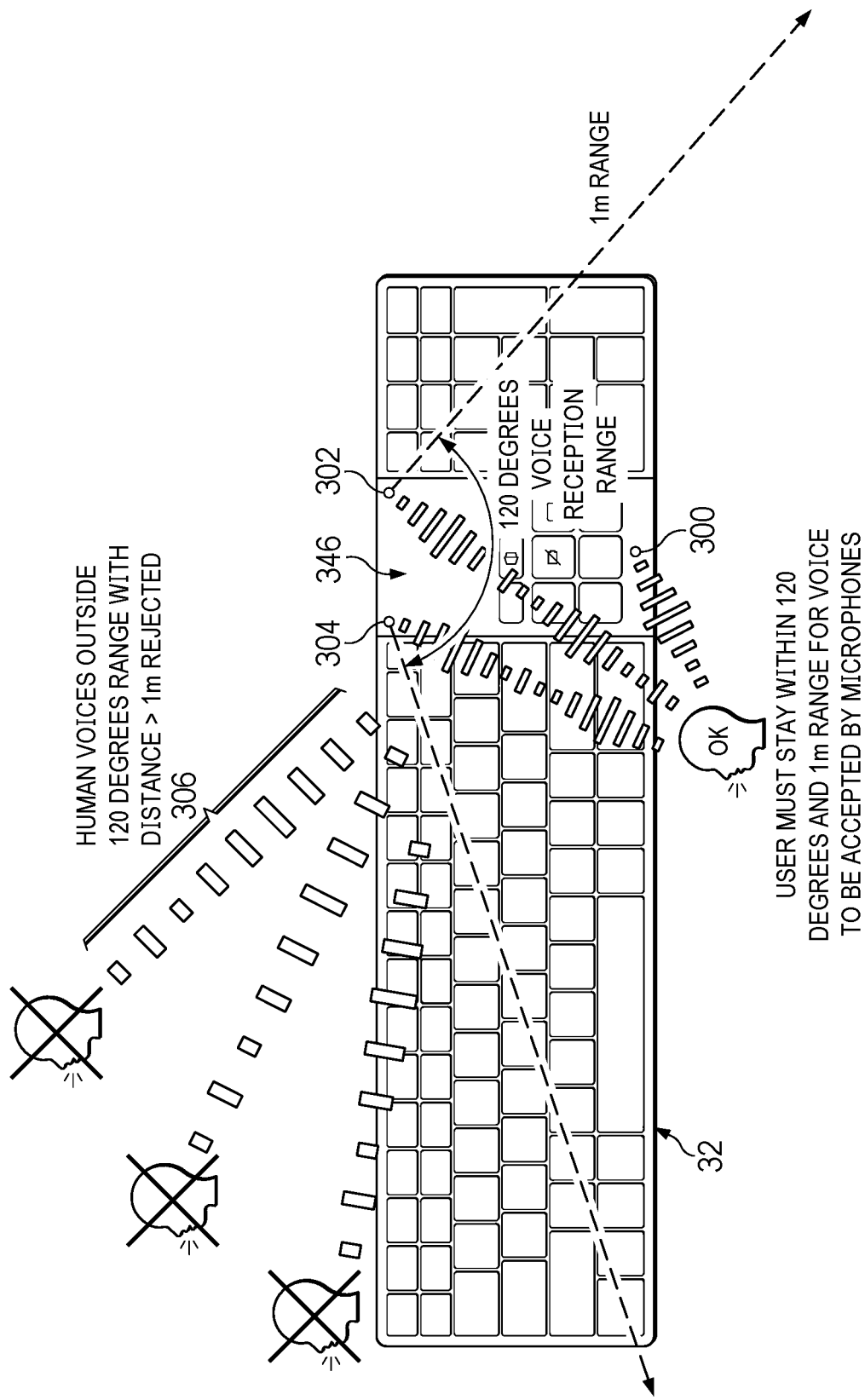
FIG. 17 depicts an upper perspective view of a keyboard as an example of plural directional microphones that cooperate to improve an end user audio capture experience.

Referring now to FIG. 17, an upper perspective view of a keyboard depicts an example of plural directional microphones that cooperate to improve an end user audio capture experience. In the example embodiment, keyboard 32 has three microphones 300, 302 and 304, configured to capture end user speech along a defined reception range and field of view while dropping sounds that originate outside the defined reception range and field of view. As an example, microphones 300, 302 and 304 cooperate through a processing resource to limit captured sounds to those within 120 degrees of the front side of keyboard 32 and having a range of one meter or less. Sounds of people talking off of the defined field of view, such as the sounds indicated by lines 306, or outside of the defined one meter range, are dropped so that an end user engaged in a videoconference will have only desired audio communicated over the videoconference. A display 346 coupled in keyboard 32 provides a visual indication to an end user of the captured audio, as described below, and allows the end user to adjust the microphone array audio capture, such as by changing the defined range and field of view in which audio is captured. For example, display 346 includes a touchscreen to directly launch a microphone array application, track microphone array performance and adjust audio capture definitions.

In the example embodiment, microphones 300, 302 and 304 are placed in an inverted triangle configuration around the periphery of display 346 at least 50 mm horizontally or diagonally spaced. A processing resource, such as a digital signal processor (DSP), interfaces with the microphones to monitor captured sounds at each microphone using triangulation to identify sounds that originate in the defined range and field of view. When an end user speaks in front of keyboard 32, each microphone captures the audio of the end user voice with a difference in time of capture for each microphone based upon the location of the end user to each microphone. As an example, the DSP bases the difference in range of each microphone to the source of the speech based upon an analysis of the wave phases detected for each microphone, such as with an artificial intelligence algorithm. The distance for each microphone provides triangulation to the source of captured audio for comparison with the defined capture distance and field of view. In one embodiment, a second DSP receives the captured audio identified as being in range and field of view or out of range and field of view, and then filters the desired audio to remove audio associated with capture outside of the defined range and field of view. The filter may include separate filter steps to remove out-of-range human voice and to remove non-human sounds completely.

Figure 18:
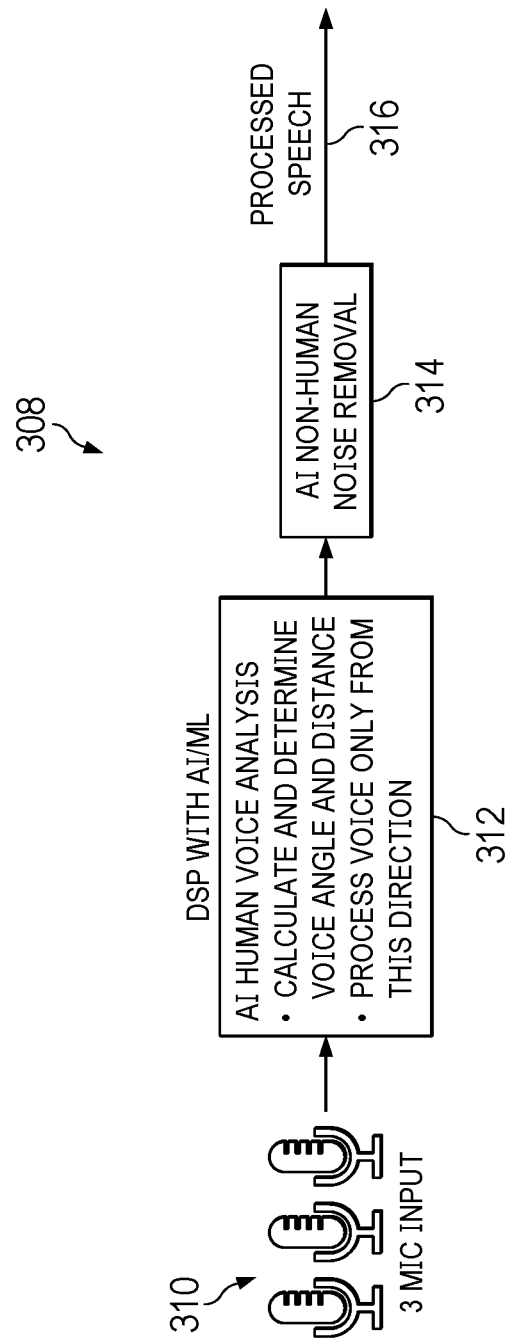
FIG. 18 depicts a block diagram of digital signal processing that provides filtered human voice captured in a defined range and field of view of a keyboard having an array of microphones.

Referring now to FIG. 18, a block diagram depicts digital signal processing that provides filtered human voice captured in a defined range and field of view of a keyboard having an array of microphones. In the example embodiment, a microphone array 310, such as the three microphone array shown in FIG. 17, detects audible sounds and provides the audible sounds to a first processing resource 312 within an audio processing system 308. For example, processing resource 312 is a first digital signal processor (DSP) having artificial intelligence human voice analysis that calculates and determines voice angle and distances for detected voice sounds and processes only voices from a defined range and field of view relative to microphone array 310. As described above, the identification of voice range and vector is based upon triangulation from differences in time of reception of the voice sounds at each microphone. The filtering of voices outside of the defined range and field of view is applied based upon the comparison of received voices at each microphone of microphone array 310. Once the voice logic of processing resource 312 is complete, the voice sounds isolated in the desired distance and range are provided to a second processing resource 314, such a second DSP, to remove nonhuman sounds. The processed speech is then communicated from the audio system, such as by wireless personal area network signals 316, i.e., with a BLUETOOTH interface of keyboard 32 to an information handling system managing a videoconference. Although multiple DSP's are described in the above example embodiment, the voice location, selection and filtering may be performed by a single DSP.

Figure 19:
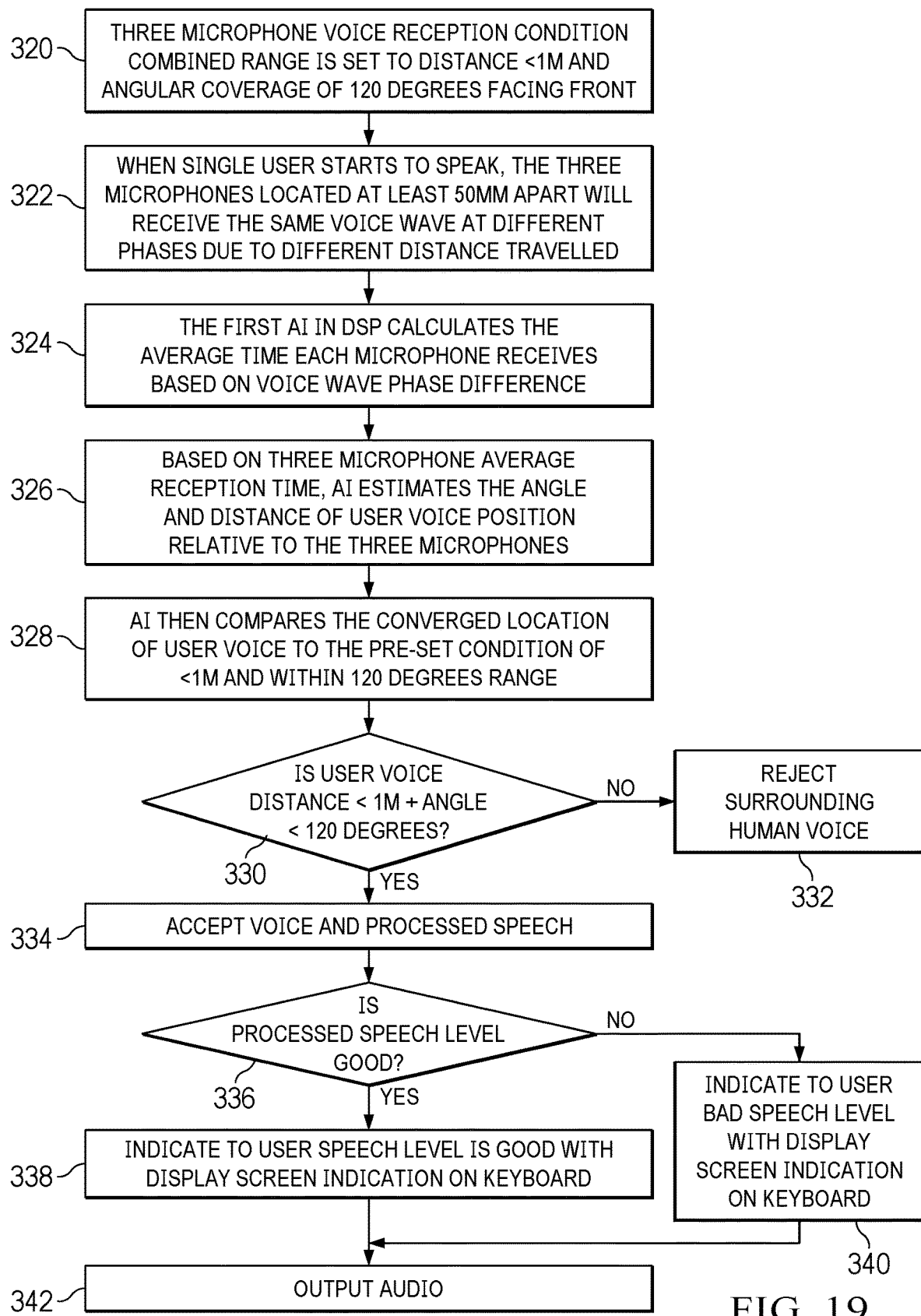
FIG. 19 depicts a flow diagram of a process for managing voice sounds captured at a keyboard microphone array for use in an audio or video conference supported by an information handling system.

Referring now to FIG. 19, a flow diagram depicts a process for managing voice sounds captured at a keyboard microphone array for use in an audio or video conference supported by an information handling system. The process starts at step 320 with reception by an array of three or more microphones of voice sounds conditioned on detection within a range of one meter or less and an angular field of view coverage of within 120 degrees of the front face of a keyboard. At step 322, as a single speaker voice is detected, the three microphones of the array detect the voice with a different phase to determine a distance of the voice sound travel to each microphone, such as based upon a defined angular and distance separation between the microphones. At step 324, a first artificial intelligence logic executing on a first DSP processing resource calculates the average time each microphone receives the sound based upon voice wave phase differences. At step 326, based upon the three microphone average reception times, the artificial intelligence logic estimates the angle and distance of the speaker position relative to the microphone array. At step 328, the artificial intelligence logic compares the converged location of the speaker voice to the predefined range of non-filtered voice, such as a range of less than one meter and within 120 degrees of the front of the keyboard. At step 330 a determination is made of whether an identified speaker voice falls within the defined range, such as one meter and 120 degrees of the front of the keyboard. If the voice is outside of the defined range, the process continues to step 332 to reject the voice. If at step 330 the voice is within the defined range and field of view, the process continues to step 334 to accept the voice and process the speech. At step 336 a determination is made of whether the accepted speech has sufficient quality. If not, the process continues to step 340 to provide a visual indication to the end user of poor speech quality so that the end user can take appropriate steps to improve the quality. If at step 336 the quality is sufficient, the process continues to step 338 to indicate at the display a good speech level and to step 342 to output the audio to an information handling system, such as through a BLUETOOTH interface of the keyboard.

Figure 20:
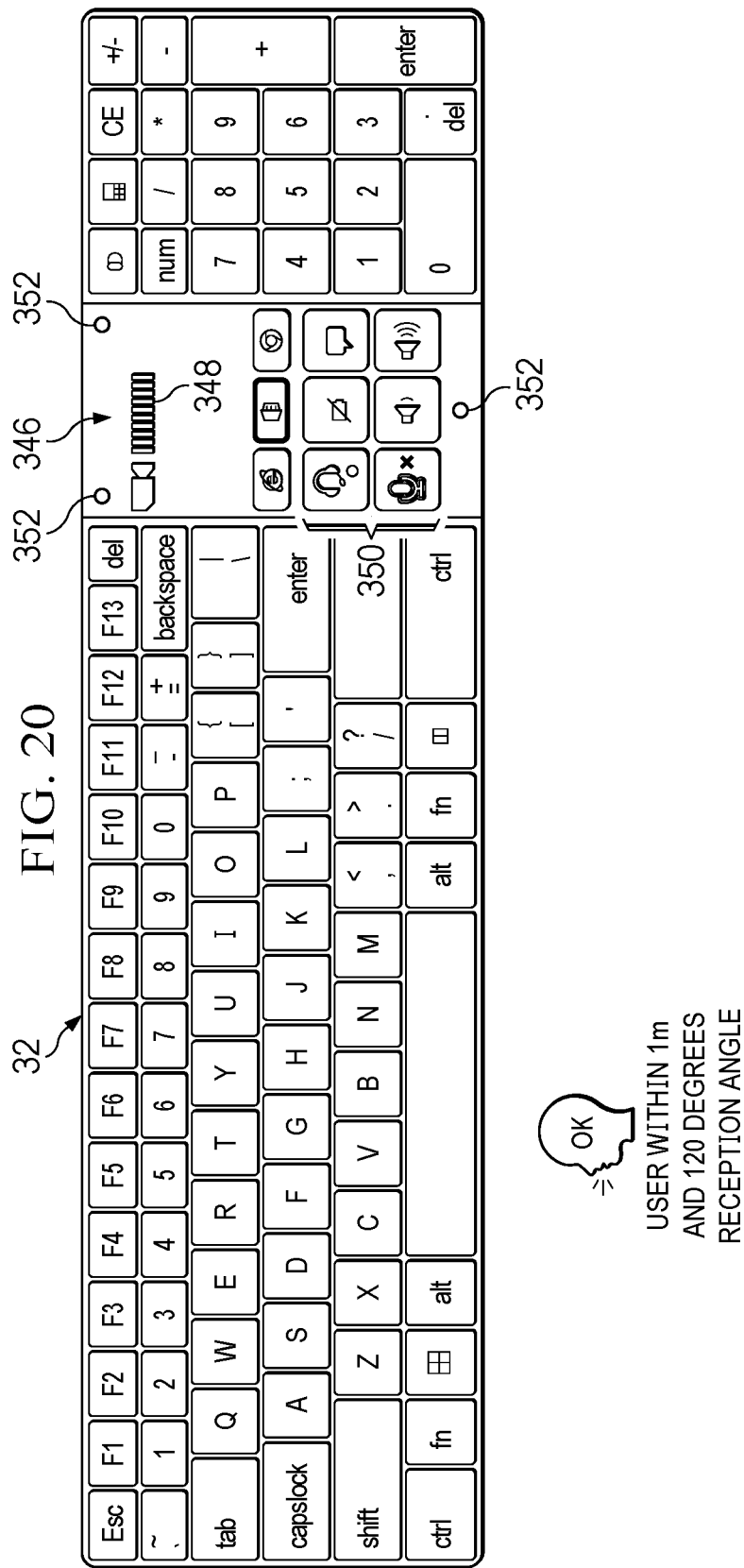
FIG. 20 depicts an example embodiment of presentation at a keyboard integrated display of audio capture conditions for a microphone array integrated in a keyboard.

Referring now to FIG. 20, an example embodiment depicts presentation at a keyboard 32 integrated display 346 of audio capture conditions for a microphone array integrated in keyboard 32. In the example embodiment, display 346 is an LCD display that depicts microphone and speaker controls when an information handling system application is using the keyboard to capture audio in support of a conference. At each microphone location a microphone usage state light 352 is illuminated to show when each microphone is active, such as with a white light when active and a red light when inactive. Microphone usage state lights 352 may be presented as part of the display presentation or may be a separate LED disposed under the display to illuminate when appropriate. A dynamic volume bar 348 presented at the upper portion of display 346 visually depicts the quality of the audio captured by the microphones. For instance, the DSP processing the audio or an MCU supporting the DSP and wireless communication interfaces with the display through a GPIO that outputs a speech quality indicator. In the example of FIG. 20, three white lights indicate active operation of the microphones and a full dynamic volume bar indicates good quality audio is being captured. For instance, the speaker is within the 1 meter and 120 degree field of view zone and is speaking with adequate volume. Control icons 350 provide an end user with controls to manage a video conference, such as turning on and off a camera, muting audio capture, changing speaker volume, ending the call, etc . . .

Figure 21:
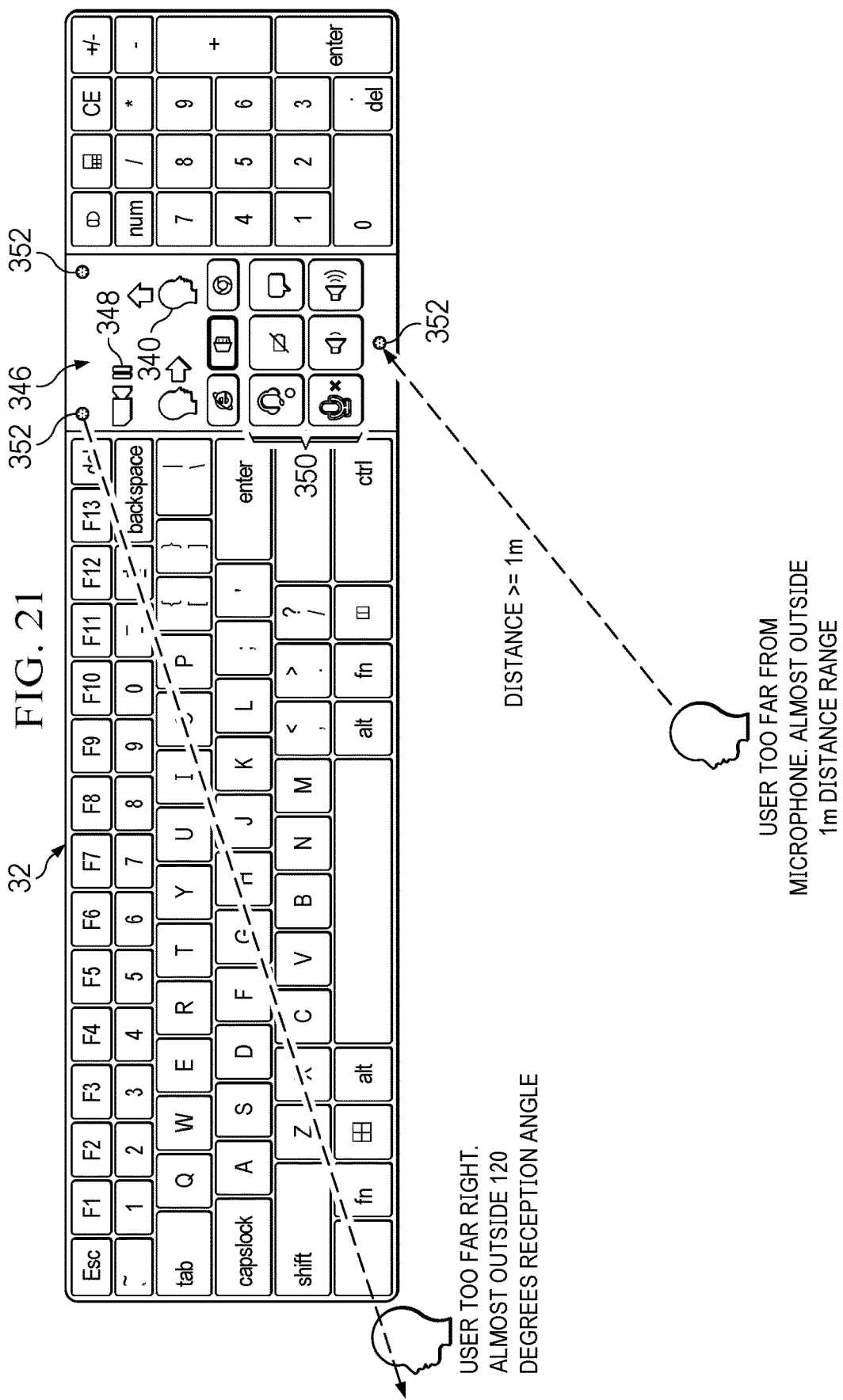
FIG. 21 depicts a keyboard having a display that presents low audio capture quality.

Referring now to FIG. 21, keyboard 32 has a display 346 that presents low audio capture quality. In the example, microphone usage state lights 352 may turn a different color, such as red, or may flash to indicate microphone difficulties. Dynamic volume bar 348 shows a decreased length that corresponds to a level of quality captured by the microphones. A head icon 340 depicts an up arrow to suggest that the end user speak in a louder voice. In addition, information may be presented at the display showing the position of detected speakers relative to the zone in which voice is accepted and captured for use in a conference audio. For example display 346 may present an estimate location of detected speakers relative to a zone of captured speech to alert the end user that some speakers are being filtered out and to allow the end user to select a larger zone or to turn off the filtering so that all audio is included in the captured audio.

Figure 22:
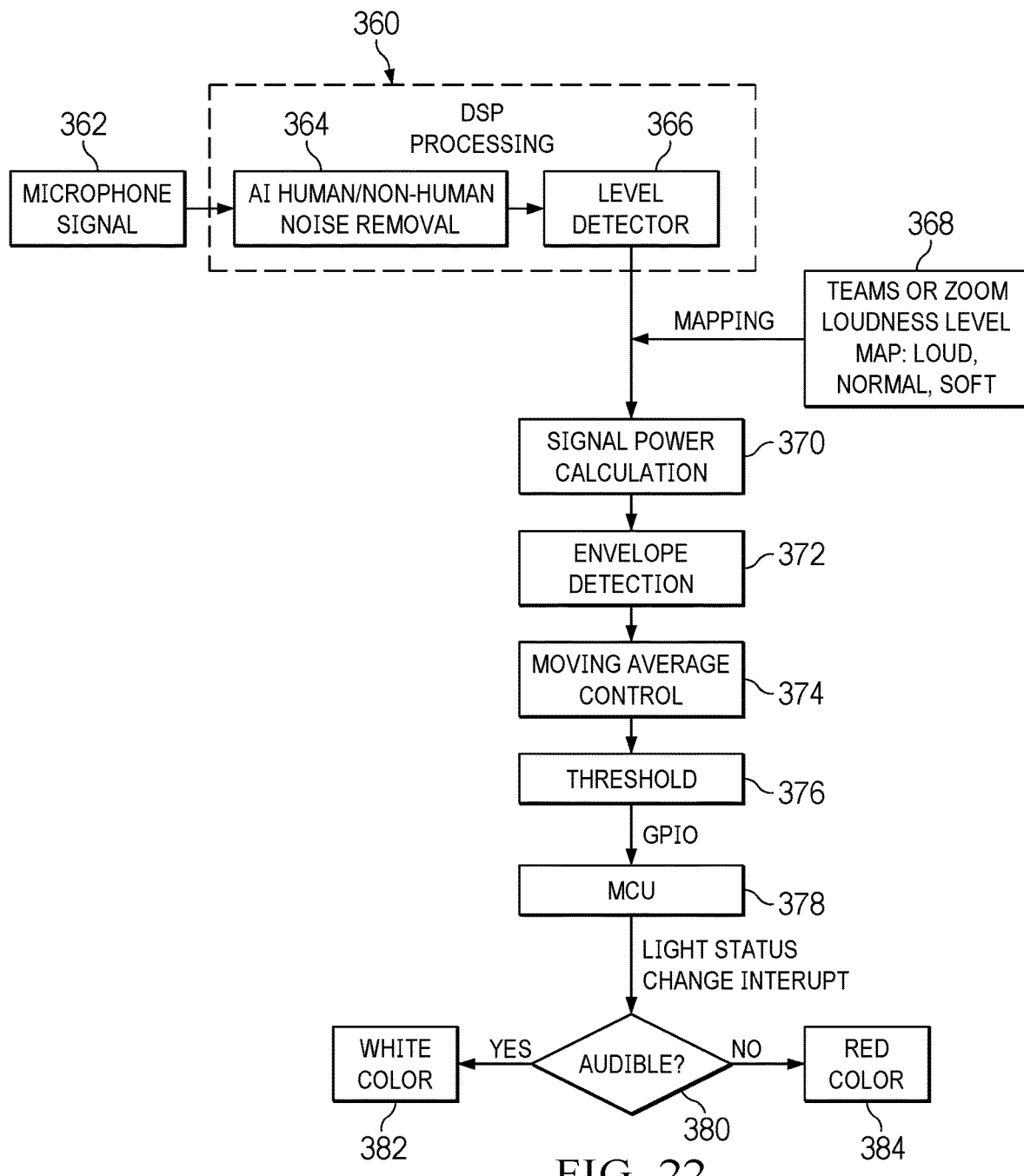
FIG. 22 depicts a flow diagram of a process for indicating at a keyboard display a quality of audio captured by the keyboard microphone array.

Referring now to FIG. 22, a flow diagram depicts a process for indicating at a keyboard display a quality of audio captured by the keyboard microphone array. The process starts at step 362 with a microphone signal 362 communicated to a DSP processing resource 360. At step 364, artificial intelligence executing on the DSP processing resource isolates desired speech audible sound from speech outside of the desired zone and from non-human sounds. At step 366, level detector logic analyzes the captured sounds to determine the quality of the captured sounds for presentation at the keyboard display. At step 368, a mapping of the captured speech quality is provided to applications executing on the information handling system that are using the speech, such as a mapping to ZOOM or TEAMS of loudness levels of the captured speech. In addition, the mapping can provide estimates of locations of speakers relative to the keyboard for presentation by the application and at the keyboard display, including a location of speakers who are filtered out of the captured audio. At step 370 a signal power calculation is performed on the captured audio to determine the speech volume. At step 372, an envelope detection analysis is performed to determine the speaker locations. At step 374 a moving average control is applied to the volume and location analysis to smooth the calculated data. At step 376, the volume and location of the captured audio is compared against a quality threshold. A GPIO of the DSP processing resource outputs the quality to an MCU processing resource 378 of the keyboard for analysis and presentation at the keyboard display. Based upon the DSP GPIO output, instructions executing on the MCU processing resource determine a light status for the microphones. At step 380, if the captured audio is above the audible threshold, the process illuminates a white color at step 382 for each of the microphone light indicators. If the captured audio at step 380 is below the audible threshold, the process illuminates a red color at step 384.

Figure 23:
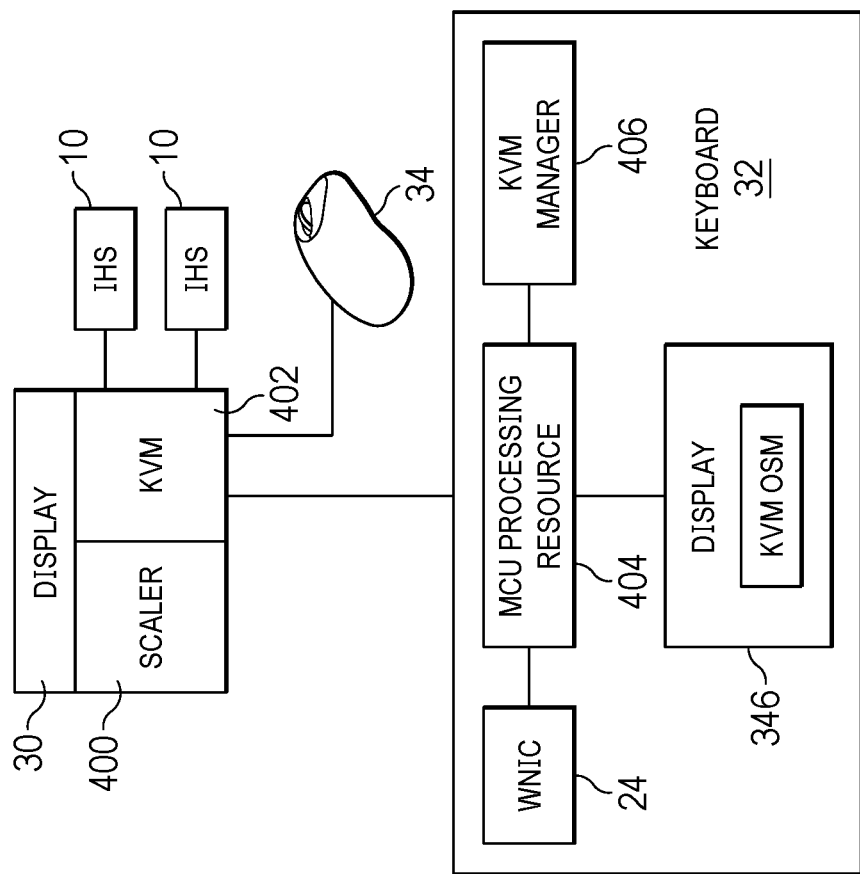
FIG. 23 depicts a block diagram of a system for managing a keyboard, video, mouse (KVM) switch of a display through a keyboard integrate display.

Referring now to FIG. 23, a block diagram depicts a system for managing a keyboard, video, mouse (KVM) switch 402 of a display through a keyboard integrate display 346. Display 30 includes a KVM switch 402 that interfaces with keyboard 32 and mouse 34 through cabled connections, such as USB cables, to coordinate use of the keyboard and mouse with each of plural information handling systems 10. For instance, KVM switch 402 is managed by a scalar 400 of display 30 so that an end user can interact through an onscreen display menu (OSD) of display 30 to select which information handling system 10 presents visual images at display 30 and receives end user inputs from the keyboard and mouse. KVM switch 402 is a convenient tool for situations where an end user has multiple information handling systems in concurrent use, such as a work station having a desktop system where the end user also brings a portable system. The conventional end user interface with KVM switch 402 selects which information handling system 10 is active through buttons or a joystick of display 30 that controls an onscreen display menu presented by scalar 400. This type of control is awkward for an end user who has to reach to the display and navigate the onscreen display menu manually over top of the visual images presented by the active information handling system. To simplify KVM switch interactions, display 346 of keyboard 32 presents a KVM user interface with a KVM manager 406 stored in non-transitory memory of MCU processing resource 404 that executes in cooperation with scalar 400. Although the example embodiment depicts a wired connection between the keyboard, mouse and the KVM switch, alternative embodiments may use a wireless interface through WNIC 24.

To present KVM switch control at keyboard display 346, KVM manager 406 duplicates the display onscreen menu of scalar 400 with its KVM functionality for touch interactions through keyboard display 346. The end user is provided an icon on display 346 to activate the KVM menu at display 346 so that control of selection of an active information handling system is at the end user's fingertips with touch inputs to the onscreen display menu through keyboard display 346. This allows an end user to readily toggle between information handling systems without disruption of the display presentation by the onscreen display menu at display 30. KVM manager 406 may present the KVM control menu in a variety of ways. In one example embodiment, a copy of the KVM control menu is stored in flash memory of MCU processing resource 404 and activated by a touch at an icon that responds to activation by showing information handling systems available to select with an additional touch. Selection of an information handling system for interaction with the KVM switch at display 346 is communicated through the keyboard wireless or wired interface and performed by scalar 400, such as through an I2C or other interface.

Figure 24:
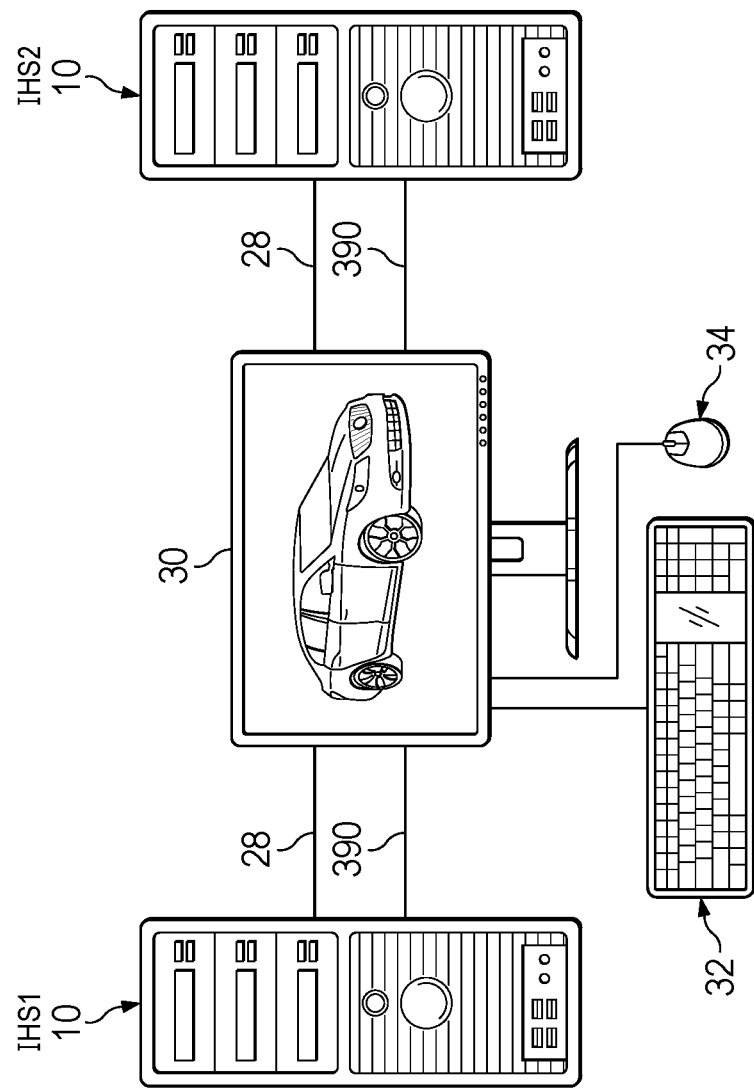
FIG. 24 depicts an example embodiment of the type of KVM control available through a keyboard touchscreen display.
Figure 25:
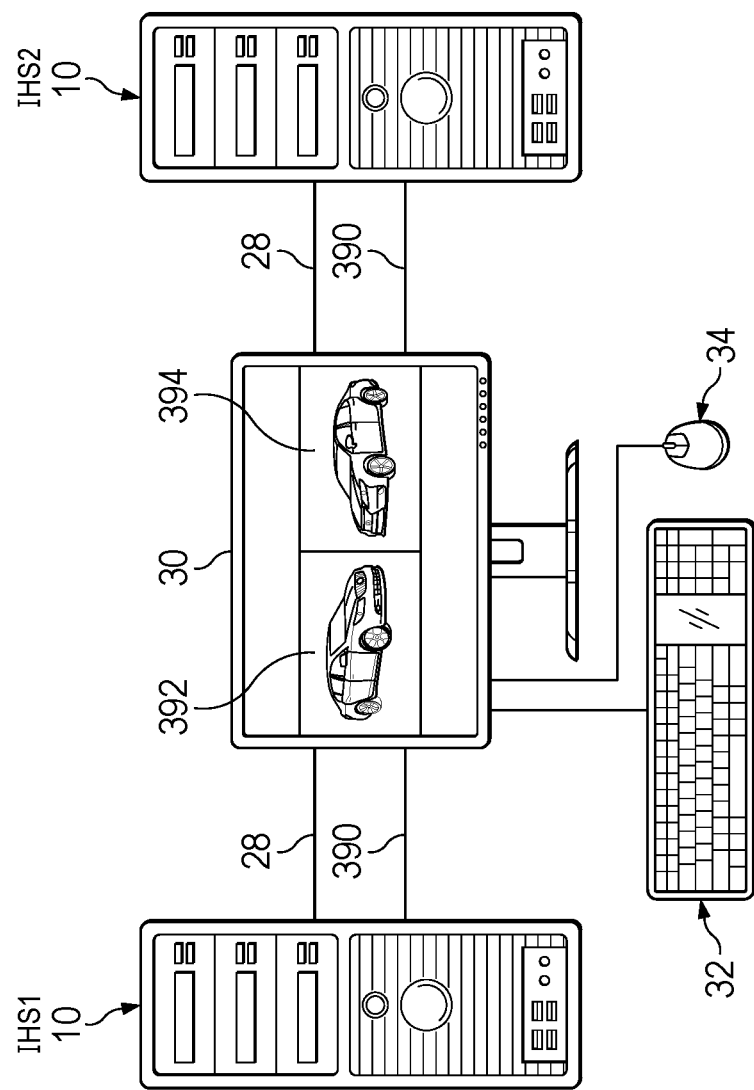
FIG. 25 depicts another example embodiment of the type of KVM control available through a keyboard touchscreen display.

Referring now to FIGS. 24, 25 and 26, example embodiments depict the type of KVM control available through a keyboard touchscreen display. FIG. 24 depicts first and second information handling systems 10 that each interface with display through a video cable 28 and a USB cable 390 or similar data interface. An end user toggles an icon presented at keyboard 32 to alternatively interface keyboard 32, mouse 34 and display 30 with each information handling system 10. FIG. 25 depicts an alternative presentation of visual images at display 30 that an end user can select from the keyboard display. In the example embodiment, display 30 shows a first window 392 having visual information from a first of the two information handling systems 10, and a second window 394 having visual information from a second of the two information handling systems 10. In this example embodiment, display 30 may alternate control of keyboard 32 and mouse 34 based upon which of windows 392 and 394 are active, or the active information handling system may be selected through the keyboard display. FIG. 26 depicts another alternative presentation having keyboard 32 and mouse 34 interfaced through one display 30 and a second display 30 having a daisy chain interface with the first display. In this example embodiment, communications between the displays 30, such as with the DisplayPort protocol, coordinates selection of KVM switch interfaces with each of the information handling systems 10. For instance, the displays 30 may both present visual images from one information handling system 10 that also interfaces with the mouse and keyboard. Alternatively, each display may present visual information of one of the information handling systems 10 while keyboard and mouse control is managed by selections made at a display of keyboard 32. In various embodiments, control of KVM switch interfaces may be managed with instructions stored and executed on keyboard 32 that command KVM actions, by instructions of a scalar of a display 30 that defines the interface shown at the keyboard display, and/or instructions of an operating system on one of the information handling systems that provides the keyboard display control user interface based upon the type of displays found by the operating system.

Figure 27A:
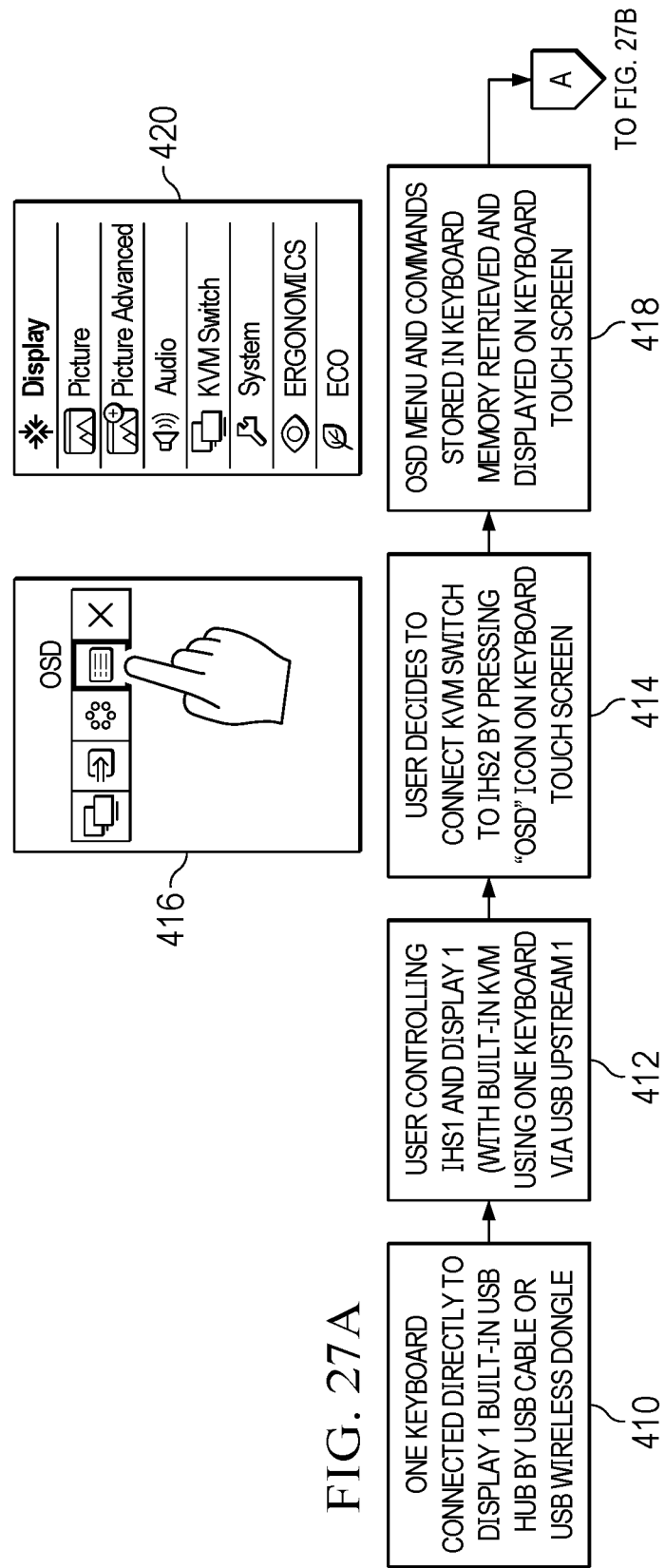
FIGS. 27A and 27B depict a flow diagram of an example embodiment of keyboard touchscreen KVM control and associated use interfaces.
Figure 27B:
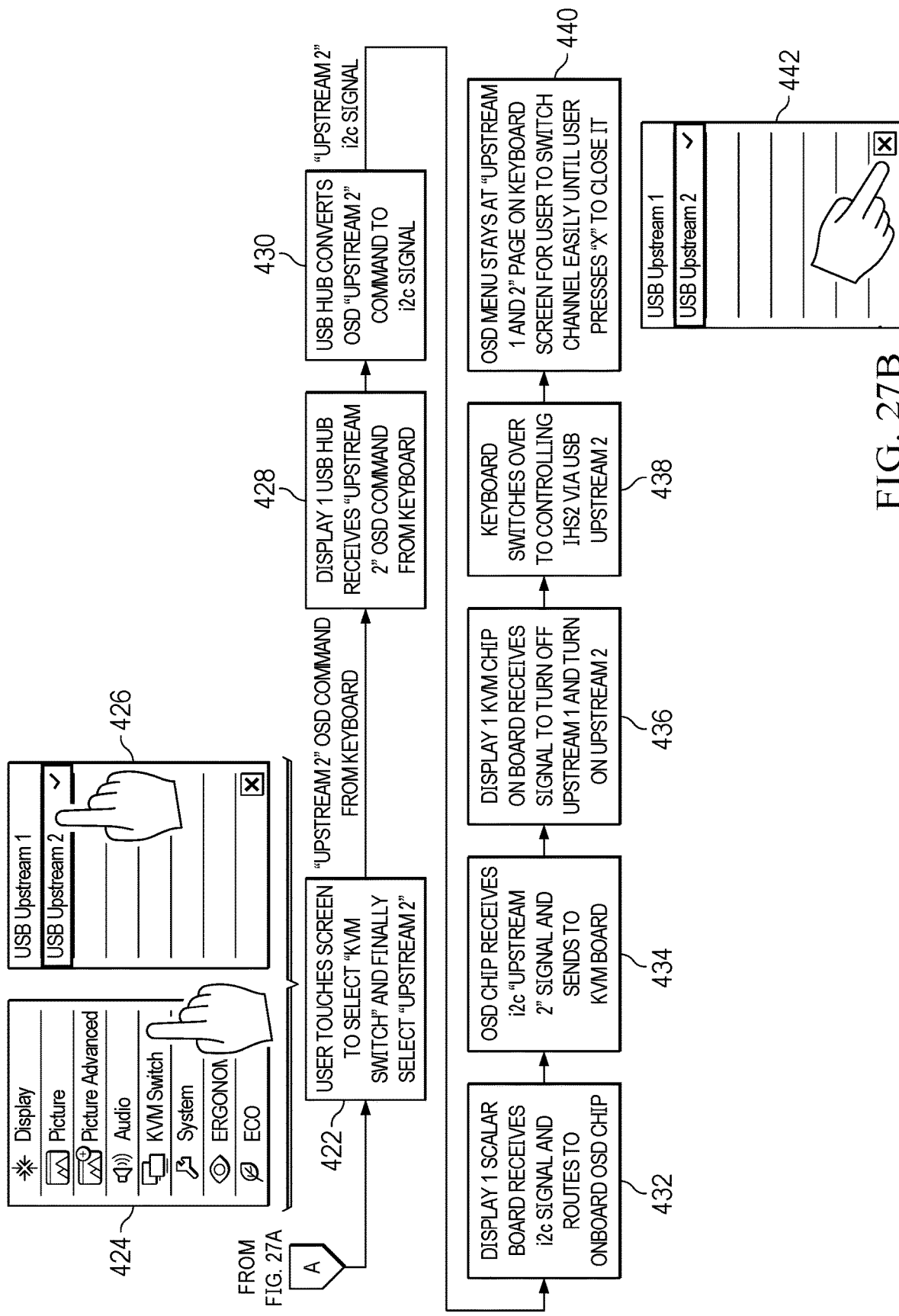

Referring now to FIGS. 27A and 27B, a flow diagram depicts an example embodiment of keyboard touchscreen KVM control and associated use interfaces. The process starts at step 410 with one keyboard connected directly to a first monitor through a USB cable, USB hub, wireless dongle or other interface. At step 412 an end user controls a first information handling system and first display having an integrated KVM switch with the keyboard through a USB upstream interface from the display to the information handling system. For instance, keyboard inputs are communicate to the display KVM switch and from the KVM switch to the first information handling system. At step 414, the end user decides to change the keyboard to interface with a second information handling system with a command provided through a touchscreen display integrated in the keyboard. In the example embodiment, a user interface 416 illustrates an example of a keyboard display user interface having an "OSD" icon that the end user presses to initiate presentation of an onscreen display menu with controls to select KVM switch interfaces to the first and second information handling systems. At step 418, in response to selection of the OSD icon, the keyboard display presents an OSD menu having a graphical user interface with commands available for selection of KVM switch interfaces. For instance, the graphical user interface 420 presents OSD menu options stored in non-transient memory of the keyboard. In the example embodiment, the end user can manage all of the display OSD menu items, such as brightness and contrast. At step 422, the end user selects the KVM switch icon to initiate control of the KVM switch. In response at step 422 of a press at the OSD menu icon, the keyboard display graphical user interface 424 presents graphical user interface 426 providing the end user with a selection of the first or second information handling system to receive the KVM switch upstream communications from the keyboard and mouse.

Upon toggling from the first information handling system to the second information handling system at step 422, the process continues to step 428 at which the first display receives the upstream toggle OSD command from the keyboard display. At step 430, the USB hub of the KVM switch converts the onscreen display command to an I2C signal for application at the KVM switch. The process continues to step 432 at which the first display scalar receives the I2C command and routes the command to the onboard OSD processing resource, such as an integrated circuit microcontroller unit included in the first display. At step 436 the first display KVM processing resource receives the command to switch the upstream destination for the keyboard and mouse inputs directed to the KVM switch and, at step 438 commands a change in the destination of the mouse and keyboard inputs to the second information handling system. Once the keyboard display graphical user interface changes the information handling system that is active, the process continues to step 440 at which the end user can select a graphical user interface 442 that presents a quick toggle capability to command a change in the KVM switch configuration with a single touch. The quick toggle icon of graphical user interface 442 may remain active and presented at the keyboard display automatically when the keyboard detects an interface to an information handling system through a KVM switch.

Figure 28:
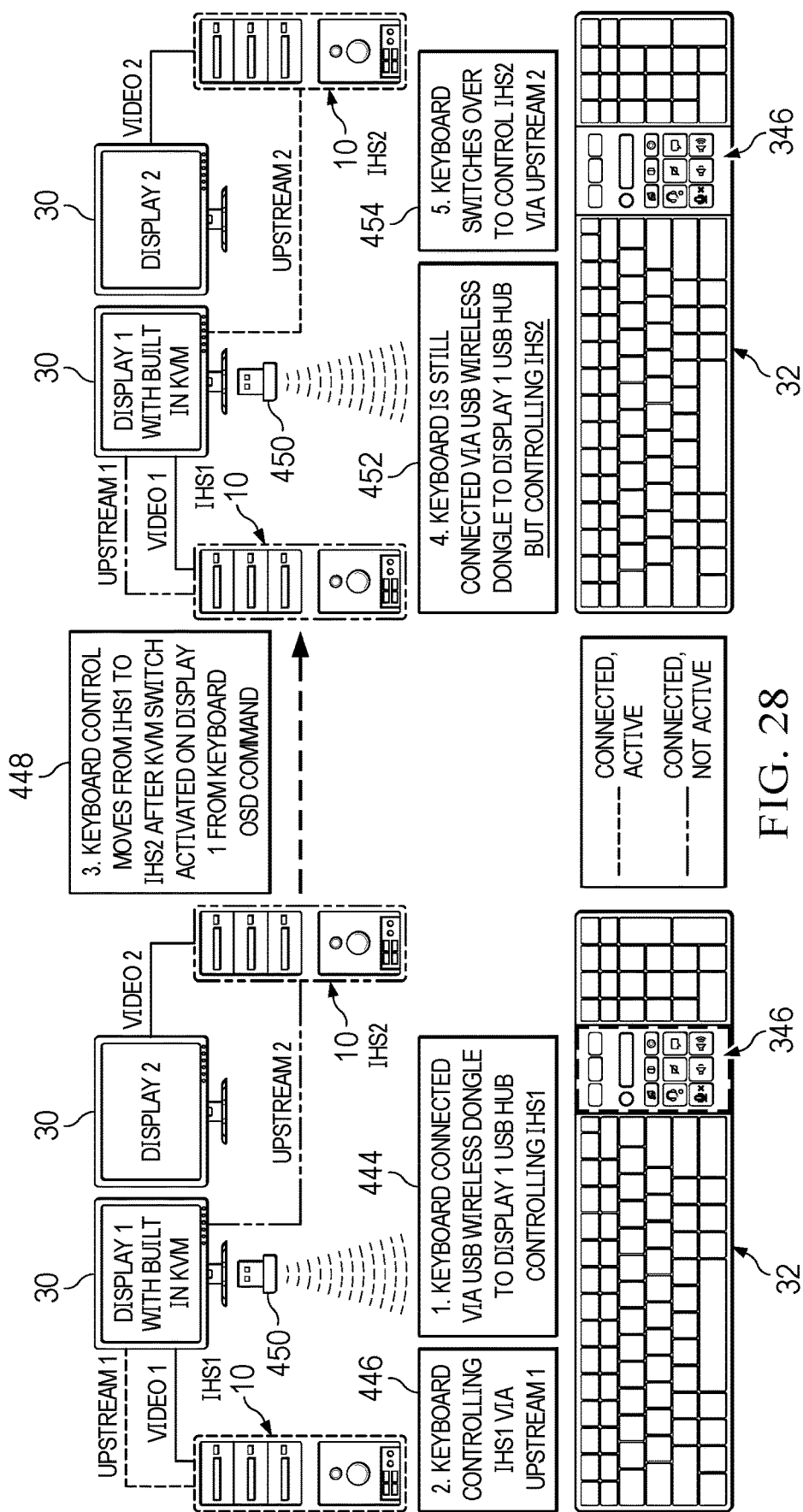
FIG. 28 depicts an example embodiment of management of dual display and dual information handling system KVM interfaces with a keyboard display.

Referring now to FIG. 28, an example embodiment depicts management of dual display and dual information handling system KVM interfaces with a keyboard display. At step 444, the keyboard 32 connects via a USB interface, such as through a wireless dongle 450, to a first display 30 and first information handling system 10. In the example embodiment, keyboard 32 inputs are communicated through the KVM switch of the first display 30 through and upstream 1 interface and visual information is provided from the first information handling system 10 through a video 1 cable for presentation at the first display 30. The KVM switch in the first display coordinates interactions with the first information handling system so that at step 444 keyboard 32 inputs are sent to the first information handling system at step 446. In addition, the second information handling system 10 interfaces with a second display 30 through a second video cable and with the first display through an upstream cable that is not active since the first display KVM is communicating keyboard inputs to the first information handling system. Keyboard 32 includes integrated touchscreen display 346 that presents a graphical user interface to control selection of KVM switch communication configuration for the KVM switch included in the first display. At step 448, an input at a graphical user interface presented by keyboard display 346 commands a change in control at the KVM from the first information handling system to the second information handling system with an input at the KVM icon of the onscreen display menu options.

In response to the command from the keyboard display 346, at step 452 the KVM switch reconfigures so that keyboard inputs communicate from KVM switch of the first display to the second information handling system. In the example embodiment, each information handling system 10 continues to present visual images at the display to which the video of the information handling system is coupled, however, keyboard 32 key inputs are directed to each information handling system individually so that, at step 452, keyboard inputs communicated to the second information handling system will be shown at the second display and will be used for execution on the second information handling system. At step 452, keyboard inputs are communicated to the second information handling system 10 for use by the second information handling system at the second display at step 454. In an alternative embodiment, the upstream cable connection between the first monitor and the second information handling system may include a daisy chain or other downstream video capability so that keyboard display 346 can also command a change at the KVM of the first display regarding presentation of visual images by the first or second information handling system.

Although the present invention has been described in detail, it should be understood that various changes, substitutions and alterations can be made hereto without departing from the spirit and scope of the invention as defined by the appended claims.

What is claimed is:

1. An information handling system comprising:
a processor operable to execute instructions to process information;
a memory interfaced with the processor and operable to store the information and instructions;
a display interfaced with the processor and operable to present the information as visual images; and
a mouse interfaced with the processor, the mouse having a position sensor operable to detect movement for cursor position control of a cursor presented at the display, the mouse including an input button, a switch and an acoustic isolation enclosure, the input button exposed at an upper surface of the mouse and having a member aligned to actuate the switch, the acoustic isolation enclosure disposed at the switch and having a first position that suppresses actuation sound of the switch and a second position that releases actuation sound of the switch from the mouse;
wherein the acoustic isolation enclosure further comprises:
a first portion having a first opening that accepts the input button member at an actuation plunger of the switch; and
a second portion in sliding engagement with the first portion, the second portion having a second opening, the second opening blocked in the first position and exposed in the second position.

2. The information handling system of claim 1 wherein:
the first portion has a fixed position relative to the switch; and
the second portion slides relative to the switch, the second portion overlapping the first portion in the second position to block the second opening.

3. The information handling system of claim 2 further comprising:
first and second input buttons exposed at the upper surface of the mouse, each having a member extending towards a switch and an acoustic isolation enclosure disposed at the switch.

4. The information handling system of claim 2 further comprising a sliding switch exposed at a bottom surface of the mouse and interfaced with the second portion to slide the second portion relative to the first portion between the first and second positions.

5. The information handling system of claim 4 wherein the second portion has a rectangular shape that defines an acoustic chamber in the second position to direct switch actuation sound out the second opening, the second opening aligned to direct the switch actuation sound towards the input button.

6. The information handling system of claim 2 further comprising an arrangement of magnets disposed in the mouse and interfaced with the input button to selectively configure neutral position of the input button at a first distance and a second distance from the switch.

7. The information handling system of claim 6 wherein the arrangement of magnets comprise an electropermanent magnet interfaced with a current source and configured to create an attractive force to establish the first distance and a repulsive force to establish the second distance.

8. The information handling system of claim 7 wherein the first distance has the input button member in contact with the switch and the attractive force is insufficient to actuate the switch without an end user press on the input button.

9. A method for managing a mouse input button actuation sound, the method comprising:
coupling an acoustic isolation enclosure at a mouse input button switch;
configuring the acoustic isolation enclosure in a first position to generate a first sound at the mouse in response to a mouse input button switch actuation; and
configuring the acoustic isolation enclosure in a second position to generate a second sound at the mouse in response to the mouse input button switch actuation, the second sound volume less than the first sound volume;
wherein:
configuring the acoustic isolation enclosure in the first position further comprises exposing an opening of the acoustic isolation enclosure; and
configuring the acoustic isolation enclosure in the second position further comprises covering the opening of the acoustic isolation enclosure.

10. The method of claim 9 further comprising:
sliding a first portion of the acoustic isolation enclosure away from a second portion of the acoustic isolation enclosure to expose an opening in the first portion; and
sliding the first portion towards the second portion to cover the opening in the first portion.

11. The method of claim 10 further comprising:
coupling a sliding switch at a bottom surface of the mouse to the first portion; and
sliding the sliding switch to move the acoustic isolation enclosure between the first and second positions.

12. The method of claim 11 wherein the first and second portions comprise rectangular boxes that slidingly engage with each other.

13. The method of claim 12 further comprising:
interfacing an arrangement of magnets with the mouse input button;
applying a first configuration of the magnets having magnetic attraction to establish a first neutral distance between the input button and the switch; and
applying a second configuration of the magnets having magnetic repulsion to establish a second neutral distance between the input button and the switch, the second distance greater than the first distance.

14. The method of claim 13 wherein the first distance comprises the mouse input button in contact with the switch with the magnetic attraction insufficient to actuate the switch.

15. A mouse comprising:
a chassis;
a position sensor coupled to the chassis, the position sensor operable to detect movement of the chassis to report the movement for cursor position control of a cursor presented at a display;
an input button exposed at the chassis upper surface;
a switch disposed within the chassis and operable to actuate in response to a press;
a member extending from the input button towards the switch and aligned to actuate the switch when the input button is pressed;
an acoustic isolation enclosure disposed at the switch and having a first position that suppresses actuation sound of the switch and a second position that releases actuation sound of the switch from the chassis, the acoustic isolation enclosure further comprising:
a first portion having a first opening that accepts the input button member at an actuation plunger of the switch; and
a second portion in sliding engagement with the first portion, the second portion having a second opening, second opening blocked in the first position and exposed in the second position.

16. The mouse of claim 15 wherein:
the first portion has a fixed position relative to the switch; and
the second portion slides relative to the switch, the second portion overlapping the first portion in the second position to block the second opening.

17. The mouse of claim 16 further comprising a sliding switch exposed at a bottom surface of the mouse in interfaced with the second portion to slide the second portion relative to the first portion between the first and second positions.

* * * * *